(12) United States Patent
Koike

(10) Patent No.: US 9,660,141 B2
(45) Date of Patent: May 23, 2017

(54) PATTERN WAFER FOR LEDS, EPITAXIAL WAFER FOR LEDS AND METHOD OF MANUFACTURING THE EPITAXIAL WAFER FOR LEDS

(71) Applicant: ASAHI KASEI E-MATERIALS CORPORATION, Tokyo (JP)

(72) Inventor: Jun Koike, Tokyo (JP)

(73) Assignee: ASAHI KASEI E-MATERIALS CORPORATION, Tokyo (JP)

( * ) Notice: Subject to any disclaimer, the term of this patent is extended or adjusted under 35 U.S.C. 154(b) by 0 days.

(21) Appl. No.: 14/894,480

(22) PCT Filed: May 28, 2014

(86) PCT No.: PCT/JP2014/064153
§ 371 (c)(1),
(2) Date: Nov. 27, 2015

(87) PCT Pub. No.: WO2014/192821
PCT Pub. Date: Dec. 4, 2014

(65) Prior Publication Data
US 2016/0149079 A1    May 26, 2016

(30) Foreign Application Priority Data

May 31, 2013  (JP) ................... 2013-116024
May 31, 2013  (JP) ................... 2013-116025

(51) Int. Cl.
*H01L 33/20*   (2010.01)
*H01L 21/02*   (2006.01)
(Continued)

(52) U.S. Cl.
CPC .......... *H01L 33/20* (2013.01); *H01L 21/0237* (2013.01); *H01L 21/0243* (2013.01);
(Continued)

(58) Field of Classification Search
CPC ....................................................... H01L 33/20
See application file for complete search history.

(56) References Cited

U.S. PATENT DOCUMENTS 8,823,033 B2 *  9/2014  Yamamoto ............ H01L 33/405
                                                    257/98
2010/0276665 A1 * 11/2010  Wang .................. H01L 21/0237
                                                    257/15
(Continued)

FOREIGN PATENT DOCUMENTS

JP    11-238687 A     8/1999
JP    2005-64492 A    3/2005
(Continued)

OTHER PUBLICATIONS

Choi et at. "OSNR Monitoring Technique for SK/DQPSK Signals Based on Self-Heterodyne Detection", EEE Photonics Technology Letters, vol. 20, No. 13, Jul. 1, 2008.
(Continued)

*Primary Examiner* — Scott B Geyer
*Assistant Examiner* — S. M. S Imtiaz
(74) *Attorney, Agent, or Firm* — Birch, Stewart, Kolasch & Birch, LLP

(57) ABSTRACT

A pattern wafer (10) for LEDs is provided with an uneven structure A (20) having an arrangement with n-fold symmetry substantially on at least a part of the main surface, where in at least a part of the uneven structure A (20), a rotation shift angle Θ meets 0°<Θ≤(180/n)° in which Θ is the rotation shift angle of an arrangement axis A of the uneven structure A (20) with respect to a crystal axis direction in the main surface, and a top of the convex-portion of the uneven structure A (20) is a corner portion with a radius of curvature exceeding "0". A first semiconductor layer (30), light emitting semiconductor layer (40) and second semiconductor layer (50) are layered on the uneven structure A (20) to
(Continued)

constitute an epitaxial wafer (100) for LEDs. It is possible to provide the pattern wafer for LEDs and epitaxial wafer for LEDs with cracks and internal quantum efficiency IQE improved.

13 Claims, 28 Drawing Sheets

(51) Int. Cl.
  *H01L 33/00* (2010.01)
  *H01L 21/66* (2006.01)
(52) U.S. Cl.
  CPC .... *H01L 21/0254* (2013.01); *H01L 21/02458* (2013.01); *H01L 22/12* (2013.01); *H01L 33/005* (2013.01); *H01L 33/007* (2013.01)

(56) References Cited

U.S. PATENT DOCUMENTS

| | | | |
|---|---|---|---|
| 2012/0138985 A1 | 6/2012 | Ono et al. | |
| 2012/0299222 A1* | 11/2012 | Lan | G03F 7/0002 264/447 |
| 2013/0056748 A1* | 3/2013 | Matsui | H01L 33/22 257/76 |
| 2013/0277684 A1 | 10/2013 | Araki et al. | |
| 2014/0124816 A1* | 5/2014 | Choe | C30B 25/04 257/98 |

FOREIGN PATENT DOCUMENTS

| | | | |
|---|---|---|---|
| JP | 2007-281140 A | | 10/2007 |
| JP | 2009-200514 A | | 9/2009 |
| JP | 2010-518615 A | | 5/2010 |
| JP | 2011-60917 A | | 3/2011 |
| JP | 2011060917 A | * | 3/2011 |
| JP | 2011-77265 A | | 4/2011 |
| JP | 2011077265 A | * | 4/2011 |
| JP | 2013055289 A | * | 3/2013 |
| JP | 2013-84832 A | | 5/2013 |
| JP | 2013-55289 A | | 9/2013 |
| JP | 2013-179368 A | | 9/2013 |
| KR | 10-2006-0125620 A | | 12/2006 |
| WO | WO 2012/090818 A1 | | 7/2012 |
| WO | WO 2014/136393 A1 | | 9/2014 |

OTHER PUBLICATIONS

Gao et al. "Enhancement of the light output power of InGaN/GaN light-emitting diodes grown on pyramidal patterned sapphire substrates in the micro- and nanoscale", J. Appl. Phys. 103, 014314 (2008).

International Search Report, issued in PCT/JP2014/064153, dated Jul. 8, 2014.

Communication Pursuant to Article 94(3) EPC issued Apr. 22, 2016, in European Patent Application No. 14 803 549.8.

English translation of International Preliminary Report on Patentability and Written Opinion mailed Dec. 10, 2015, in PCT International Application No. PCT/JP2014/064153.

* cited by examiner

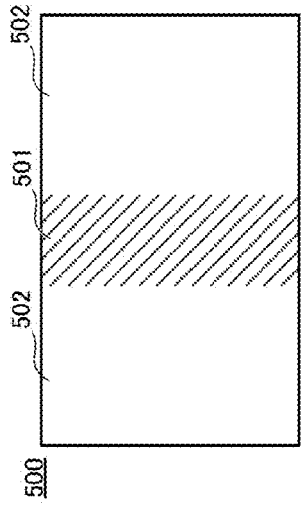
FIG.21A
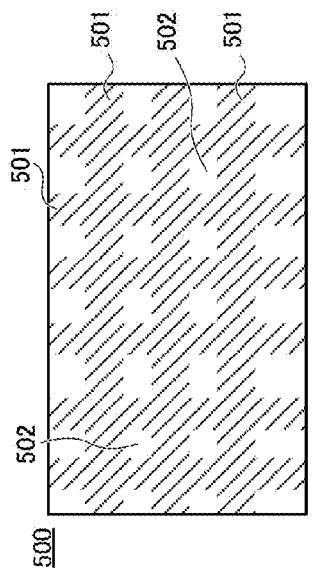
FIG.21C
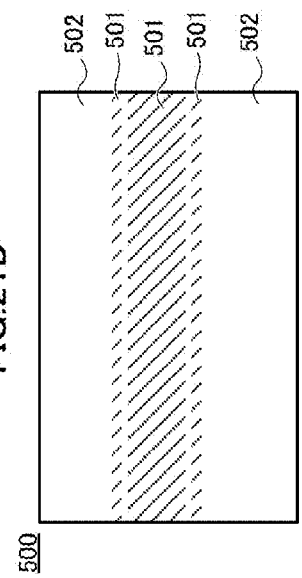
FIG.21E
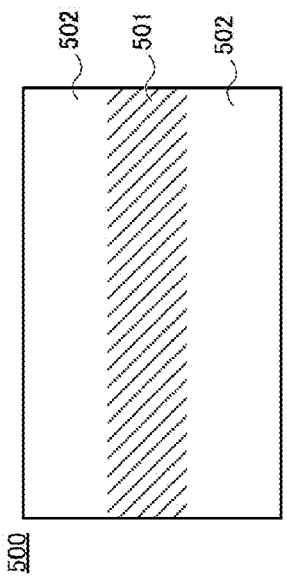
FIG.21B
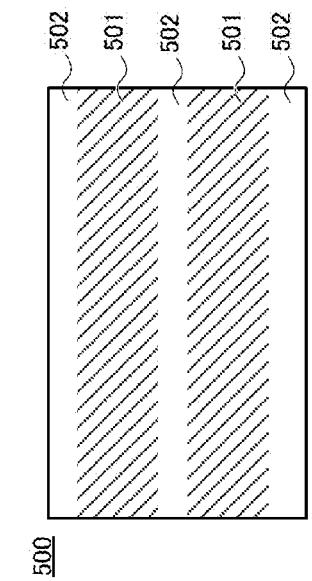
FIG.21D
FIG.21F

PATTERN WAFER FOR LEDS, EPITAXIAL WAFER FOR LEDS AND METHOD OF MANUFACTURING THE EPITAXIAL WAFER FOR LEDS

TECHNICAL FIELD

The present invention relates to a pattern wafer for LEDs, epitaxial wafer for LEDs and method of manufacturing the epitaxial wafer for LEDs

BACKGROUND ART

A semiconductor light emitting device chip e.g. LED chip is generally manufactured by manufacturing an epitaxial wafer for LEDs obtained by sequentially layering and growing a first semiconductor layer, light emitting semiconductor layer and second semiconductor layer that are of light emitting diode structure on a wafer for LEDs, subsequently forming electrodes respectively on the second semiconductor layer and first semiconductor layer, and making a chip. Then, emitted light generated due to recombination of a hole and an electron injected from respective semiconductor layers is extracted to the outside of the LED chip, and the light emission of the LED is visually identified. In addition, generally adopted is the structure where the emitted light is extracted from the transparent electrode side on the second semiconductor layer or the wafer for LEDs side, and it is also possible to remove the wafer for LEDs to extract the emitted light from the first semiconductor layer side.

As factors to determine external quantum efficiency EQE indicative of efficiency of an LED, there is electron injection efficiency EIE, internal quantum efficiency IQE, and light extraction efficiency LEE. Among the factors, the internal quantum efficiency IQE is dependent on the dislocation density caused by lattice mismatch of the semiconductor crystal (for example, Non-patent Document 1). The light extraction efficiency LEE is improved by disturbing the waveguide mode inside the semiconductor layer by light scattering due to an uneven structure provided on the pattern wafer for LEDs (for example, Patent Document 1). Further, the electron injection efficiency EIE is improved by reducing interface resistance between the second semiconductor layer and the transparent conductive comprised of oxide such as ITO, ZnO, $In_2O_3$, and $SnO_2$.

The external quantum efficiency EQE of an LED is determined by three factors as described above, and the internal quantum efficiency IQE means efficiency itself that the LED emits light, and is not expected to undergo significant improvements when the first semiconductor layer, light emitting semiconductor layer and second semiconductor layer are deposited on a pattern wafer for LEDs to manufacture the epitaxial wafer for LEDs. In other words, in order to manufacture LEDs for actualizing high external quantum efficiency EQE, it is necessary to improve at least the internal quantum efficiency IQE.

From such a background, in order to significantly improve the internal quantum efficiency IQE, proposed is an LED manufactured by depositing a semiconductor layer on an uneven structure of a pattern wafer for LEDs beforehand provided with the uneven structure on the surface of the wafer for LEDs (for example, see Non-patent Document 2).

PRIOR ART DOCUMENT

Patent Document

[Patent Document 1] Japanese Unexamined Patent Publication No. 2009-200514

Non-Patent Document

[Non-patent Document 1] IEEE photo. Tech. Lett., 20, 13 (2008)
[Non-patent Document 2] J. Appl. Phys., 103, 014314 (2008)

DISCLOSURE OF INVENTION

Problems to be Solved by the Invention

However, in the case where the uneven structure is provided on a wafer for LEDs so as to improve the internal quantum efficiency IQE, the semiconductor layer-growth are not stabilized, uneven structure is not flattened sufficiently by the semiconductor layer, and there is a problem that cracks occur in the semiconductor layer. By generation of such cracks, light emitting diode characteristics of the epitaxial wafer for LEDs degrade significantly, and the defect rate of LED chips increases.

The present invention was made in view of the above-mentioned problem, and it is an object of the invention to provide a pattern wafer for LEDs for enabling a semiconductor layer with the internal quantum efficiency IQE improved to be deposited while suppressing the occurrence of cracks, an epitaxial wafer for LEDs with cracks and internal quantum efficiency IQE improved, and a method of manufacturing the epitaxial wafer for LEDs.

Means for Solving the Problem

A pattern wafer for LEDs of the present invention is characterized by being provided with an uneven structure A having an arrangement with n-fold symmetry substantially on at least a part of a main surface, where in at least a part of the uneven structure A, a rotation shift angle $\Theta$ meets $0°<\Theta\leq(180/n)°$ in which $\Theta$ is the rotation shift angle of an arrangement axis A of the uneven structure A with respect to a crystal axis direction of the pattern wafer for LEDs in the main surface, and a top of the convex-portion of the uneven structure A is a corner portion with a radius of curvature exceeding "0".

Further, an epitaxial wafer for LEDs of the invention is characterized in that at least a first semiconductor layer, a light emitting semiconductor layer and a second semiconductor layer are layered in this order on the main surface provided with the uneven structure A of the pattern wafer for LEDs.

A method of manufacturing an epitaxial wafer for LEDs of the invention is characterized by including the steps of preparing a pattern wafer for LEDs, the step of performing an optical inspection on the prepared pattern wafer for LEDs, and the step of manufacturing an epitaxial wafer for LEDs using the pattern wafer for LEDs subjected to the optical inspection.

Advantageous Effect of the Invention

According to the present invention, the internal quantum efficiency IQE is improved by dispersing dislocations generated in the semiconductor layer by the uneven structure A of the pattern wafer for LEDs and decreasing the dislocation density. At the same time, by setting the rotation shift angle Θ between the crystal axis of the pattern wafer for LEDs and the arrangement axis A of the uneven structure A in a predetermined range, it is possible to suppress cracks occurring in the semiconductor layer. In other words, it is possible to manufacture the epitaxial wafer for LEDs with excellent light emitting diode characteristics, and in association therewith, it is possible to efficiently manufacture LED chips with high external quantum efficiency EQE.

BRIEF DESCRIPTION OF DRAWINGS

FIG. 21 contains plan schematic diagrams illustrating states obtained by observing, from a surface, the pattern wafer (1) for LEDs according to this Embodiment;

BEST MODE FOR CARRYING OUT THE INVENTION

Figure 1A:
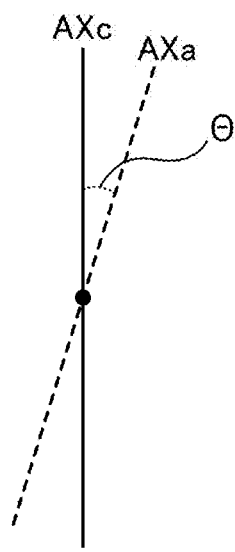
FIG. 1 contains schematic diagrams to explain a rotation shift angle Θ made by a crystal axis of a pattern wafer (1) for LEDs and an arrangement axis A of an uneven structure A according to this Embodiment.

One Embodiment (hereinafter, abbreviated as Embodiment) of the present invention will specifically be described below. In addition, the present invention is not limited to the following Embodiment, and is capable of being carried into practice with various modifications thereof within the scope of the subject matter thereof.

A pattern wafer (1) for LEDs according to this Embodiment is characterized by being provided with an uneven structure A having an arrangement with n-fold symmetry substantially on a main surface, where in at least a part of the uneven structure A, a rotation shift angle Θ meets 0°<Θ≤ (180/n)° in which Θ is the rotation shift angle of an arrangement axis A of the uneven structure A with respect to a crystal axis direction of the pattern wafer (1) for LEDs in the main surface, and a top of the convex-portion of the uneven structure A is a corner portion with a radius of curvature exceeding "0".

According to this configuration, it is possible to suppress cracks occurring in a semiconductor layer deposited on the main surface provided with the uneven structure A of the pattern wafer (1) for LEDs. At the same time, it is possible to disperse dislocations generated in the semiconductor layer and decrease the dislocation density thereof. Accordingly, it is possible to increase the internal quantum efficiency IQE of an epitaxial wafer for LEDs using the pattern wafer (1) for LEDs, and to increase yield in manufacturing the pattern wafer (1) for LEDs. Further, since it is possible to suppress cracks in the semiconductor layer of the epitaxial wafer for LEDs, it is possible to decrease the defect rate of LED chips.

First, a top of the convex-portion of the uneven structure A of the pattern wafer (1) for LEDs is a corner portion with a radius of curvature exceeding "0". Therefore, in depositing the semiconductor layer on the uneven structure A of the pattern wafer (1) for LEDs, it is possible to grow the semiconductor layer with a bottom of the concavo-portion of the uneven structure as the starting-point. In other words, the semiconductor layer grows preferentially from the bottom of the concavo-portion. Next, the uneven structure A provided on the pattern wafer (1) for LEDs substantially has an arrangement with n-fold symmetry. Therefore, in the case of noting the initial growth stage of the semiconductor layer deposited on the pattern wafer (1) for LEDs, it is possible to uniformly disperse nucleation of the semiconductor layer, and to achieve balance with ununiformity of nucleus growth. Herein, the ununiformity is that the semiconductor layer partially rises by nucleus growth. In other words, it is possible to disperse the partially raised semiconductor layer in the nucleus growth stage. Then, in using the crystal axis direction on the main surface of the pattern wafer (1) for LEDs as a reference, the arrangement axis A of the uneven structure A is shifted in a predetermined range by a rotation shift angle Θ. By this means, it is possible to increase the size of the bottom of the concavo-portion significantly contributing to initial growth of the semiconductor layer. At the same time, it is possible to decrease the number of convex portions of the uneven structure that the growing semiconductor layer passes, in the case of viewing from the growth direction of the semiconductor layer. From the foregoing, coalescence (adherence) properties of growing nucleuses are made excellent when the semiconductor layer grows. At the same time, in the coalescence, a travelling direction of dislocations inside the semiconductor layer is changed to an in-plane direction of the pattern wafer (1) for LEDs. By this means, collisions between dislocations are effectively induced, and the internal quantum efficiency IQE is thereby improved. In other words, since it is possible to obtain the semiconductor layer with the internal quantum efficiency IQE improved in a state in which cracks are suppressed, it is possible to manufacture the epitaxial wafer for LEDs having excellent light emitting diode characteristics, and in association therewith, it is possible to effectively manufacture LED chips with high external quantum efficiency EQE.

In the pattern wafer (1) for LEDs according to this Embodiment, it is preferable that an average interval Pave of the uneven structure A meets 50 nm≤Pave≤1500 nm.

In this case, increased are both the effect of improving the internal quantum efficiency IQE and the crack suppression effect. First, by the average interval Pave meeting the above-mentioned range, since the density of concave portions of the uneven structure A increases, it is possible to increase the frequency of coalescence of growing semiconductor layers as described already. In other words, it is possible to increase the frequency that the dislocation inside the semiconductor layer changes the travelling direction thereof, the effect of reducing dislocations is increased, and the internal quantum efficiency IQE is thereby increased effectively. Further, it is possible to control the size of the bottom of the concavo-portion significantly contributing to the initial growth of the semiconductor layer to within a predetermined range. By this means, it is possible to excellently keep nucleus growth of the semiconductor layer in the bottom of the concave-portion of the uneven structure A. Accordingly, the crack suppression effect in the semiconductor layer is increased due to the fact that the arrangement axis A of the uneven structure A shifts in a predetermined range by the rotation shift angle Θ.

In the pattern wafer (1) for LEDs according to this Embodiment, in using Duty that is a ratio (Φave/Pave) of an average diameter (Φave) of the bottom of the convex-portion of the uneven structure A to the average interval Pave, it is preferable that the rotation shift angle Θ meets a range of a tan(Duty/2)°≤Θ≤(180/n)°.

In this case, increased are both the effect of internal quantum efficiency IQE improvement and the crack suppression effect in the semiconductor layer. By the rotation shift angle Θ meeting the above-mentioned range, it is possible to increase the size of the bottom of the concave-portion of the uneven structure A significantly contributing to the initial growth of the semiconductor layer, in the direction approximately perpendicular to the growth direction of the semiconductor layer in the main surface, and therefore, increased is the size of the surface with a fast growth rate of the semiconductor layer. By this means, in the case of noting coalescence of growing semiconductor layers, the interface area of coalescing semiconductor layers is increased. Further, since it is possible to decrease the number of convex portions of the uneven structure A that the surface with the fast growth rate crosses, coalescence properties of growing semiconductor layers are made excellent. From the foregoing, the internal quantum efficiency IQE is more increased, and cracks occurring in the semiconductor layer are effectively suppressed.

In the pattern wafer for LEDs according to this Embodiment, the pattern wafer (1) for LEDs is preferably a sapphire wafer, silicon wafer, silicon carbide wafer or gallium nitride-based wafer.

According to this configuration, since it is made possible to more effectively develop the above-mentioned increases of the internal quantum efficiency IQE, suppression of cracks in the semiconductor layer and reduction in production time, it is possible to obtain LED chips with high internal quantum efficiency IQE with high yield and short production time.

An epitaxial wafer for LEDs according to this Embodiment is characterized in that at least a first semiconductor layer, a light emitting semiconductor layer and a second semiconductor layer are layered in this order on the main surface provided with the uneven structure A of the above-mentioned pattern wafer (1) for LEDs.

According to this configuration, from the principles as described already, it is possible to manufacture the epitaxial wafer for LEDs having the semiconductor layers that are of light emitting diode structure with high internal quantum efficiency IQE and cracks suppressed.

In the epitaxial wafer for LEDs according to this Embodiment, it is preferable that a ratio (Hbun/Have) of a distance (Hbun) between a surface on the light emitting semiconductor layer side of the pattern wafer (1) for LEDs and a surface on the first semiconductor layer side of the light emitting semiconductor layer to an average height (Have) of the uneven structure A meets 2≤Hbun/Have≤300.

According to this configuration, it is possible to efficiently manufacture the epitaxial wafer for LEDs with high internal quantum efficiency IQE and cracks suppressed. By the uneven structure A provided on the main surface of the pattern wafer (1) for LEDs, from the principles as described already, it is possible to increase crystallinity of the first semiconductor layer and suppress cracks. Particularly, since the ratio (Hbun/Have) is 2 or more, the degree of flattening of the uneven structure A is increased due to the first semiconductor layer. By this means, it is possible to effectively increase deposition accuracy of the light emitting semiconductor layer and second semiconductor layer provided on the first semiconductor layer. Therefore, it is possible to reflect performance as a semiconductor of the first semiconductor layer with few dislocations in the light emitting semiconductor layer and second semiconductor layer in a state in which cracks are suppressed, and it is possible to obtain the semiconductor layers (including the first semiconductor layer, light emitting semiconductor layer and second semiconductor layer, which is the same in the following description) of light emitting diode structure with cracks suppressed and high internal quantum efficiency IQE. Further, by the ratio (Hbun/Have) being 300 or less, in addition to the above-mentioned effects, since it is possible to suppress the warpage of the pattern wafer (1) for LEDs, it is possible to increase LED chipping efficiency. From the foregoing, by the ratio (Hbun/Have) meeting the predetermined range, it is possible to deposit the semiconductor layers with high internal quantum efficiency IQE and cracks suppressed, and to suppress the warpage of the pattern wafer (1) for LED with the semiconductor layers deposited, and it is thereby possible to manufacture high-efficient LED chips with high production efficiency. Particularly, also when the size of the pattern wafer (1) for LEDs is a diameter of 6 inches or more, it is possible to effectively suppress the warpage of the epitaxial wafer for LEDs. For this reason, by using the pattern wafer (1) for LEDs of the present invention of the size of 6-inches or more, it is possible to thin the thickness of the pattern wafer (1) for LEDs, and to effectively suppress the warpage of the epitaxial wafer for LEDs. Particularly, by thinning the thickness of the pattern wafer (1) for LEDs, it is possible to decrease a use amount of the pattern wafer for LEDs i.e. increase the environmental suitability degree. Further, it is possible to suppress remaining of heat in the pattern wafer (1) for LEDs, and temperature control is thereby made easy in semiconductor layer deposition.

In the epitaxial wafer for LEDs according to this Embodiment, the first semiconductor layer contains an undoped first semiconductor layer and doped first semiconductor layer sequentially layered from the pattern wafer (1) for LEDs side, and it is preferable that a ratio (Hbu/Have) of a distance (Hbu) between the surface on the light emitting semiconductor layer side of the pattern wafer (1) for LEDs and a surface on the doped first semiconductor layer side of the undoped first semiconductor layer to an average height (Have) of the uneven structure A meets 1.5≤Hbu/Have≤200.

According to this configuration, it is possible to efficiently manufacture the epitaxial wafer for LEDs with high internal quantum efficiency IQE and cracks suppressed. By the uneven structure A provided on the main surface of the pattern wafer (1) for LEDs, from the principles as described already, it is possible to increase crystallinity of the undoped first semiconductor layer and suppress cracks. Particularly, since the ratio (Hbu/Have) is 1.5 or more, the degree of flattening of the uneven structure A is increased due to the undoped first semiconductor layer. By this means, it is possible to effectively increase deposition accuracy of the doped first semiconductor layer, light emitting semiconductor layer and second semiconductor layer provided on the undoped first semiconductor layer. Therefore, it is possible to reflect the crystallinity of the undoped first semiconductor layer with few dislocations in the doped first semiconductor layer, light emitting semiconductor layer and second semiconductor layer in a state in which cracks are suppressed, and it is possible to obtain the epitaxial wafer for LEDs with cracks suppressed and high internal quantum efficiency IQE, while reducing the production time. Further, by the ratio (Hbu/Have) being 200 or less, in addition to the above-mentioned effects, since it is possible to suppress the warpage of the pattern wafer (1) for LEDs, it is possible to enhance LED chipping efficiency. From the foregoing, by the ratio (Hbu/Have) meeting the predetermined range, it is possible to deposit the semiconductor layers with high internal quantum efficiency IQE and cracks suppressed, and to suppress the warpage of the pattern wafer (1) for LED with the semiconductor layers deposited, and it is thereby possible to manufacture high-efficient LED chips with high production efficiency. Particularly, also when the size of the pattern wafer (1) for LEDs is a diameter of 6 inches or more, it is possible to effectively suppress the warpage of the epitaxial wafer for LEDs. For this reason, by using the pattern wafer (1) for LEDs of the present invention of the size of 6-inches or more, it is possible to thin the thickness of the pattern wafer (1) for LEDs, and to effectively suppress the warpage of the epitaxial wafer for LEDs. Particularly, by thinning the thickness of the pattern wafer (1) for LEDs, it is possible to decrease a use amount of the pattern wafer for LEDs i.e. increase the environmental suitability degree. Further, it is possible to suppress remaining of heat in the pattern wafer (1) for LEDs, and temperature control is thereby made easy in semiconductor layer deposition.

In the epitaxial wafer for LEDs according to this Embodiment, the first semiconductor layer, the light emitting semiconductor layer and the second semiconductor layer may be group III-V-based semiconductors. Further, in the epitaxial wafer for LEDs according to this Embodiment, the first semiconductor layer, the light emitting semiconductor layer and the second semiconductor layer may be GaN-based semiconductors.

A method of manufacturing the epitaxial wafer for LEDs according to this Embodiment is characterized by including the step of preparing the pattern wafer (1) for LEDs, the step of performing an optical inspection on the prepared pattern wafer (1) for LEDs, and the step of manufacturing the epitaxial wafer for LEDs as described above using the pattern wafer (1) for LEDs subjected to the optical inspection.

According to this configuration, it is possible to measure the rotation shift angle Θ of the arrangement axis A of the uneven structure A, and it is thereby possible to predict light emitting diode characteristics of an epitaxial wafer for LEDs to screen without manufacturing the epitaxial wafer for LEDs. Therefore, it is possible to increase yield in manufacturing of the epitaxial wafer for LEDs.

In the method of manufacturing the epitaxial wafer for LEDs according to this Embodiment, it is preferable that the step of preparing the pattern wafer (1) for LEDs is performed so as to meet the rotation shift angle Θ by a transfer method using a mold provided on its surface with a fine pattern.

By adopting the transfer method to prepare the uneven structure A, without using excessive apparatus and control mechanism, it is possible to manufacture the pattern wafer (1) for LEDs meeting the range of the rotation shift angle Θ as described above. Particularly, by adopting the transfer method, it is possible to manufacture efficiently the pattern wafer (1) for LEDs having a diameter of 6 inches or more, which is hard to manufacture, with high accuracy.

The pattern wafer (1) for LEDs, epitaxial wafer for LEDs and manufacturing method thereof according to this Embodiment will specifically be described below in this order.

<<Pattern Wafer (1) for LEDs>>

The pattern wafer for LEDs according to this Embodiment includes both the pattern wafer (1) for LEDs which enables a semiconductor layer of high quality with cracks suppressed to be deposited and particularly enables the internal quantum efficiency IQE to be increased, and a pattern wafer (2) for LEDs obtained by providing the pattern wafer (1) for LEDs with high light extraction efficiency LEE as a further function. In the following description, starting with the description of the pattern wafer (1) for LEDs, for the description of the pattern wafer (2) for LEDs, the description will be given mainly with attention directed toward further added elements.

The pattern wafer (1) for LEDs according to this Embodiment is provided on its surface with the uneven structure A. The uneven structure A may be obtained by processing one main surface of the wafer for LEDs or may be provided on one main surface of the wafer for LEDs separately. In other words, materials constituting the wafer for LEDs may be the same as or different from materials constituting the uneven structure A. Herein, the uneven structure A substantially has an arrangement with n-fold symmetry, and is characterized in that the arrangement axis A direction of the uneven structure A and the crystal axis direction in the plane of the wafer for LEDs are shifted within a predetermined range. The shift amount is referred to as the rotation shift angle Θ.

<Rotation Shift Angle Θ>

The rotation shift angle Θ will be described first. In addition, the arrangement axis A of the uneven structure A and the crystal axis of the pattern wafer (1) for LEDs will be described later. The rotation shift angle Θ is defined as a minimum rotation angle of the arrangement axis A in using the crystal axis as a reference. FIG. 1 contains schematic diagrams to explain the rotation shift angle Θ made by the crystal axis of the pattern wafer (1) for LEDs and the arrangement axis A of the uneven structure A according to this Embodiment. In FIG. 1A, to simplify, only one axis is shown as each of the arrangement axis A (shown by AXa in FIG. 1A) and the crystal axis (shown by AXc in FIG. 1A). As shown in FIG. 1A, assuming that an intersection point of the crystal axis AXc and the arrangement axis AXa is a center point, the rotation shift angle Θ is a minimum angle in rotating the crystal axis AXc until the axis AXc overlaps the arrangement axis AXa.

Figure 1B:
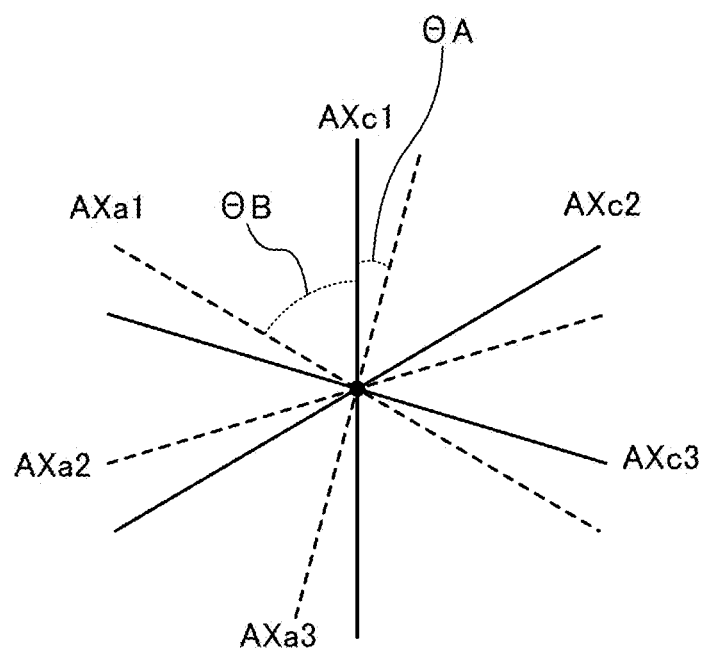

Using FIG. 1B, the case of considering pluralities of crystal axes and arrangement axes A will be described next. For convenience in description, FIG. 1B is the case of extracting and drawing three crystal axes (shown by AXc1, AXc2 and AXc3 in FIG. 1B) and three arrangement axes A (shown by AXa1, AXa2 and AXa3 in FIG. 1B). For example, the case is a case of providing the uneven structure A having an arrangement with 6-fold symmetry on a wafer for LEDs having crystal axes with 6-fold symmetry. In such a case, one crystal axis is first selected. For example, it is assumed that the crystal axis AXc1 is selected. Next, the crystal axis AXc1 is rotated to record an angle at which the axis AXc1 overlaps the arrangement axis A. For example, a small angle in overlapping the arrangement axis AXa3 is an angle ΘA, and a small angle in overlapping the arrangement axis AXa1 is an angle ΘB. Among the angles, the minimum angle is the rotation shift angle Θ. In addition, the above-mentioned definition holds in inverting the arrangement axis A and the crystal axis. In other words, the angle is similarly defined as a minimum angle in rotating the arrangement axis A until the axis A overlaps the crystal axis.

<Arrangement Axis>

The arrangement axis A will be described next. The arrangement axis A is an axis to determine an arrangement direction of the uneven structure A. The arrangement of the uneven structure A has substantial n-fold symmetry. In addition, "n-fold symmetry" in the present description means "rotational symmetry". Therefore, n is a positive integer of 2 or more. By observing the uneven structure A from its surface, for example, using a scanning electron microscope or atomic force microscope, it is possible to check the arrangement of the uneven structure A. Accordingly, the arrangement axis A has the property of overlapping the same or different arrangement axis A by rotation of $(360/n)°$. Herein, the arrangement axis A is defined independently in the case where n in n-fold symmetry is 2 and in the case where n in n-fold symmetry is 3 or more.

First, in the case of 2-fold symmetry, the arrangement is a symmetric arrangement against some axis. At this point, the arrangement axis A is defined as an axis in a direction perpendicular to the some axis. For example, in the case of the uneven structure A where a plurality of mutually parallel lines is disposed, the structure is 2-fold symmetry against a line segment perpendicular to the lines. Therefore, the arrangement axis A is a line segment parallel to the lines. Further, in the case of arrangements where an regular-tetragonal arrangement or regular-hexagonal arrangement is drawn in a one-axis direction, and arrangements where an regular-tetragonal arrangement or regular-hexagonal arrangement is modulated in a one-axis direction periodically (for example, multiplying by a sine curve), the arrangements are 2-fold symmetry in the direction perpendicular to the draw direction or the modulation direction, and therefore, the arrangement axis A is a line segment perpendicular to the draw direction or the modulation direction. Furthermore, in the case where intervals among a plurality of lines are modulated periodically (for example, multiplying by a sine curve), the case is 2-fold symmetry, and a line segment in a direction parallel to a plurality of lines is the arrangement axis A. Still furthermore, in the case of arrangements where an regular-tetragonal arrangement or regular-hexagonal arrangement is drawn in mutually perpendicular two-axis directions at different draw rates in the respective axis directions, the arrangements are 2-fold symmetry in the direction perpendicular to one of the draw directions, and therefore, the arrangement axis A is a line segment parallel to the draw direction. Moreover, in the case of arrangements where an regular-tetragonal arrangement or regular-hexagonal arrangement is modulated in mutually perpendicular two-axis directions with different modulation periods in the respective axis directions, the arrangements are 2-fold symmetry in the direction perpendicular to one of the modulation directions, and therefore, the arrangement axis A is a line segment parallel to the modulation direction.

Figure 2:
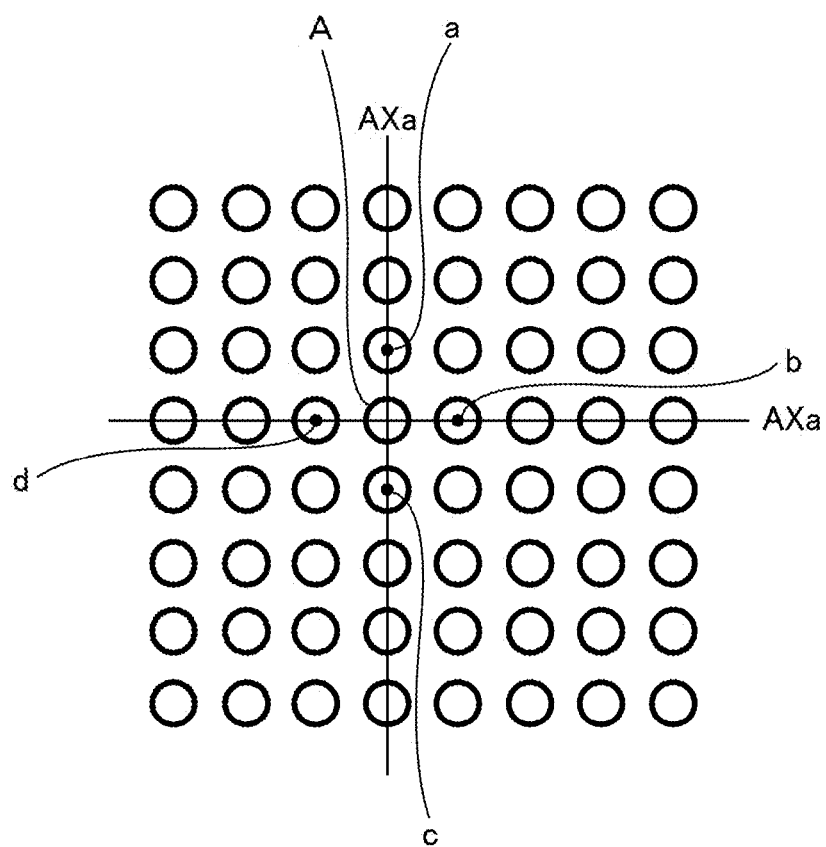
FIG. 2 is a schematic diagram showing an arrangement example of the uneven structure A having 3-fold symmetry or more in the pattern wafer (1) for LEDs according to this Embodiment.

On the other hand, in the case of an arrangement with 3-fold symmetry or more, an axis in the closest direction of convex portions or concave portions of the uneven structure A is defined as the arrangement axis A. Herein, the closest direction is a direction of a line segment joining center portions of closest tops of the convex-portions or center portions of closest opening parts of the concave-portions. FIG. 2 is a schematic diagram showing an arrangement example of the uneven structure A having 3-fold symmetry or more in the pattern wafer (1) for LEDs according to this Embodiment. For example, it is possible to obtain the example by observing the surface side with the uneven structure A using the scanning electron microscope or atomic force microscope. FIG. 2 shows the case where the uneven structure A is regular-tetragonal arranged substantially. The regular-tetragonal arrangement is an arrangement with 4-fold symmetry. In other words, in setting some axis arbitrarily, by rotating the axis (360/n)°=(360/4)°, the axis overlaps another symmetric axis. Herein, the arrangement axis A is the closest direction of convex portions or concave portions of the uneven structure A. In FIG. 2, for example, centers of convex portions (or concave portions, the same in the following description) nearest to the convex portion having the center shown by symbol A are as shown by symbols a, b, c and d in FIG. 2. In other words, the arrangement axis AXa is a direction parallel to one of line segment A-a, line segment A-b, line segment A-c and line segment A-d joining the center A and respective other centers.

Figure 3:
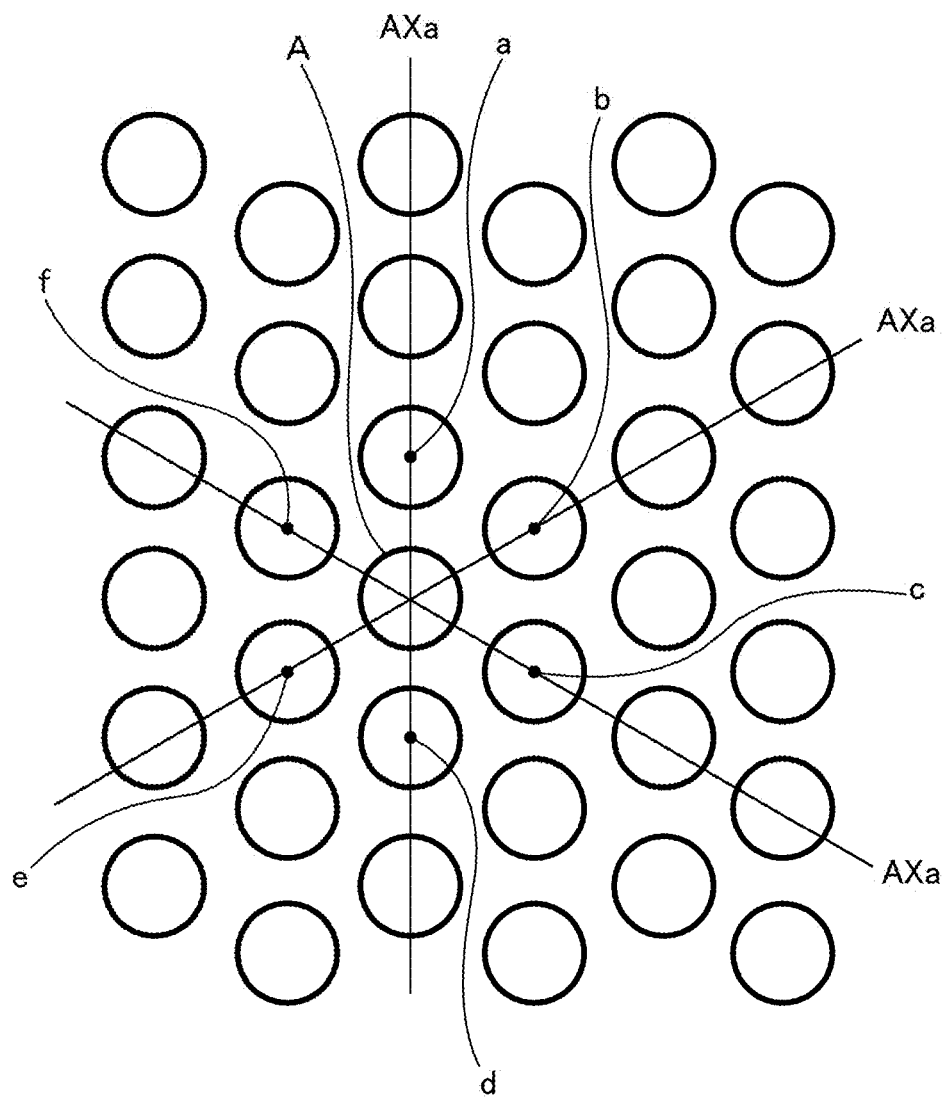
FIG. 3 is a schematic diagram showing another arrangement example of the uneven structure A having 3-fold symmetry or more in the pattern wafer (1) for LEDs according to this Embodiment.

FIG. 3 is a schematic diagram showing an arrangement example of the uneven structure A having 3-fold symmetry or more in the pattern wafer (1) for LEDs according to this Embodiment. For example, it is possible to obtain the example by observing the surface side with the uneven structure A using the scanning electron microscope or atomic force microscope. FIG. 3 shows the case where the uneven structure A is regular-hexagonally arranged substantially. The regular-hexagonal arrangement is an arrangement with 6-fold symmetry. In other words, in setting some axis arbitrarily, by rotating the axis (360/n)°=(360/6)°, the axis overlaps another symmetric axis. Herein, the arrangement axis A is the closest direction of convex portions or concave portions of the uneven structure A. In FIG. 3, for example, centers of convex portions (or concave portions, the same in the following description) nearest to the convex portion having the center shown by A are as shown by symbols a, b, c, d, e and f in FIG. 3. In other words, the arrangement axis AXa is a direction parallel to one of line segment A-a, line segment A-b, line segment A-c, line segment A-d, line segment A-e and line segment A-f joining the center A and respective other centers.

Further, for example, in the 4-fold symmetric arrangement as described above, also in the case where intervals of convex portions or concave portions on mutually perpendicular two axes are modulated periodically (for example, by multiplying a sine curve), the case is the arrangement with 4-fold symmetry. Further, in the 4-fold symmetric arrangement as described above, in the case where intervals of convex portions or concave portions on axes of every 60° with respect to some axis are changed periodically (for example, by multiplying a sine curve), the case is the arrangement with 6-fold symmetry. Furthermore, for example, in the 6-fold symmetric arrangement as described above, in the case where intervals of convex portions or concave portions on mutually perpendicular two axes are modulated periodically (for example, by multiplying a sine curve), the case is the arrangement with 4-fold symmetry. Still furthermore, in the 6-fold symmetric arrangement as described above, also in the case where intervals of convex portions or concave portions on axes of every 600 with respect to some axis are changed periodically (for example, by multiplying a sine curve), the case is the arrangement with 6-fold symmetry.

As described above, at least one or more arrangement axes exist, and by applying the definition as described already, it is possible to obtain the rotation shift angle Θ.

<Crystal Axis>

Figure 4:
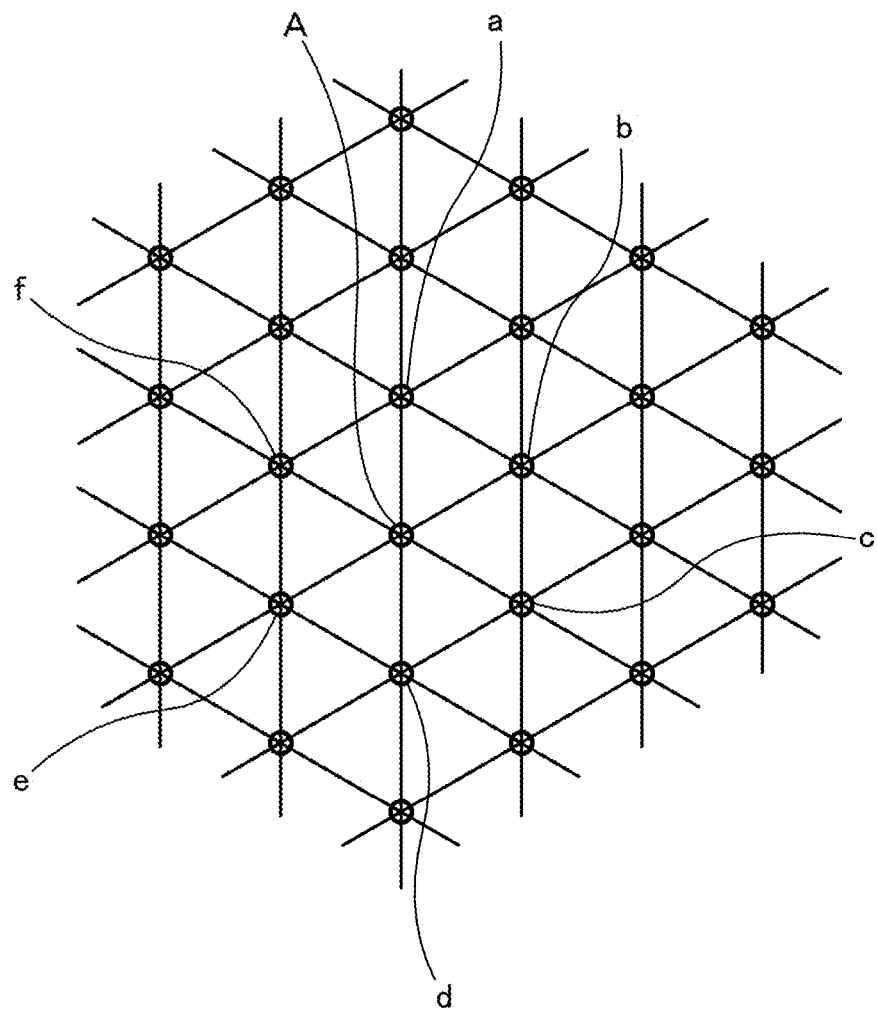
FIG. 4 is a schematic diagram to explain the crystal axis of a crystal lattice in the main surface of the pattern wafer (1) for LEDs according to this Embodiment.

The crystal axis will be described below. The crystal axis is the closest direction of lattice points of a crystal lattice in the plane parallel to the main surface of the pattern wafer (1) for LEDs. FIG. 4 is a schematic diagram to explain the crystal axis of the crystal lattice in the main surface of the pattern wafer (1) for LEDs according to this Embodiment. FIG. 4 shows the case where the crystal lattice in the plane parallel to the main surface of the wafer for LEDs is a regular-hexagonal lattice, and emphasizes by putting marks in lattice intersection points. The crystal axis is the closest direction of lattice points. For example, in FIG. 4, the intersection points nearest to the intersection point shown by symbol A are as shown by symbols a, b, c, d, e and f. In other words, the crystal axis is a direction parallel to one of line segment A-a, line segment A-b, line segment A-c, line segment A-d, line segment A-e and line segment A-f joining the intersection point A and respective other intersection points. As arrangements of the crystal lattice observed in the plane parallel to the main surface of the pattern wafer (1) for LEDs, examples thereof are a hexagonal arrangement, a tetragonal arrangement, an arrangement where a hexagonal arrangement is drawn in a one-axis direction, an arrangement where a tetragonal arrangement is drawn in a one-axis direction, an arrangement where a hexagonal arrangement is drawn in mutually orthogonal two-axis directions, and an arrangement where a tetragonal arrangement is drawn in mutually orthogonal two-axis directions. In any case of the crystal lattice arrangements, by applying the above-mentioned definition, the crystal axis of the present description is defined. For example, when the pattern wafer (1) for LEDs is a single crystal sapphire and the main surface is c-surface, m-surface or r-surface, the crystal axis is respectively a-axis, c-axis or n-axis.

<Arrangement with n-Fold Symmetry>

The uneven structure A provided on the pattern wafer (1) for LEDs substantially has an arrangement with n-fold symmetry. Therefore, in case of noting an initial growth stage of a semiconductor layer deposited on the pattern wafer (1) for LEDs, it is possible to uniformly disperse nucleation of the semiconductor layer, and to achieve balance with ununiformity of nucleus growth. Herein, the ununiformity of nucleus growth is that the semiconductor layer partially rises due to nucleus growth. In other words, it is possible to disperse the partially raised semiconductor layer in the nucleus growth stage.

Figure 5A:
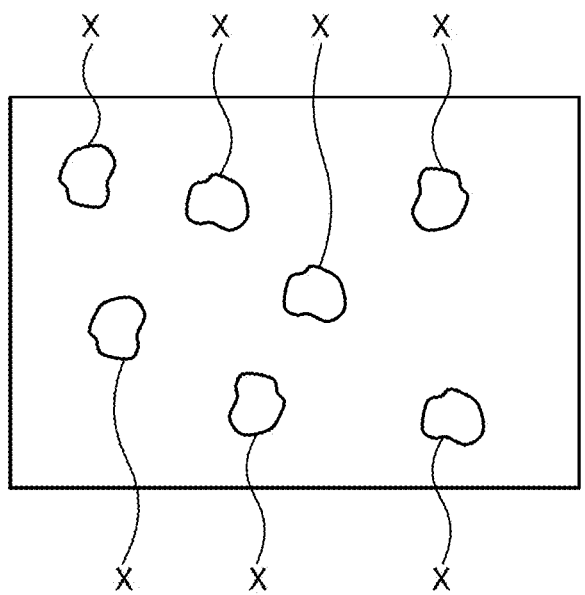
FIG. 5 contains schematic diagrams illustrating surface observation images when deposition is stopped in a nucleus growth stage in depositing a semiconductor layer on the surface of the pattern wafer (1) for LEDs.
Figure 5B:
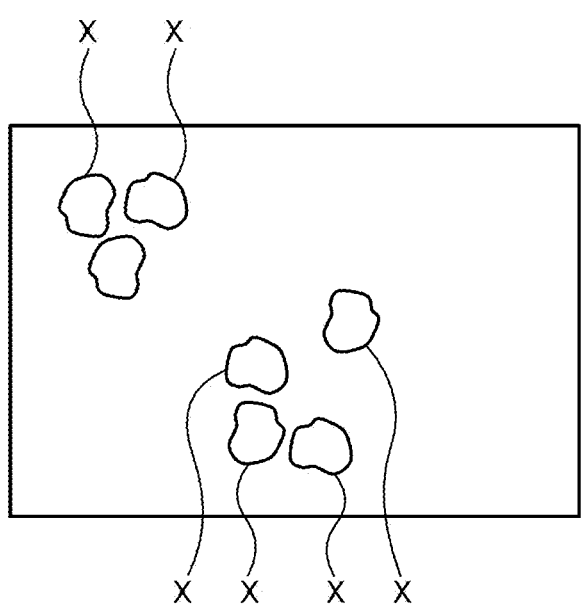

FIG. 5 contains schematic diagrams illustrating surface observation images when deposition is stopped in the nucleus growth stage in depositing the semiconductor layer on the surface of the pattern wafer (1) for LEDs. In FIGS. 5A and 5B, symbols X represent positions of semiconductor layers partially rising in the nucleus growth stage. FIG. 5A schematically represents a state in which semiconductor layers X partially rising in the nucleus growth stage are dispersed in the pattern wafer (1) for LEDs according to this Embodiment of the present invention. On the other hand, FIG. 5B shows the case where the deviation occurs in semiconductor layers X partially rising in the nucleus growth stage in the pattern wafer (1) for LEDs with the uneven structure A of an arrangement with low rotational symmetry. In the pattern wafer (1) for LEDs according to this Embodiment of the present invention, since the uneven structure A substantially has n-fold symmetry, dispersion properties are large in the semiconductor layers X partially rising in the nucleus growth stage. By this means, portions where coalescence (adherence) of growing semiconductor layers occurs are also dispersed. In other words, stress concentration points are dispersed inside the semiconductor layer, and collision portions of dislocations are also dispersed. Accordingly, cracks of the semiconductor layer are suppressed, and the internal quantum efficiency IQE is effectively increased. In addition, the crack referred to as in the present description is a crack of nano-order. Concerning the case where the semiconductor layer is deposited on the uneven structure A, the case is observed where the growth of the semiconductor layer is stopped in a facet formation process. At this point, for example, assuming that the facet has the shape of a polygon typified by a hexagon, when focused on two concave portions of adjacent polygons, a crack generated in the direction orthogonal to the side and the side of the concave portions of the polygons is the crack defined in the present application.

As described already, the rotation shift angle Θ is a shift amount between the crystal axis and the arrangement axis A in the rotation direction in the plane parallel to the main surface of the pattern wafer (1) for LEDs. This rotation shift angle Θ meets $0° < Θ ≤ (180/n)°$. In addition, "n" is the degree of rotational symmetry of the uneven structure A forming the arrangement with n-fold symmetry, and is as described already. For example, in the uneven structure A with 6-fold symmetry, the rotation shift angle Θ exceeds 0° and is 30° or less. By the rotation shift angle Θ meeting the range as described above, it is possible to increase the size of the bottom of the concave-portion of the uneven structure A which significantly contributes to initial growth of the semiconductor layer. At the same time, it is possible to decrease the number of convex portions of the uneven structure A which the semiconductor layer with a high growth rate passes through. Therefore, initial growth properties of the semiconductor layer are excellent. Then, in the side and the side of formed facets facing each other, the parallelism of the side and the side is excellent, and cracks are suppressed.

<More Preferable Range of the Rotation Shift Angle Θ>

The more preferable range of the rotation shift angle Θ is conceivable as described below. First, improvements in internal quantum efficiency IQE and improvements in crack are effective, and it is effective to increase the frequency of coalescence of growing semiconductor layers and disperse coalescence portions. Further, in the stage prior to coalescence of semiconductor layers, it is necessary to make the nucleation excellent and also keep the nucleus growth excellent. In order to achieve the matters, it is conceivable it is effective to increase the size of the concave portion of the uneven structure A to which the nucleus of the semiconductor layer adheres, and decrease the number of convex portions of the uneven structure A that the semiconductor layer crosses in growing. At the same time, it is important to increase the parallelism between the side and the side of formed facets.

Figure 6:
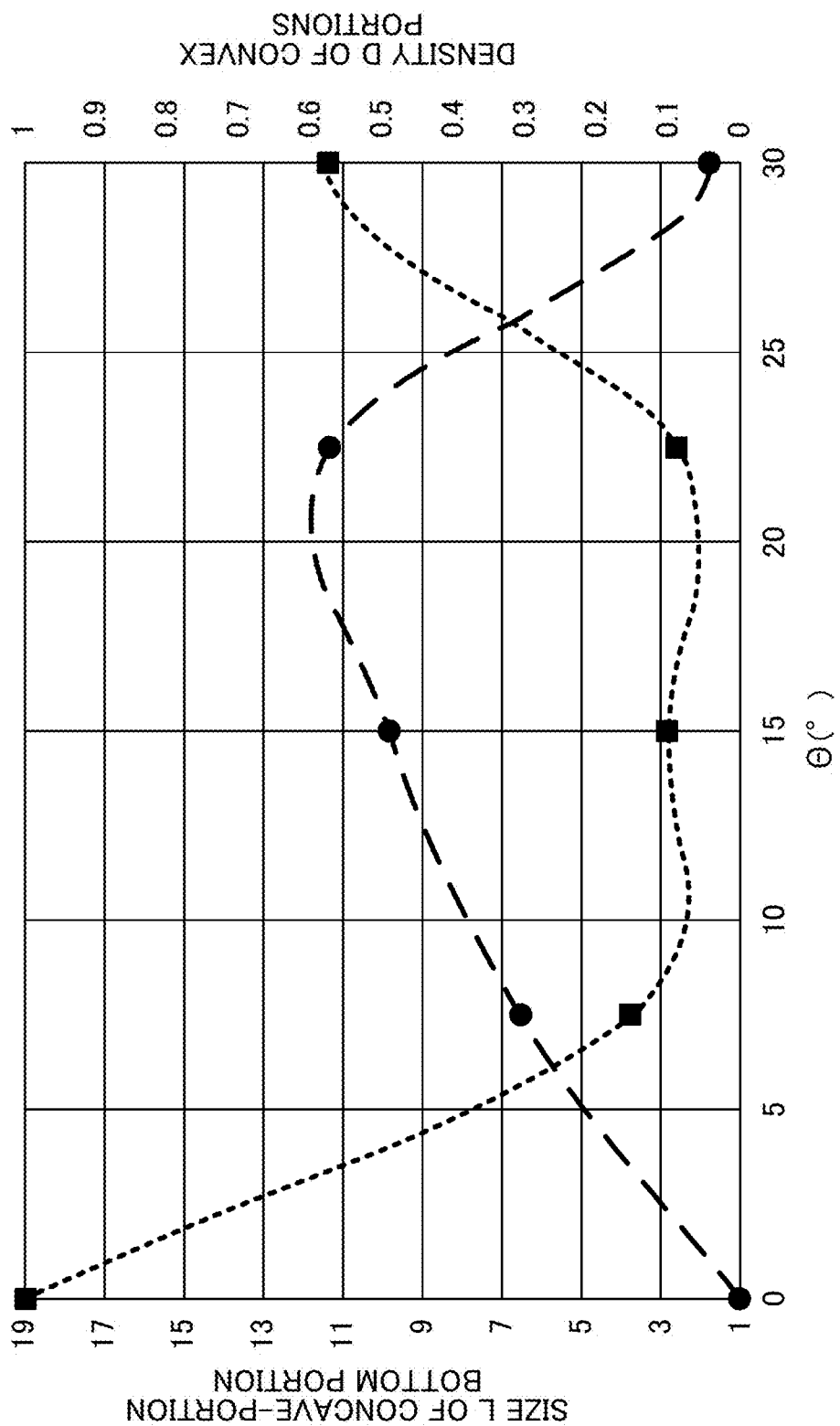
FIG. 6 is a graph illustrating the relationship among the rotation shift angle Θ, a size of a bottom of the concave-portion contributing to growth of the semiconductor layer and a density of convex portions that the growing semiconductor layer passes in the case of growing the semiconductor layer on the pattern wafer (1) for LEDs.

FIG. 6 is a graph illustrating the relationship among the rotation shift angle Θ, the size of the bottom of the concave-portion contributing to growth of the semiconductor layer and the density of convex portions that the growing semiconductor layer passes. FIG. 6 shows results of calculation of effects of the rotation shift angle Θ exerted on the size (hereinafter, also simply referred to as the size L of the bottom of the concavo-portion) of the bottom of the concave-portion contributing to growth of the semiconductor layer and the density (hereinafter, also simply referred to as the density D of convex portions) of convex portions that the growing semiconductor layer passes with respect to the uneven structure A with 6-fold symmetry. In FIG. 6, the horizontal axis represents the rotation shift angle Θ, the left vertical axis represents the size L of the bottom of the concave-portion, and the right vertical axis represents the density D of convex portions. Further, the plot of black circles (●) represents the effect on the size L of the bottom of the concavo-portion, and the plot of black squares (■) represents the effect on the density D of convex portions. Further, in FIG. 6, the size L of the bottom of the concave-portion and the density L of convex portions are normalized to be "1" in the case where the rotation shift angle Θ is 0°.

From FIG. 6, it is understood that the size L of the concave portion of the uneven structure A effective in adherence of the nucleus and its growth is increased, as the rotation shift angle Θ is increased. Particularly, it is understood that there is a maximum point when the rotation shift angle Θ is increased, and that the size L of the concave portion is larger in the case where the rotation shift angle Θ is maximum than in the case where the rotation shift angle Θ is 0°. On the other hand, it is understood that the density D of convex portions functioning adversely on growth of the semiconductor layer and coalescence of growing semiconductor layers is decreased, as the rotation shift angle Θ is increased. Particularly, it is understood that there is a minimum point when the rotation shift angle Θ is increased, and that the density D of convex portions is smaller in the case where the rotation shift angle Θ is maximum than in the case where the rotation shift angle Θ is 0°.

From the foregoing, in order to suppress cracks effectively and increase the internal quantum efficiency IQE, the rotation shift angle Θ is preferably 1° or more, more preferably 3° or more, and most preferably 5° or more. In this case, particularly, since the density D of convex portions significantly decreases, the growth properties of the semiconductor layer are stabilized, and the effect of crack suppression is large. Further, the rotation shift angle Θ is preferably 7.5° or more, more preferably 10° or more, and most preferably 14° or more. In this case, it is possible to increase the size of the concave portion of the uneven structure A effective in adherence of the nucleus and its growth, while holding the above-mentioned crack suppression effect, and it is thereby possible to more improve the internal quantum efficiency IQE. On the other hand, when the rotation shift angle Θ is $(180/n)°$, it is conceivable that the direction conversion amount of stress is maximum which is capable of being changed by a shift amount between the crystal axis and the arrangement axis A, the effect of rotating and connecting the relaxed stress in a vector manner is the highest due to the uneven structure A with n-fold, the stress relaxation effect is further increased, and that in association therewith, reductions in the warpage are more remarkable.

When the rotation shift angle Θ further meets the following relationship with the convex portion of the uneven structure A, the crack suppression effect and internal quantum efficiency IQE increasing effect are more increased. In using Duty that is a ratio (Φave/Pave) of the average diameter (Φave) of the bottom of the convex-portion of the uneven structure A to the average interval Pave, it is preferable that the rotation shift angle Θ meets a range of a tan(Duty/2)°≤Θ≤(180/n)°. In addition, the average diameter (Φave), average interval (Pave) and Duty will be described later.

In this case, the effect of internal quantum efficiency IQE improvement and the crack suppression effect on the semiconductor layer are both more increased. By the rotation shift angle Θ meeting the above-mentioned range, the size L of the bottom of the concave-portion significantly contributing to initial growth of the semiconductor layer is capable of being made large in the direction approximately perpendicular to the growth direction of the semiconductor layer in the plane of the pattern wafer (1) for LEDs, and the size of the surface with a fast growth rate of the semiconductor layer is increased. By this means, in the case of noting coalescence of growing semiconductor layers, the interface area of coalescing semiconductor layers is increased. Further, it is possible to decrease the number of convex portions of the uneven structure which the surface with a fast growth rate of the semiconductor layer passes through, and therefore, coalescence properties of growing semiconductor layers are made excellent. From the foregoing, the internal quantum efficiency IQE is more increased, and cracks occurring in the semiconductor layer are effectively suppressed.

The relationship between the above-mentioned Duty and the rotation shift angle Θ was obtained by considering as described below. First, for improvements in internal quantum efficiency IQE and improvements in crack, it is effective to increase the frequency of coalescence of growing semiconductor layers and disperse coalescence portions. Further, in the stage prior to coalescence of semiconductor layers, it is necessary to make nucleus growth of the semiconductor layer excellent and also keep nucleus growth properties excellent. In order to achieve the matters, it is conceivable it is effective to increase the size of the concave portion of the uneven structure A to which the nucleus of the semiconductor layer adheres, and decrease the number of convex portions of the uneven structure A that the semiconductor layer crosses in growing.

Figure 7:
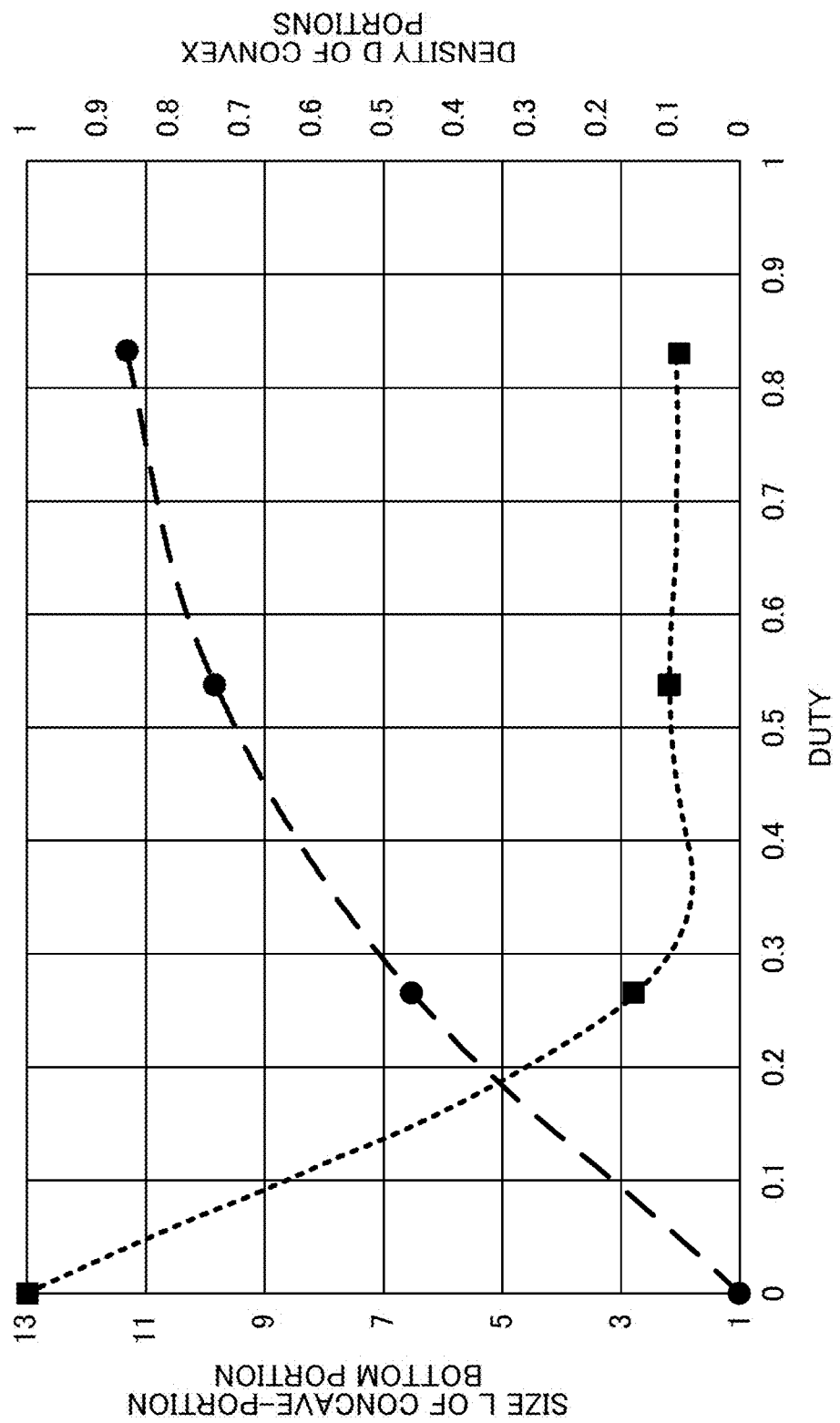
FIG. 7 is a graph illustrating the relationship among Duty, the size of the bottom of the concave-portion contributing to growth of the semiconductor layer and the density of convex portions that the growing semiconductor layer passes in the case of growing the semiconductor layer on the pattern wafer (1) for LEDs.

FIG. 7 is a graph illustrating the relationship among the Duty, the size of the bottom of the concave-portion contributing to growth of the semiconductor layer, and the density of convex portions that the growing semiconductor layer passes. FIG. 7 shows results of calculation of effects of the Duty exerted on the size L of the bottom of the concavo-portion and the density D of convex portions, using the case of the uneven structure A with 6-fold symmetry as an example. In FIG. 7, the horizontal axis represents the Duty, the left vertical axis represents the size L of the bottom of the concave-portion, and the right vertical axis represents the density D of convex portions. Further, the plot of black circles (●) represents the effect on the size L of the bottom of the concavo-portion, and the plot of black squares (■) represents the effect on the density D of convex portions. Further, in FIG. 7, the size L of the bottom of the concave-portion and the density D of convex portions are normalized to be "1" in the case where the Duty is "0" i.e. there is no uneven structure A.

From FIG. 7, it is understood that the size L of the concave portion of the uneven structure A effective in adherence of the nucleus and its growth is increased, as the Duty is increased. On the other hand, it is understood that the density D of convex portions functioning-adversely on growth of the semiconductor layer and coalescence of semiconductor layers is decreased, as the Duty is increased.

Herein, in FIGS. 6 and 7, the parameters of the horizontal axis are only different, and similar are behaviors of the effect on the size L of the bottom of the concave-portion and the effect on the density D of convex portions. From this relationship, by obtaining the relationship between the rotation shift angle Θ and the Duty which are represented by respective horizontal axes in FIGS. 6 and 7, rotation shift angle Θ=a tan(Duty/2)° is obtained. Herein, as described already, as the Duty is increased, since adherence of the nucleus of the semiconductor layer, growth and coalescence effectively occurs, the rotation shift angle Θ is given as Θ≥a tan(Duty/2)°.

Figure 8:
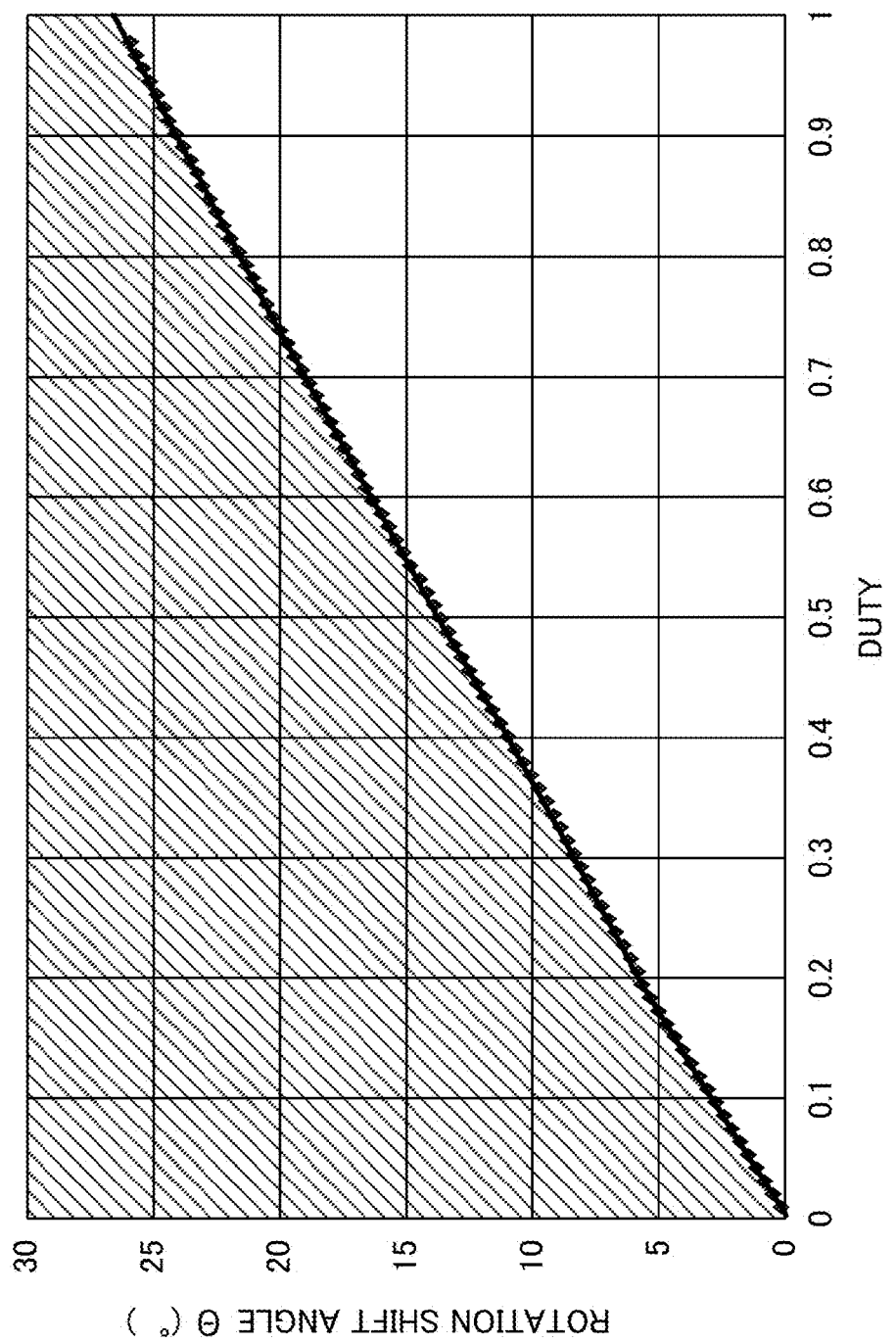
FIG. 8 is a graph illustrating the relationship between the rotation shift angle Θ and the Duty shown in FIGS. 6 and 7.

In other words, in the case of determining the Duty of the uneven structure A, when the rotation shift angle Θ has a certain value or more and is in the range of (180/n)° or less, as described above, since adherence of the nucleus of the semiconductor layer, growth and coalescence of growing semiconductor layers is made more excellent, it is possible to obtain an epitaxial wafer for LEDs high in internal quantum efficiency IQE with cracks suppressed. FIG. 8 is a graph illustrating the relationship between the rotation shift angle Θ and the Duty shown in FIGS. 6 and 7. For example, in using the case where the uneven structure A is 6-fold symmetry as an example, the range shown by oblique lines is the most preferable range of the rotation shift angle Θ. In FIG. 8, the horizontal axis represents the Duty, and the vertical axis represents the rotation shift angle Θ. The plot in FIG. 8 represents a tan(Duty/2)°, and the portion higher than the curve in the vertical axis direction is the most preferable range of the rotation shift angle Θ.

Figure 9:
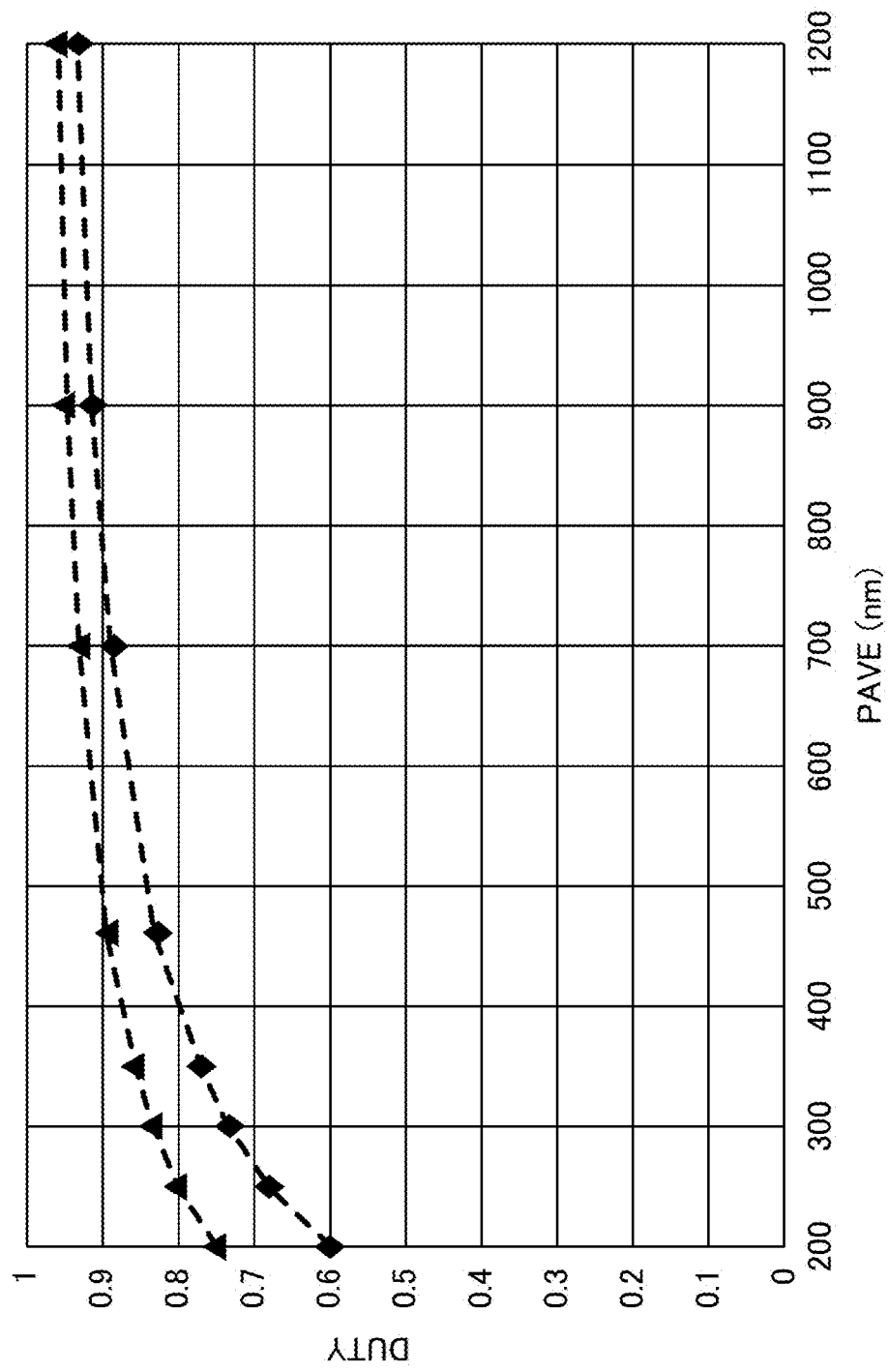
FIG. 9 is a graph illustrating the relationship between average interval Pave and Duty of the uneven structure A of the pattern wafer (1) for LEDs according to this Embodiment.

In addition, when the size L of the bottom portion of the concave portion of the uneven structure A is too small, since nucleation of the semiconductor layer is inhibited, growth of the semiconductor layer is inhibited. It is possible to represent the size of the bottom portion of the concave portion of the uneven structure A by using the average interval Pave and the Duty. Further, the lower limit value of the size of the bottom portion of the concave portion of the uneven structure A is roughly estimated from the size of the nucleus of the semiconductor layer. More specifically, with respect to the RAMP process after low temperature buffer layer deposition as described later on the pattern wafer (1) for LEDs, the travel distance of the nucleus that is dispersed again inside the RAMP process is approximately 80 nm. From this fact, by setting the size L of the bottom of the concave-portion at 80 nm or more, it is possible to suppress the nucleus adhering to the side surface of the convex portion, and the crystal quality is increased. From the foregoing, the upper limit value of the Duty is determined, and is calculated as Duty≤1−(Y/Pave). Herein, it is preferable that Y=50 nm, and it is the most preferable that Y=80 nm. In other words, it is preferable to meet the range of the Duty positioned on the lower side of the curve shown in FIG. 9. FIG. 9 is a graph illustrating the relationship between the average interval Pave of the uneven structure A and the Duty of the pattern wafer (1) for LEDs according to this Embodiment. In FIG. 9, the horizontal axis represents the average interval Pave of the uneven structure A, and the vertical axis represents the Duty. In FIG. 9, the plot of black triangles (▲) represents the preferable case where Y of equation Duty≤1−(Y/Pave) is 50 nm, and the plot of black diamonds (♦) represents that Y is 80 nm and represents the more preferable case. In addition, with respect to the equation of the Duty as described above, the dimension of the Pave is nanometers.

By the uneven structure A meeting the range of the curve or less shown in FIG. 9, the nucleation of the semiconductor layer is excellent as descried already. Herein, by meeting the rotation shift angle Θ, the nucleus growth is excellent, the frequency of coalescence of growing semiconductor layers is high, while it is possible to disperse coalescence portions, and therefore, it is possible to obtain the semiconductor layer high in internal quantum efficiency IQE with cracks suppressed.

Figure 10A:
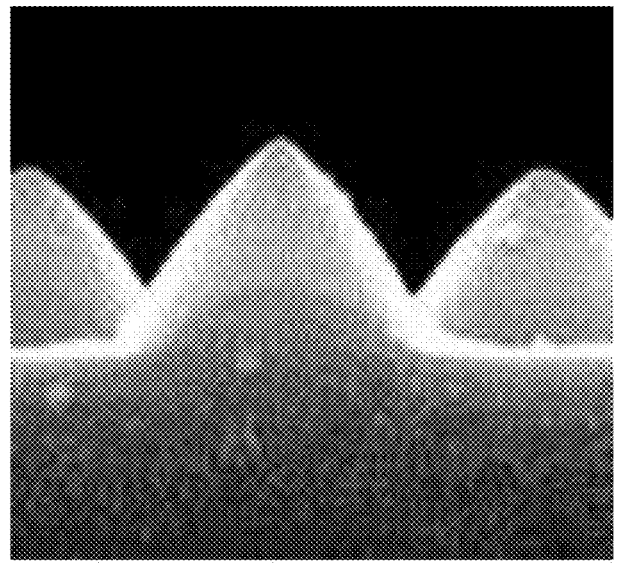
FIG. 10A is a scanning electron microscope photograph showing an example of a cross-sectional shape of the top of the convex-portion of the uneven structure. A according to this Embodiment.
Figure 10B:
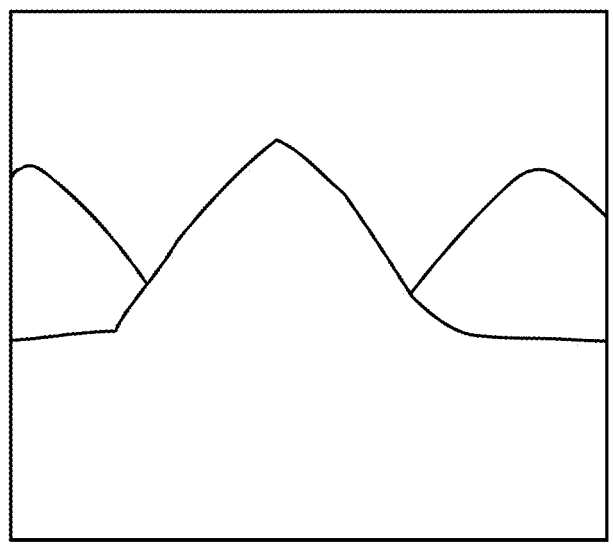
FIG. 10B is a schematic diagram indicating a part of FIG. 10A.

The crack that is one of the effects of the rotation shift angle Θ as described above will more specifically be described below, including actual study results. First, a C-surface sapphire of 6-inches was used as a wafer for LEDs. The main surface of the wafer for LEDs was processed using a nano-fabrication sheet method described later to obtain the pattern wafer (1) for LEDs. Herein, the rotation shift angle Θ was controlled by inclining the nano-fabrication sheet α° from the normal to bond, using the normal with respect to the Orientation Flat of the wafer for LEDs as a reference. In other words, α=Θ. Further, since the accuracy resolution of bonding is 1~2°, the rotation shift angle Θ includes an error of Θ±1°. The arrangement of the uneven structure A was made a regular-hexagonal arrangement. In other words, the uneven structure A is a 6-fold symmetric arrangement. Further, the shape of the top of the convex-portion of the uneven structure A was checked by scanning electron microscope observation on the cross section of the pattern wafer (1) for LEDs. The result is shown in FIG. 10. FIG. 10A is a scanning electron microscope photograph showing an example of the cross-sectional shape of the top of the convex-portion of the uneven structure A according to this Embodiment. FIG. 10B is a schematic diagram indicating a part of FIG. 10A. From FIG. 10, it is understood that a flat tabletop did not exist in the top of the convex-portion, and that the cross-sectional shape of the top of the convex-portion is formed so that curves of the convexity mutually crosses slightly upward.

Figure 11:
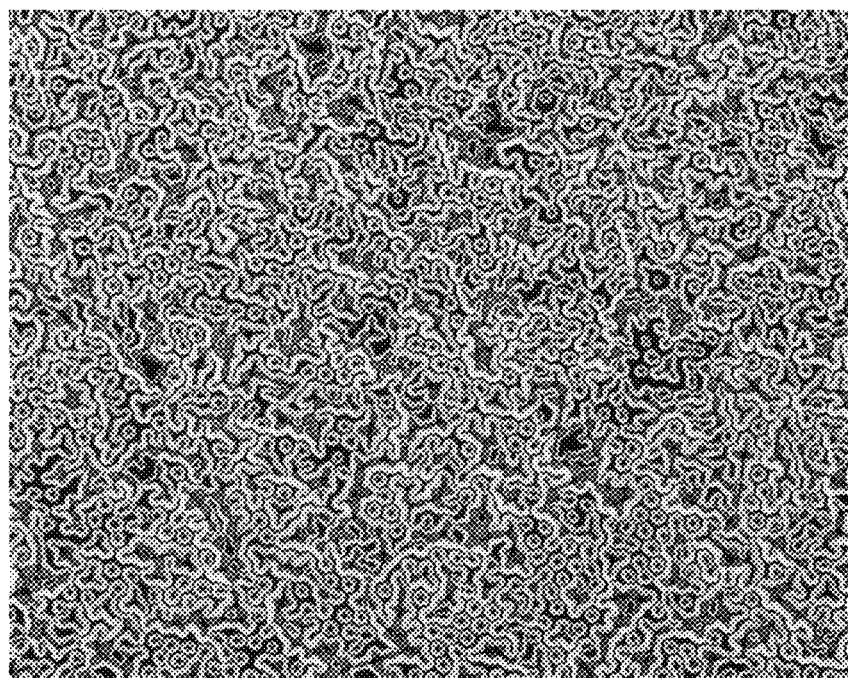
FIG. 11 is a scanning electron microscope photograph showing an example of an undoped first semiconductor layer according to this Embodiment.
Figure 12A:
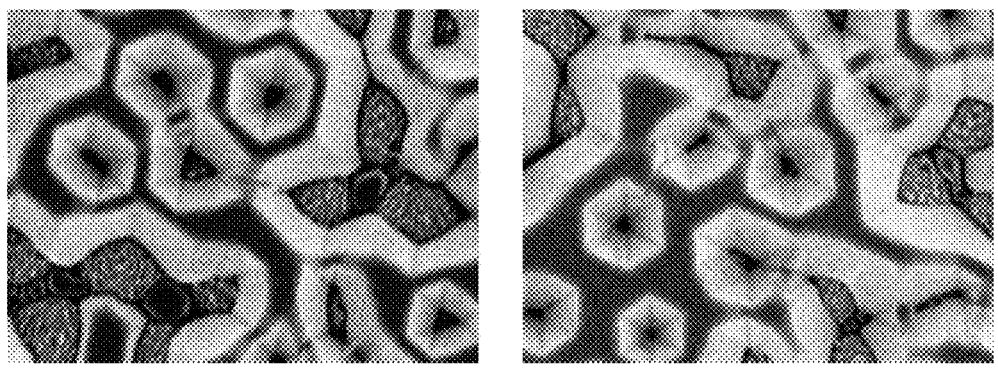
FIG. 12A contains scanning electron microscope photographs showing cracks, FIG. 12B contains schematic diagrams indicating a part of FIG. 12A.
Figure 12B:
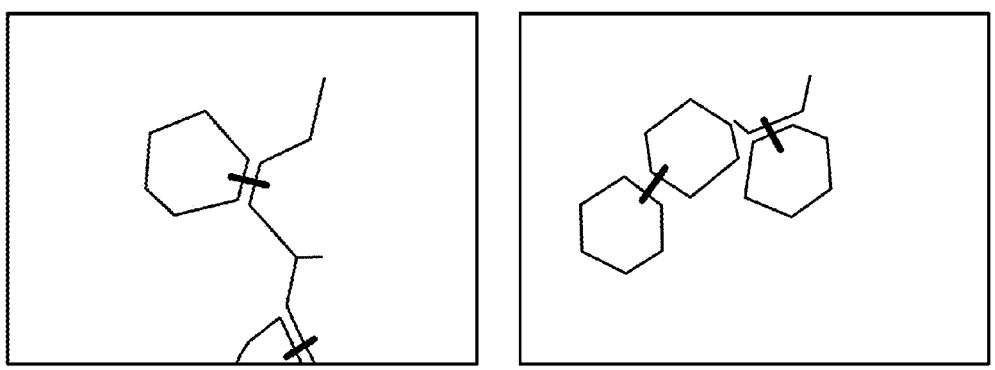

A low temperature buffer layer with 10 nm was deposited on the prepared pattern wafer (1) for LEDs. Next, gallium nitride was deposited as an undoped first semiconductor layer described later to form facets. In a state during the facet formation, the resultant was removed from a chamber, and the gallium nitride deposition surface was observed with the scanning electron microscope. The result is shown in FIG. 11. FIG. 11 is a scanning electron microscope photograph showing an example of the undoped first semiconductor layer according to this Embodiment. FIG. 11 is a 2500-times observation image. From FIG. 11, it is understood that a plurality of facets was formed and that connection of gallium nitride layers was random. Herein, FIG. 12 shows images obtained by enlarging and extracting cracks observed inside the observation image of FIG. 11. FIG. 12A contains scanning electron microscope photographs showing cracks. FIG. 12B contains schematic diagrams indicating apart of FIG. 12A. From FIG. 12, when focused on a hexagonal opening portion of growing gallium nitride, in the gallium nitride layer in the position in which the side and the side of hexagons are opposed, it is understood that the crack occurred in the direction perpendicular to the sides. The crack in the present description refers to such a crack of nanoscale.

As a result of measuring the number of cracks from the scanning electron microscope image and quantifying, as the rotation shift angle Θ changed to 0°, 2°, 7.5°, 15°, 22.5° and 30°, the crack density changed to $72\times10^9$ cracks/cm$^2$, $70\times10^9$ cracks/cm$^2$, $57\times10^9$ cracks/cm$^2$, $51\times10^9$ cracks/cm$^2$, $43\times10^9$ cracks/cm$^2$ and $41\times10^9$ cracks/cm$^2$. In other words, it is understood that the crack density decreased as the rotation shift angle Θ increased. Further, by comparing the decrease degrees, it is understood that decreases in the crack density were remarkable in a region in which the rotation shift angle Θ exceeded 2°. As the reason, control of the rotation shift angle Θ is about ±1°, and it is conceivable that slight rotation of the uneven structure A of 1~2° is embedded in the error of deposition control in terms of gallium nitride deposition.

Figure 13:
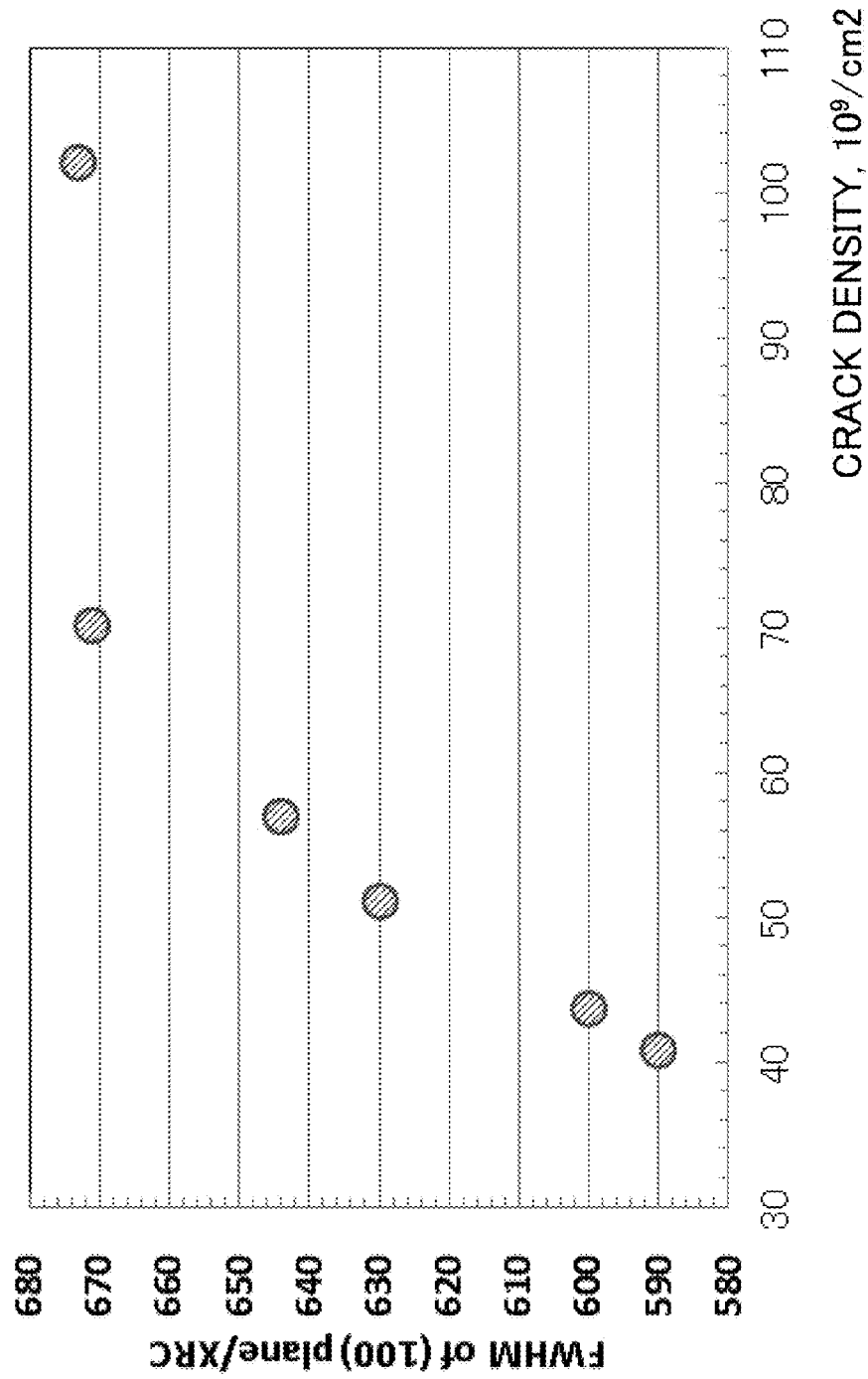
FIG. 13 is a graph illustrating the relationship between the crack density and Full Width Half Maximum (FWHM) of a rocking curve.

Checked next was the effect on the semiconductor layer due to decreases in the crack. The undoped first semiconductor layer was further deposited on the sample subjected to the above-mentioned measurement of cracks to flatten the surface of the gallium nitride layer. In this state, the in-plane X-ray rocking curve method was applied to obtain the rocking curve, and the Full Width Half Maximum (FWHM) thereof was evaluated. The result is shown in FIG. 13. FIG. 13 is graph illustrating the relationship between the crack density and the Full Width Half Maximum (FWHM) of the rocking curve. Concerning FIG. 13, the horizontal axis represents the crack density, and the vertical axis represents the Full Width Half Maximum (FWHM) of the rocking curve. From FIG. 13, it is understood that the FWHM decreases to 673, 671, 644, 630, 600 and 590, as the crack density decreases to $102\times10^9$ cracks/cm$^2$, $71\times10^9$ cracks/cm$^2$, $56\times10^9$ cracks/cm$^2$, $52\times10^9$ cracks/cm$^2$, $44\times10^9$ cracks/cm$^2$ and $40\times10^9$ cracks/cm$^2$. Particularly, it was understood that the numeric value of FWHM effectively decreases in a region in which the crack density is $70\times10^9$ cracks/cm$^2$ or less. In other words, it was understood that crystal uniformity of the semiconductor layer is increased, as the crack density decreases, particularly, when the crack density is $70\times10^9$ cracks/cm$^2$ or less.

Figure 14:
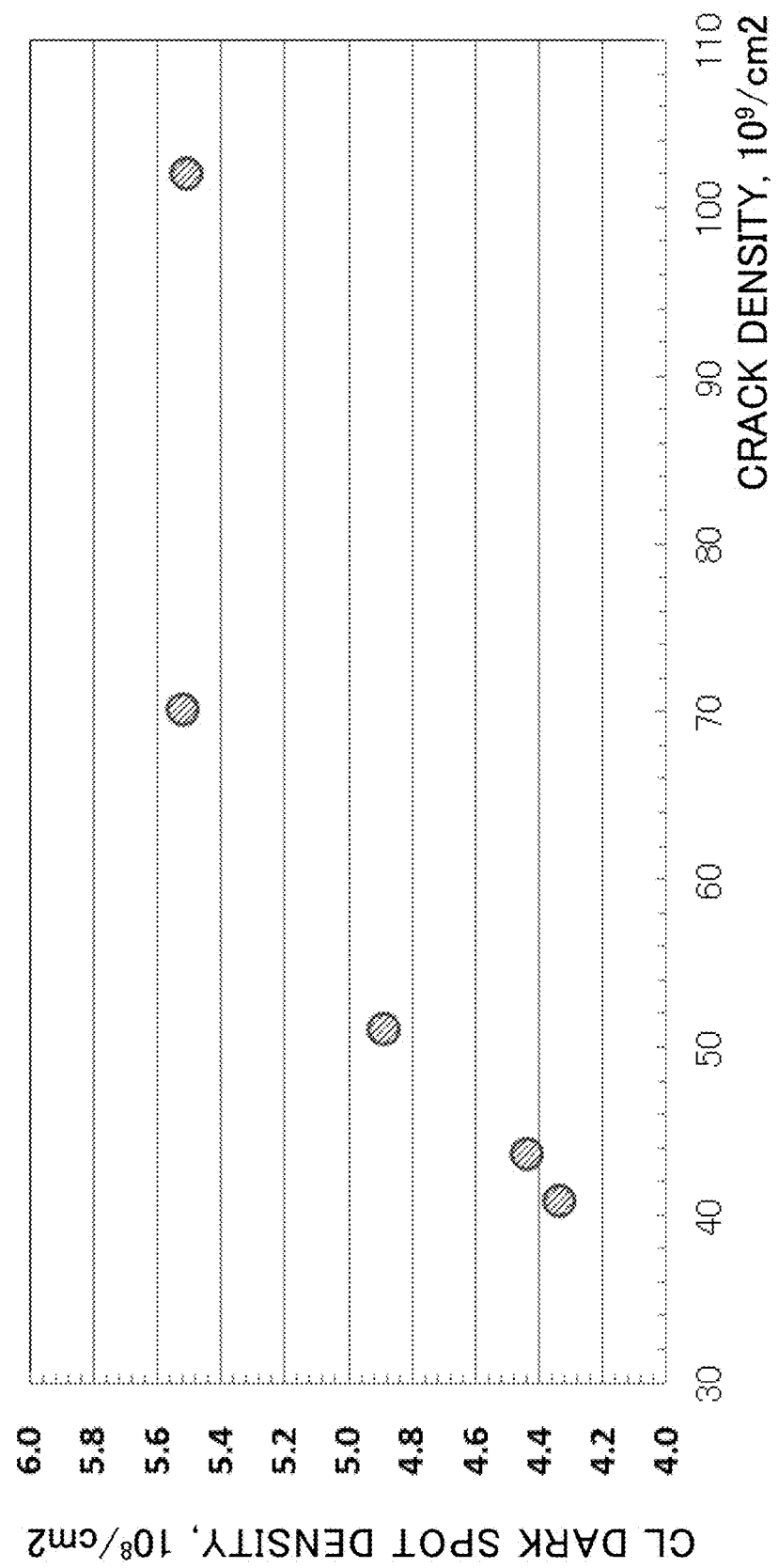
FIG. 14 is a graph illustrating the relationship between the crack density and a dark spot density obtained from an image obtained by cathode luminescence (CL) evaluation.

Further, an n-type gallium nitride layer was deposited on the sample used in the above-mentioned measurement of rocking curve, as a doped first semiconductor layer. The cathode luminescence (CL) evaluation was made to the sample. Herein, CL is techniques for evaluating light occurring by applying an electron beam, is the evaluation that corresponds to transition from near the bottom of the conduction band to near the top of the valence band, and therefore, is techniques for evaluating crystal information such as crystal defect, carrier concentration, stress and impurity. The result is shown in FIG. 14. FIG. 14 is a graph illustrating the relationship between the crack density and a dark spot density obtained from the image obtained by the cathode luminescence (CL) evaluation. Concerning FIG. 14, the horizontal axis represents the crack density, and the vertical axis represents the dark spot density obtained from the image obtained by CL. From FIG. 14, it is understood that the CL dark spot density decreases to $5.51\times10^8$/cm$^2$, $5.52\times10^8$/cm$^2$, $4.89\times10^8$/cm$^2$, $4.44\times10^8$/cm$^2$ and $4.34\times10^8$/cm$^2$, as the crack density decreases to $102\times10^9$ cracks/cm$^2$, $71\times10^9$ cracks/cm$^2$, $52\times10^9$ cracks/cm$^2$, $44\times10^9$ cracks/cm$^2$ and $40\times10^9$ cracks/cm$^2$. Particularly, it was understood that the numeric value of the CL dark spot density effectively decreases in a region in which the crack density is $71\times10^9$ cracks/cm$^2$ or less. In other words, it was understood that the crystal equality is significantly increased when the crack density is $70\times10^9$ cracks/cm$^2$ or less.

From the foregoing, by making the rotation shift angle Θ exceed 0° and preferably exceed 2°, it is possible to effectively decrease the crack density. By this means, crystal uniformity of the undoped first semiconductor layer is effectively increased. Further, it is possible to increase the crystal quality of the doped first semiconductor layer. Since these increases in the crystal uniformity and crystal quality are factors to increase the internal quantum efficiency IQE, and are considered also factors to increase long-term reliability of the semiconductor light emitting device, by controlling the crack density with the rotation shift angle Θ, it is estimated that it is possible to concurrently improve light emission performance and long-term reliability of the semiconductor light emitting device.

Figure 15:
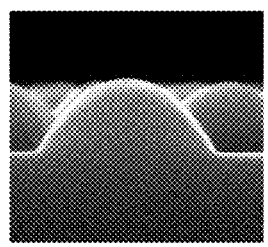
FIG. 15 contains scanning electron microscope photographs showing examples of the cross-sectional shape of the top of the convex-portion of the uneven structure A according to this Embodiment.
Figure 15:
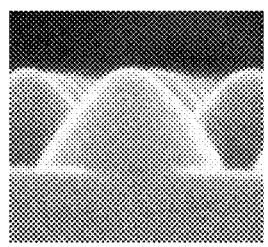
Figure 15:
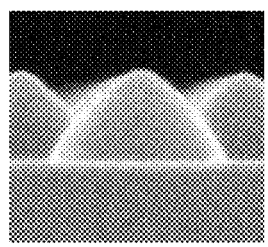
Figure 15:
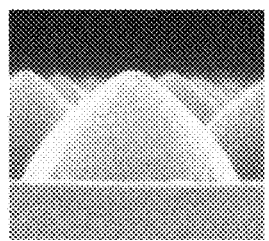
Figure 15:
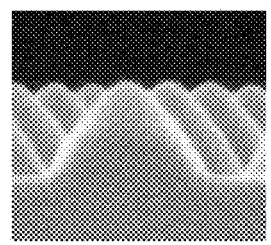
Figure 15:
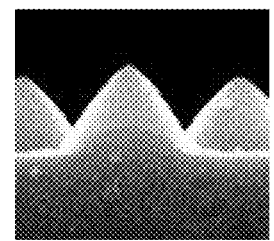

In addition, tendencies similar to the above-mentioned results were obtained with respect to shapes of the top of the convex-portion as shown in FIG. 15, although the absolute value of the numeric value slightly changed. FIG. 15 contains scanning electron microscope photographs showing examples of the cross-sectional shape of the top of the convex-portion of the uneven structure A according to this Embodiment. The scanning electron microscope images as shown in FIG. 15 are observation images on the cross section of the pattern wafer (1) for LEDs. From FIG. 15, it is understood that the shape of the top of the convex-portion used in the study includes from the shape of a lens to the shape that curves of the convex portion mutually cross slightly upward to form the cross-sectional shape of the vertex portion. From the fact, by adopting the top of the convex-portion that is a corner portion with a radius of curvature exceeding "0", it is conceivable that it is possible to develop the above-mentioned effects of the rotation shift angle Θ.

It is already described that it is important that the top of the convex-portion of the uneven structure A is a corner portion with a radius of curvature exceeding "0". Herein, also in the case where a flat portion exists in the top of the convex-portion i.e. case of tabletop structure, it was suggested that it is possible to inhibit demerits of the tabletop structure by combining with the rotation shift angle Θ. First, the demerits of the tabletop structure are that it is difficult to reduce dislocations due to the semiconductor layer growing from the tabletop. In other words, it is hard to reduce the dislocation density of the semiconductor layer, and there is a tendency to reduce the internal quantum efficiency IQE. Herein, although the mechanism is not certain, it was understood that there is a tendency to enable the reduction amount of the internal quantum efficiency IQE due to the tabletop to be decreased in a range in which the rotation shift angle Θ exceeds 10° and is (180/n)° or less. In other words, the reduction degree of the internal quantum efficiency IQE is decreased. On the other hand, in the case of the tabletop structure, light scattering properties with respect to the emitted light are more increased due to the large area of the convex portion, and therefore, it is possible to more increase the light extraction efficiency LEE. As a result, it was understood that it is possible to manufacture LEDs with high efficiency by using the pattern wafer (1) for LEDs including the uneven structure A in which the shape of the top of the convex-portion is the tabletop shape and the rotation shift angle Θ exceeds 10° and is (180/n)° or less. This result was remarkable in a region in which the rotation shift angle Θ was 15° or more and (180/n)° or less. Further, as the size of the tabletop, samples of 20 nm, 50 nm, 100 nm, 300 nm and 500 nm were tested, and it was understood that the cases of 300 nm and 500 nm provide approximately the same efficiency, and that the performance is more enhanced in a region of 100 nm or less. It is presumed to be caused by the fact that the re-diffusion distance of the nucleus in the RAMP process is about 80 nm after depositing the low temperature buffer layer. From the foregoing, it was suggested that any contradiction does not arise when the corner portion with a radius of curvature exceeding "0" referred to in the present description includes the case where the size of the tabletop is 100 nm or less. From the foregoing, it is possible to manufacture high-efficient LEDs with ease, by using the pattern wafer (1) for LEDs in which the convex portion of the uneven structure A is formed of the corner portion with a radius of curvature exceeding "0" including the case where the size of the tabletop is 100 nm or less, and the rotation shift angle Θ exceeds 10° and is (180/n)° or less and preferably meets a range of 150 to (180/n)°.

Figure 16:
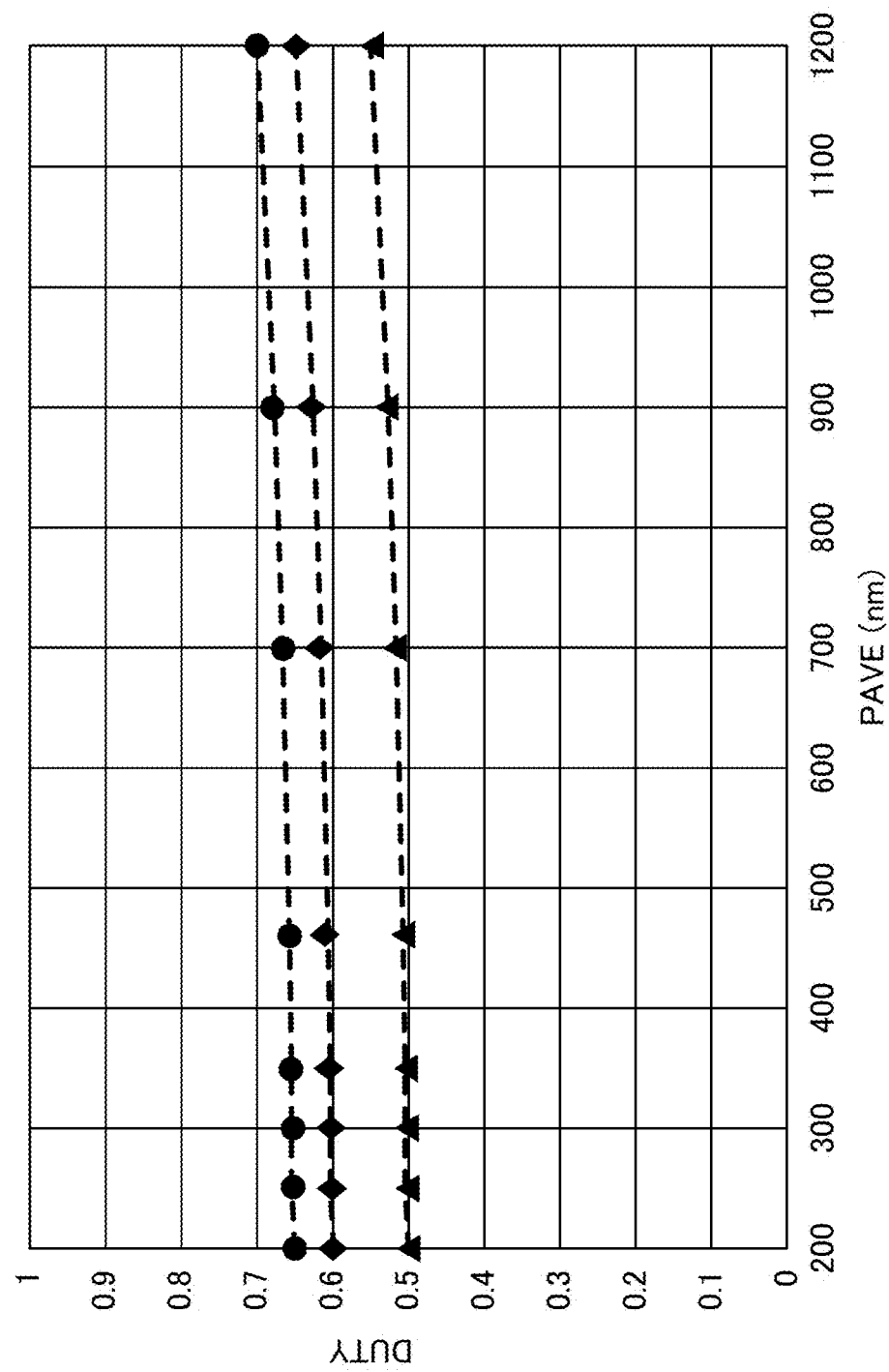
FIG. 16 is a diagram of a graph illustrating the relationship between average interval Pave and Duty of the uneven structure A of the pattern wafer (1) for LEDs according to this Embodiment.

From the foregoing, it is possible to reduce cracks in the semiconductor layer by controlling the shape of the top of the convex-portion of the uneven structure A and the rotation shift angle Θ. Then, it is possible to enhance the internal quantum efficiency IQE and improve light emission characteristics of the semiconductor light emitting device. Further, it is possible to improve the long-term reliability of the semiconductor light emitting device. Herein, when the light extraction efficiency LEE that is another significant problem of the LED is capable of being also increased by uneven structure A, it is possible to more increase the external quantum efficiency EQE of the LED. The reason why the light extraction efficiency LEE of the LED is kept low is that the semiconductor layer with a high refractive index is sandwiched between media with relatively low refractive indexes. In such a case, the light is guided inside the medium with a high refractive index. By this waveguide, the emitted light is absorbed to be heat and disappears before being extracted to the outside of the LED. In other words, in order to increase the light extraction efficiency LEE, it is necessary to disturb the mode of the emitted light subjected to waveguide. Herein, in consideration of effectively disturbing the travelling direction of the emitted light to disturb the waveguide mode, and increasing the light extraction efficiency LEE, it was understood that the Duty needs a predetermined value or more. It was calculated from the three-dimensional RCWA method and two-dimensional FDTD method. In other words, it is preferable to meet Duty $(3.47 \times 10^{-8})$Pave$^2$+ Z. Herein, in the order of Z of 0.5, 0.6 and 0.65, since the number of modes of light diffraction and diffraction intensity increases due to the uneven structure A, the effect of disturbing the waveguide mode is increased, and the light extraction efficiency LEE is also increased. In other words, it is preferable to meet the range of the Duty positioned on the side higher than the curve as shown in FIG. 16. In addition, concerning the above-mentioned equation to determine the Duty to more increase the light extraction efficiency LEE, the dimension of Pave is nanometers.

FIG. 16 is a diagram of a graph illustrating the relationship between the average interval Pave and the Duty of the uneven structure A of the pattern wafer (1) for LEDs according to this Embodiment. In FIG. 16, the horizontal axis represents the average interval Pave of the uneven structure A, and the vertical axis represents the Duty. In FIG. 16, the plot of black triangles (▲) represents the preferable case where Z in equation Duty≥$(3.47 \times 10^{-8})$ Pave$^2$+Z is 0.5, the plot of black diamonds (♦) represents the more preferable case where Z is 0.6, and the plot of black circles (●) represents the most preferable case where Z is 0.65.

By the uneven structure A meeting the range of the curve or more as shown in FIG. 16, the intensity of light diffraction and the number of modes is increased as described above, and the light extraction efficiency LEE is increased.

Figure 17:
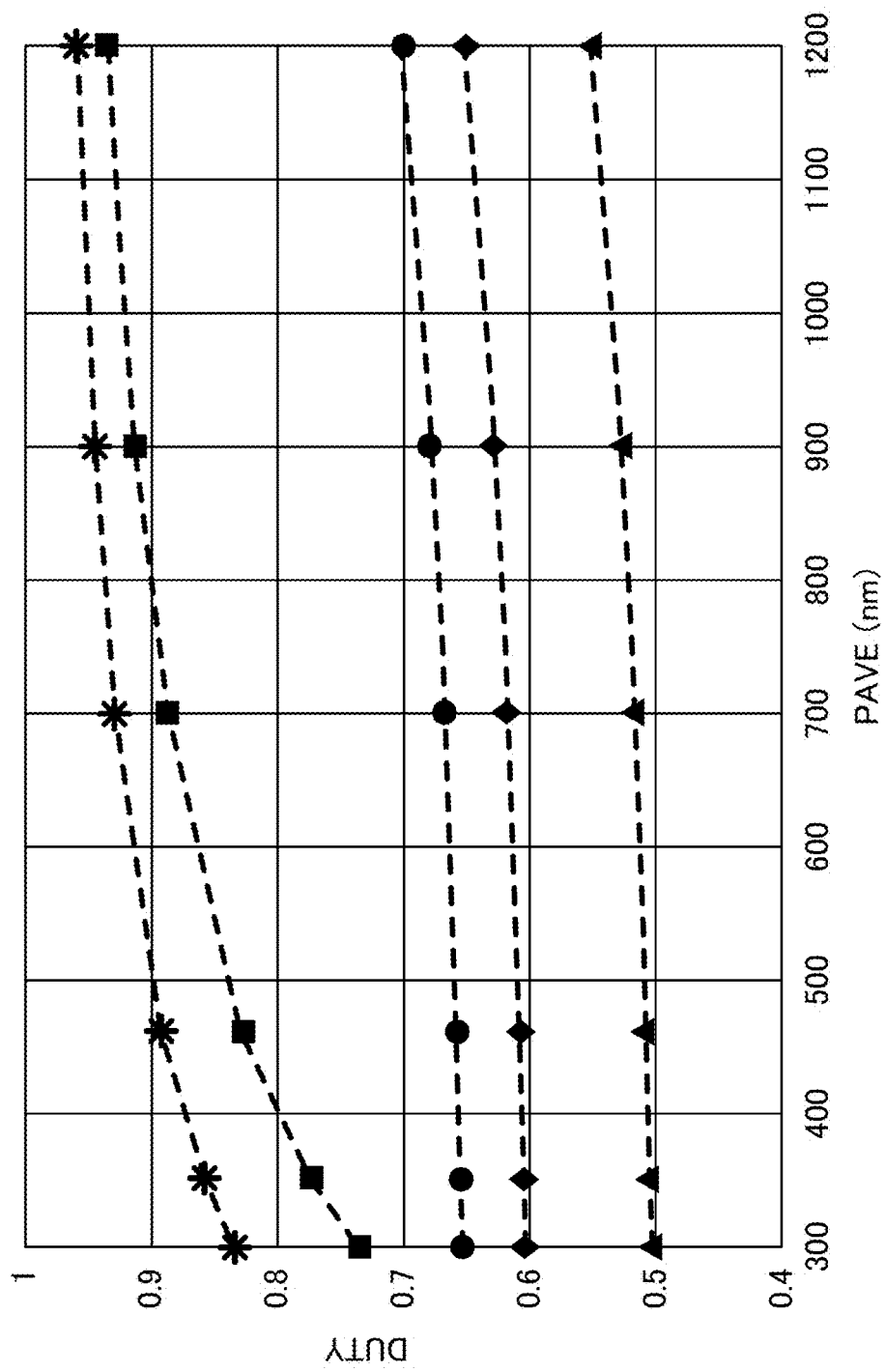
FIG. 17 is another graph illustrating the relationship between average interval Pave and Duty of the uneven structure A of the pattern wafer (1) for LEDs according to this Embodiment.

When the uneven structure A meets the range of the rotation shift angle Θ as described above, and further meets the relationship between the average interval Pave and the Duty as shown in FIG. 17, it is possible to manufacture the semiconductor layer high in internal quantum efficiency IQE with cracks suppressed, and therefore, the efficiency of light emission itself is increased. Further, at the same time, the light emitted efficiently is extracted to the outside of the LED by improved light extraction efficiency LEE, and therefore, the external quantum efficiency EQE is increased. In other words, it is possible to manufacture LED chips high in external quantum efficiency with low defect efficiency. Further, since the crack density of the semiconductor layer inside the LED chip is also reduced, life is increased.

FIG. 17 is a graph illustrating the relationship between the average interval Pave and the Duty of the uneven structure A of the pattern wafer (1) for LEDs according to this Embodiment. In FIG. 17, the horizontal axis represents the average interval Pave of the uneven structure A, and the vertical axis represents the Duty. Plots of black triangles (▲), black diamonds (♦) and black circles (●) are curves determined by increases in light extraction efficiency LEE, and represent cases where Z of the equation expressed by Duty≥$(3.47\times10^{-8})$Pave$^2$+Z described already is 0.5, 0.6 and 0.65, respectively. On the other hand, plots of stars (asterisks) and black squares (■) are curves determined from the viewpoints of the internal quantum efficiency IQE and crack, and in the plots, Y of the equation expressed by Duty≤1−(Y/Pave) described already is 50 nm and 80 nm, respectively. In other words, when the uneven structure A meets the range of 1−(Y/Pave)≥Duty≥$(3.47\times10^{-8})$ Pave$^2$+Z, it is possible to develop the effect of enabling semiconductor light emitting devices with high efficiency and long life to be manufactured with low defect efficiency as described above.

<Uneven Structure A>

The uneven structure A will be described next. The convex portion of the uneven structure A is formed of the corner portion with a radius of curvature of the top of the convex-portion exceeding "0". Herein, the corner portion with a radius of curvature exceeding "0" means that the top of the convex portion is formed of a curved surface. Examples thereof are a cone-shaped body with the front end rounded, lens-shaped body, dome-shaped body, cone-shaped body and shell-shaped body, and include the shapes as shown in FIG. 15.

Thus, when the top of the convex-portion is formed of the corner portion with a radius of curvature exceeding "0", it is possible to concurrently achieve improvements in internal quantum efficiency IQE and suppression of cracks. Further, in depositing a semiconductor layer on the uneven structure A, it is possible to grow the semiconductor layer preferentially from the bottom of the concave-portion of the uneven structure A. In other words, it is possible to suppress growth of the semiconductor layer from the top of the convex-portion of the uneven structure A. That is, it is possible to prepare initial conditions for adherence of the nucleus of the semiconductor layer to the concave portion of the uneven structure, growth and coalescence of growing semiconductor layers.

Herein, by the uneven structure A meeting the rotation shift angle Θ as described already, since it is possible to grow the semiconductor layer preferentially from the concave portion of the uneven structure A and effectively carry out coalescence of growing semiconductor layers in a dispersed manner, dislocations are reduced, and it is possible to suppress cracks. The effects are remarkable by meeting the relationship between the rotation shift angle Θ and the Duty descried using FIG. 8. Further, the effects are more remarkable by meeting the relationship between the Duty and the average interval Pave described using FIG. 9. Furthermore, it is possible to concurrently increase the light extraction efficiency LEE also by meeting the relationship between the average interval Pave and the Duty described using FIG. 16.

As described above, by the fact that the range of the rotation shift angle Θ is met and that the top of the convex-portion of the uneven structure A is formed of the corner portion with a radius of curvature exceeding "0", it is possible to effectively increase the internal quantum efficiency IQE and suppress cracks.

From the viewpoints of excellently developing the effects based on the above-mentioned principles and making both of improvements in internal quantum efficiency IQE and reductions in the crack excellent, in the convex portion of the uneven structure A, it is preferable that the diameter is decreased according to the direction from the bottom of the convex-portion to the top of the convex-portion. By this means, particularly, it is possible to reduce stress occurring from near the vertex portion of the convex portion of the uneven structure A toward the semiconductor layer. In other words, since it is possible to reduce the stress applied to the growing semiconductor layer from the uneven structure A, it is possible to decrease residual stress generated inside the semiconductor layer. By this means, the effect of suppressing cracks is increased in the semiconductor layer.

Further, it is preferable that the side face of the convex-portion connecting the top of the convex-portion and the bottom of the concave-portion has tilt angles of two or more stages, and that a radius of curvature of the point in which the tilt changes exceeds "0" to forma curved surface. In this case, it is possible to provide the stress applied to the semiconductor layer with a gradient to relax before the stable growth surface of the semiconductor layer comes to the top of the convex-portion, and therefore, the effect of crack suppression is more increased.

Furthermore, in the case where the uneven structure A is comprised of a plurality of independent convex portions and consecutive concave portion, the above-mentioned effects are further exerted, and therefore, such a case is preferable. In this case, as compared with the case where the uneven structure A is comprised of a plurality of independent concave portions and consecutive convex portion, it is possible to relatively increase the size of the bottom of the concave-portion. In other words, since it is possible to make the growth properties of the semiconductor layer from the bottom of the concave-portion as described already more excellent, it is possible to improve the internal quantum efficiency IQE and suppress cracks.

Further, by the fact that the flat surface exists in the bottom of the concave-portion, the effect of increasing the internal quantum efficiency IQE is further increased. This is because it is possible to keep the growth initial state excellent in the semiconductor layer growing from the bottom, and it is possible to more exert the effect of dislocation dispersion properties due to the uneven structure A.

The average interval Pave of the uneven structure (A) is capable of being selected from the viewpoint of balance between the internal quantum efficiency IQE and the light extraction efficiency LEE, and therefore, is not limited particularly, and for example, the above-mentioned effects were confirmed by manufacturing pattern wafers (1) for LEDs having uneven structures (A) with 200 nm, 300 nm, 500 nm, 700 nm, 1200 nm, 1500 nm, 2500 nm and 5000 nm, respectively. From the viewpoint of effectively increasing the external quantum efficiency EQE of the LED, it is necessary to increase the internal quantum efficiency IQE. From this viewpoint, it is preferable that the average interval Pave meets 50 nm≤Pave≤1500 nm. When the average interval Pave is 1500 nm or less, since the density of concave portions of the uneven structure A is increased, it is possible to increase the frequency of coalescence of growing semiconductor layers as described already. In other words, since it is possible to increase the frequency with which the dislocation inside the semiconductor layer changes its travelling direction, the dislocation reduction effect is increased, and by this means, the internal quantum efficiency IQE is effectively increased. On the other hand, when the average interval Pave is 50 nm or more, it is possible to ensure the size of the bottom of the concave-portion of the uneven structure A significantly contributing to the initial growth of the semiconductor layer. By this means, it is possible to keep nucleus growth of the semiconductor layer excellent in the bottom of the concave-portion of the uneven structure A. Accordingly, the crack suppression effect on the semiconductor layer is increased due to the fact that the arrangement axis A of the uneven structure A shifts within a predetermined range by the rotation shift angle Θ. Particularly, from the viewpoint of keeping nucleation properties and nucleus growth properties excellent in the semiconductor layer, the average interval Pave is preferably 100 nm or more, more preferably 200 nm or more, and most preferably 300 nm or more.

From the viewpoints of increasing the density of concave portions of the uneven structure A, increasing the frequency of coalescence of growing semiconductor layers, dispersing coalescence portions, effectively increasing the internal quantum efficiency IQE, and decreasing cracks, the average interval is preferably 1200 nm or less, more preferably 1000 nm or less, and most preferably 950 nm or less. In addition, by meeting the relationship between the average interval Pave and the Duty as described already with reference to FIGS. 9, 16 and 17, it is possible to develop the effect of crack suppression and the effect of improving the internal quantum efficiency IQE, and to further increase the light extraction efficiency LEE also.

<Average Interval (Pave)>

The average interval Pave is assumed to be measured in approximately the same portions as in samples used in obtaining <Average height (Have) of the uneven structure> described in the following <<Semiconductor light emitting device>>. Alternatively, it is possible to measure in the pattern wafer (1) for LEDs. The average interval Pave of the uneven structure A is determined according to the following definition, irrespective of the arrangement with n-fold symmetry of the uneven structure A. An interval P is defined as a distance $P_{A1B1}$ between the center of soma convex portion A1 and the center of a convex portion B1 most adjacent to the convex portion A1. The average interval (Pave) is calculated according to the following definition. (1) Arbitrary 10 convex portions A1, A2, . . . A10 are selected. (2) An interval $P_{AMBM}$ between a convex portion AM and a convex portion (BM) most adjacent to the convex portion AM ($1 \leq M \leq 10$) is measured. (3) For the convex portions A1 to A10, the interval P is measured as in (2). (4) An arithmetical mean value of intervals $P_{A1B1}$ to $P_{A10B10}$ is defined as the average interval (Pave). In addition, the above-mentioned definition is not dependent on n-fold symmetry of the uneven structure A. In other words, the definition is the same in the case where a plurality of convex portions is isolated by the consecutive concave portion, in the line-and-space structure where a plurality of bar-shaped bodies is isolated by a plurality of bar-shaped bodies, and in the arrangement in which the ortho-n-gonal arrangement is drawn in a one-axis direction or in two-axis directions. In addition, in the case where a plurality of concave portions is separated by the consecutive convex portion, it is possible to define the average interval (Pave) by replacing the center of the above-mentioned convex portion with the center of the opening part of the concave-portion to read. Further, in the case where the length of the bar-shaped body is extremely long and it is not possible to observe the end portion with a scanning electron microscope or atomic force microscope, or the case where the end portion does not exist, the center of the convex portion inside these observation images is used as the center of the above-mentioned convex portion.

<Average Diameter (ΦAve) of the Bottom Portion of the Convex Portion>

The average diameter Φave is assumed to be measured in approximately the same portions as in the samples used in obtaining <Average height (Have) of the uneven structure> described in the following <<Semiconductor light emitting device>>. Alternatively, the width is measured in the pattern wafer (1) for LEDs. The average diameter cave of the uneven structure A is determined according to the following definition, irrespective of the arrangement with n-fold symmetry of the uneven structure A. A width Φ of the bottom portion of the convex portion is defined as a distance $\Phi_{A1}$ when a distance XY between some point X in the circumference of the contour and another point Y in the circumference of the contour is maximum in the contour shape of the bottom portion of some convex portion A1. The average diameter (Φave) is calculated according to the following definition. (1) Arbitrary 10 convex portions A1, A2, . . . A10 are selected. (2) A width $\Phi_{AM}$ of the bottom portion of the convex portion is measured for the convex portion AM ($1 \leq M \leq 10$). (3) For the convex portions A1 to A10, the width Φ of the bottom portion of the convex portion is measured as in (2). (4) An arithmetical mean value of widths $\Phi_{A1}$ to $\Phi_{A10}$ of the bottom portions of the convex portions is defined as the average diameter (Φave). In addition, in the case where the aspect ratio of the contour shape of the bottom portion of the convex portion is 1.5 or more, the width Φ of the bottom portion of the convex portion is defined as the shortest distance between some point X and another point Y in the circumference of the contour shape of the bottom portion of the convex portion.

<Duty>

The duty is defined as a ratio (Φave/Pave) of the average diameter (Φave) to the average interval (Pave).

<Arrangement of the Uneven Structure A>

The pattern wafer (1) for LEDs according to this Embodiment is provided with the above-mentioned uneven structure A on a part or the whole of the surface of the pattern wafer (1) for LEDs. In addition, further detailed shape arrangement, manufacturing method and materials of the uneven structure A will be described in the following <<Semiconductor light emitting device>>. In other words, the entire surface of the pattern wafer (1) for LEDs may be covered with the uneven structure A as described above, or the uneven structure A may be provided on a part of the surface of the pattern wafer (1) for LEDs. In the following description, the uneven structure A is described as an uneven structure G, and an uneven structure that does not corresponds to the uneven structure A is described as an uneven structure B.

The pattern wafer (1) for LEDs has the uneven structure G in at least a part thereof. In other words, on the surface of the pattern wafer (1) for LEDs, the entire surface may be covered with the uneven structure G, or a part of the surface may be covered with the uneven structure G. Herein, the region that is not covered with the uneven structure G is called the "non-G region" Herein, the non-G region is comprised of the uneven structure B and/or a flat portion.

Also in the case where the non-G region is provided on a part of the surface of the pattern wafer (1) for LEDs, since the already-mentioned effects are developed in the region covered with the uneven structure G, it is possible to deposit the semiconductor layer high in internal quantum efficiency IQE with cracks suppressed. Further, by meeting the relationship between the average interval Pave and the Duty described with reference to FIGS. 16 and 17, it is possible to concurrently improve the light extraction efficiency LEE also.

(α) In using the average interval (Pave), it is preferable that the uneven structure G provided on the surface of the pattern wafer (1) for LEDs is provided at least inside a region having an area of 10Pave×10Pave because of exhibiting the above-mentioned effects. In other words, for example, in the pattern wafer (1) for LEDs, it is essential only that the uneven structure G is provided inside the region of 10Pave×10Pave. In other words, for example, in the case of observing the surface of the pattern wafer (1) for LEDs using a scanning electron microscope or atomic force microscope, it is essential only that the region having the area of 10Pave×10Pave is formed of the uneven structure G. Particularly, it is preferable that the total sum of the uneven structure G occupying inside the region having the area of 10Pave×10Pave meets the ratio or the size of the uneven structure G as described below. In other words, the inside of the range having the area of 10Pave×10Pave is comprised of the uneven structure G, and it is possible to provide a plurality of such ranges. Particularly, by meeting 20Pave× 20Pave or more, more preferably, 25Pave×25Pave or more, the effects of adherence of the nucleus of the semiconductor layer, nucleus growth and coalescence of growing semiconductor layers are more remarkable due to the uneven structure G, and therefore, such a range is preferable. Also in this case, it is preferable that the total sum of the uneven structure G meets the ratio or the size of the uneven structure G as described below. Further, in the case where the region having the area of 50Pave×50Pave, more preferably 75Pave×75Pave is comprised of the uneven structure G, adherence of the nucleus of the semiconductor layer, nucleus growth and coalescence of growing semiconductor layers are excellent also in the non-G region adjacent to the region covered with the uneven structure G, developed are the effects of suppressing cracks and improving the internal quantum efficiency IQE, and therefore, such a case is preferable. The effects are more exerted as the area increases to 100Pave×100Pave or more, 150Pave×150Pave or more, and 450Pave×450Pave or more. Also in these cases, it is preferable that the total sum of the uneven structure G meets the ratio or the size of the uneven structure G as described below.

(β) In the case of providing the non-G region in the region covered with the uneven structure G, it is preferable that the ratio of the non-G region is ⅕ or less relative to the uneven structure G. By this means, it is possible to exert the effects of the uneven structure G. From the viewpoint of more exerting the same effects, the ratio is more preferably 1/10 or less, more preferably 1/25 or less, and most preferably 1/50. In addition, by meeting 1/100 or less, it is possible to more improve the effect of suppressing cracks and improving the internal quantum efficiency IQE. Particularly, by meeting 1/500 or less, more preferably 1/1,000 or less, uniformity of emitted light output from inside the LED is more improved, and therefore, such a ratio is preferable. From the same viewpoint, the ratio is preferably 1/10,000 or less, preferably 1/100,000, and preferably 1/1,000,000 or less. In addition, the lower limit value is not limited particularly, and as the value is lower i.e. approaches zero, the effects of the uneven structure G are more remarkable, being preferable.

(γ) While being dependent on the outside shape and size of the LED chip, when the ratio of the uneven structure G relative to the surface of the pattern wafer (1) for LEDs is 0.002% or more, it is possible to exhibit the effects as described already in the uneven structure G, and therefore, such a ratio is preferable. Particularly, by providing the pattern wafer (1) for LEDs with the uneven structure G of 0.02% or more, more preferably 0.2% or more, dispersion properties of dislocations are enhanced inside the semiconductor layer, and therefore, uniformity of the internal quantum efficiency IQE is enhanced. Further, since dispersion properties of coalescence portions of growing semiconductor layers are enhanced, the effect of suppressing cracks is increased. Furthermore, by the pattern wafer (1) for LEDs including the uneven structure G of 2.3% or more, more preferably 10% or more, it is possible to further exert the above-mentioned effects. Still furthermore, in the case of 20% or more, enhanced is in-plane uniformity of the semiconductor layer deposited on the pattern wafer (1) for LEDS, the improvement degree of the internal quantum efficiency IQE is uniformed in the plane of the pattern wafer (1) for LEDs; and the yield of obtaining high-efficient LED chips is thereby enhanced. From the viewpoint of more exerting the effect, the uneven structure G is preferably included in a ratio of 30% or more, more preferably in a ratio of 40% or more, and most preferably in a ratio of 50% or more. Further, in the case of including the uneven structure G in a ratio of 60% or more, propagation properties of the effects of the uneven structure G to the non-G region are enhanced. In other words, the effects on adherence of the nucleus of the semiconductor layer, nucleus growth and coalescence of growing semiconductor layers due to the uneven structure G are propagated to the non-G region, and therefore, in the non-G region, the enhancement degree of the internal quantum efficiency IQE is increased, while the crack improvement effect is also increased. From the viewpoint of more exerting the effect, the uneven structure G is preferably included in a ratio of 70% or more, more preferably in a ratio of 80% or more, and most preferably in a ratio of 90% or more. In addition, in the case where the uneven structure G is included in a ratio of 98% or more i.e. the case where the surface of the pattern wafer (1) for LEDs is approximately filled with the uneven structure G, growth properties of the semiconductor layer are uniform in the plane of the pattern wafer (1) for LEDs, and promoted is uniformity of the enhancement degree of the internal quantum efficiency IQE. In other words, characteristic distribution curves are shaper in a plurality of LED chips manufactured with the epitaxial wafer for LEDs.

(δ) The uneven structure G included in the surface of the pattern wafer (1) for LEDs is preferably $0.0025 \times 10^{-6}$ m$^2$ or more. By meeting this range, increased is light emission output of the LED chip. This is capable of being judged from the probability of collision between the emitted light guided inside the LED chip and the uneven structure G, while being dependent on the size and outside shape of the LED chip. Further, in the case of meeting this range, initial growth properties are made excellent in the semiconductor layer deposited on the uneven structure G. In other words, it is possible to decrease velocities of nucleation and nucleus growth of the semiconductor layer by the uneven structure G, dislocations are thereby reduced, and the internal quantum efficiency IQE is increased. From the viewpoint of more exerting the above-mentioned effects, the uneven structure G included in the surface of the pattern wafer (1) for LEDs is preferably $0.01 \times 10^{-6}$ m$^2$ or more; more preferably $0.04 \times 10^{-6}$ m$^2$ or more, and most preferably $0.09 \times 10^{-6}$ m$^2$ or more. Further, by the uneven structure G being $0.9 \times 10^{-6}$ m$^2$ or more, since in-plane uniformity of the semiconductor layer deposited on the pattern wafer (1) for LEDs is enhanced, the rate at which cracks are suppressed is increased, and the yield of obtaining the semiconductor light emitting device is enhanced. From the viewpoint of more exerting the above-mentioned effects, the uneven structure G is more preferably $9 \times 10^{-6}$ m$^2$ or more, and most preferably $90 \times 10^{-6}$ m$^2$ or more. In addition, when the area is $900 \times 10^{-6}$ m$^2$ or more, and more preferably $1.8 \times 10^{-3}$ m$^2$ or more, propagation properties of the effects of the uneven structure G to the non-G region are enhanced. In other words, to the non-G region is propagated the effect of making appropriate adherence of the nucleus of the semiconductor layer, nucleus growth and coalescence of growing semiconductor layers due to the uneven structure G, and therefore, the enhancement degree of the internal quantum efficiency IQE and the reduction degree of cracks are increased also in the non-G region. Particularly, when the area is $3.6 \times 10^{-3}$ m$^2$ or more, and more preferably $7.5 \times 10^{-3}$ m$^2$ or more, even in the case of using the outer edge portion of the pattern wafer (1) for LEDs, it is possible to obtain excellent LEDs. When one or more uneven structures G meeting the size of the uneven structure G as described above are provided on the surface of the pattern wafer (1) for LEDs, it is possible to obtain the substrate for LEDs allowed to manufacture high-efficient LED chips with high yield. In addition, it is possible to provide a plurality of uneven structures G meeting the size of the uneven structure G as described above. In this case, at least one of the uneven structures G meets the above-mentioned size. Particularly, it is preferable that 50% or more of the number of uneven structures G meets the above-mentioned range of the size, and it is the most preferable that 100% meets the above-mentioned range of the size.

Figure 18A:
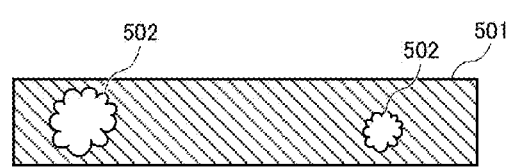
FIG. 18 contains explanatory diagrams illustrating the relationship between an uneven structure G and a non-G region in the pattern wafer (1) for LEDs according to this Embodiment.
Figure 18C:
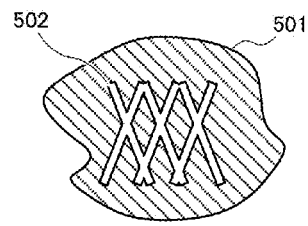
Figure 18B:
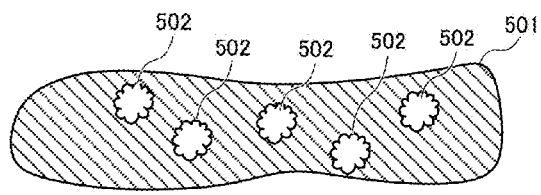
Figure 18D:
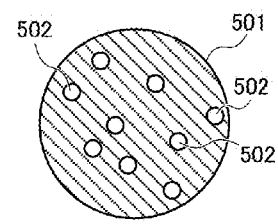

The arrangement relationship between the uneven structure G and the non-G region is not limited particularly, as long as the above-mentioned content is satisfied, and for example, there are the following relationships. As the arrangement relationship between the uneven structure G and the non-G region, in consideration of the uneven structure G and non-G region, it is possible to mention arrangements as described below. In addition, the uneven structure G is a set of uneven structures G meeting one or more of $\alpha$, $\beta$, $\gamma$ and $\delta$ as described above i.e. the uneven structure G region. Further, as shown in FIG. 18, in the case where non-G regions 502 are provided inside the uneven structure G region 501, as long as the non-G regions 502 meet the ratio described in above-mentioned $\beta$, the shape, regularity and irregularity are not limited. FIG. 18 contains explanatory diagrams illustrating the relationship between the uneven structure G and the non-G region in the pattern wafer (1) for LEDs according to this Embodiment. In FIGS. 18A and 18B, a plurality of non-G regions 502 with indefinite contours is arranged inside the uneven structure G region 501. In FIG. 18C, the non-G region 502 in the shape of a lattice is provided inside the uneven structure G region 501. Further, in FIG. 18D, a plurality of substantially circular non-G regions 502 is formed inside the uneven structure G region 501.

The contour shape made by the uneven structure G region 501 is not particularly limited. In other words, the interface shape between the uneven structure G region 501 and the non-G region 502 is not limited. Therefore, for example, as the interface shape between the uneven structure G region 501 and the non-G region 502, there are n-gon (n≥3), non-n-gon (n≤3), the shape of a lattice, the shape of a line and the like. The n-gon may be a regular n-gon or non-regular n-gon.

FIG. 19 contains schematic diagrams illustrating contour shapes formed by the uneven structure G region in the pattern wafer (1) for LEDs according to this Embodiment. For example, when a tetragon is represented, there are a regular tetragon (square), rectangle, parallelogram, trapezoid, and shapes in which one or more sets of opposite sides of these tetragons are not parallel. Further, in the n-gon (n≥3), the case where n is "4" or more includes the shapes as shown in FIGS. 19A to 19D. FIG. 19A shows a tetragon, FIG. 19B shows a hexagon, FIG. 19C shows an octagon, and FIG. 19D shows a dodecagon. The non-n-gon is the n-gon (n≥3) as described above including a structure including a corner portion with a radius of curvature exceeding "0", e.g. circle, ellipse, shape in which the corner of the above-mentioned n-gon as described above is rounded (shape in which a radius of curvature of the corner of the above-mentioned n-gon exceeds "0"), or rounded corner (portion with a radius of curvature exceeding "0"). Therefore, for example, the contour shapes include shapes exemplified in FIGS. 19E to 19H. In addition, the contour shapes of the non-G region are capable of adopting the shapes described as the contour shapes of a set of uneven structures G as described above.

Figure 19A:
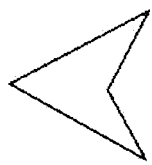
FIG. 19 contains schematic diagrams illustrating contour shapes formed by the uneven structure G region in the pattern wafer (1) for LEDs according to this Embodiment.
Figure 19B:
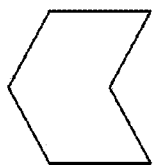
Figure 19C:
Figure 19D:
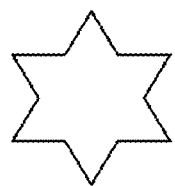
Figure 19E:
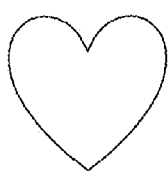
Figure 19F:
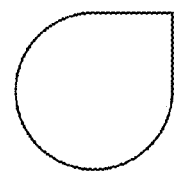
Figure 19G:
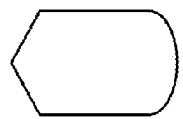
Figure 19H:
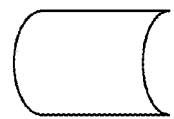
Figure 20A:
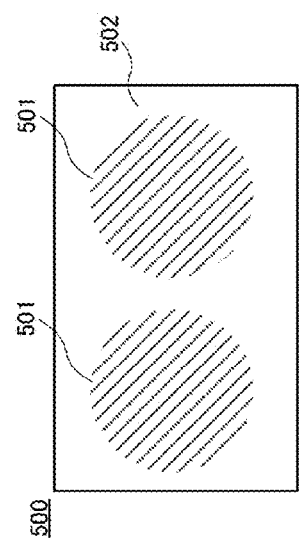
FIG. 20 contains plan schematic diagrams illustrating states obtained by observing, from a surface, the pattern wafer (1) for LEDs according to this Embodiment.
Figure 20C:
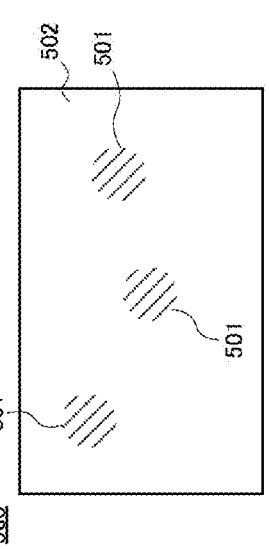
Figure 20E:
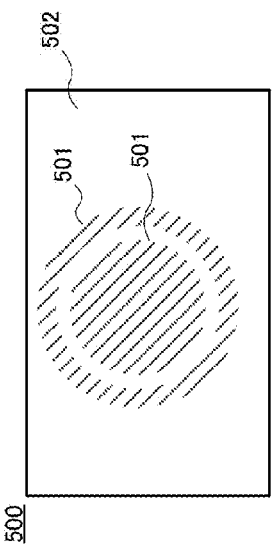
Figure 20B:
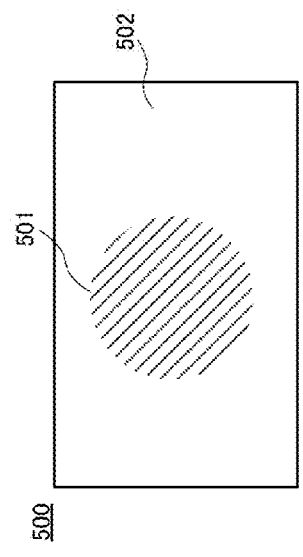
Figure 20D:
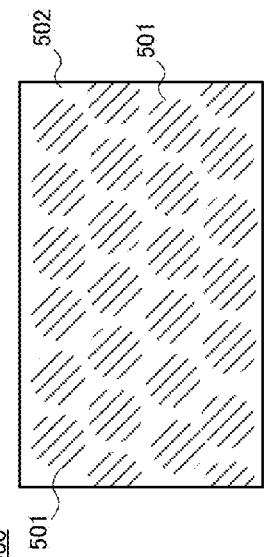
Figure 20F:
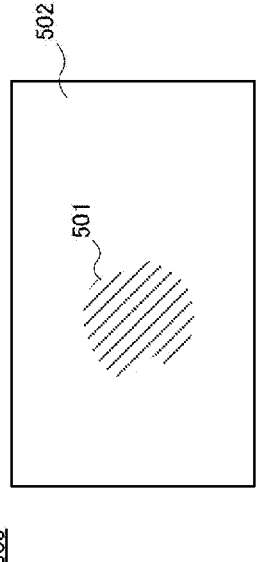

First, there is a state in which the uneven structure G region 501 is enclosed or sandwiched with/between the non-G region(s) 502. FIG. 20 contains plan schematic diagrams illustrating states obtained by observing, from the surface, the pattern wafer (1) for LEDs according to this Embodiment. FIGS. 20A to 20F show states in which the uneven structure G region 501 is enclosed with the non-G region 502. As shown in FIG. 20A, the uneven structure G region 501 is provided on the surface of the pattern wafer (1) 500 for LEDs, and the outer region may be comprised of the non-G region 502. It is preferable that the uneven structure G region 501 meets the above-mentioned ratio. Further, it is preferable that the uneven structure G region 501 meets the size as described already. In FIG. 20B or FIG. 20C, a plurality of uneven structure G regions 501 is arranged on the surface of the pattern wafer (1) 500 for LEDs while being mutually spaced, and regions between the uneven structure G regions 501 and outside the uneven structure G region 501 may be filled with the non-G region 502. In this case, it is preferable that the above-mentioned ratio is met relative to the total area of the uneven structure G. Further, it is preferable that at least one uneven structure G meets the size as described already, and it is more preferable that all uneven structures G meet the size as described already. Furthermore, when a plurality of uneven structures G is provided, the uneven structure G regions 501 may be arranged regularly as shown in FIG. 20C, or may be arranged irregularly as shown in FIG. 20D. As the regular arrangement, there are a tetragonal arrangement, hexagonal arrangement, arrangements in which these arrangements are drawn in a one-axis direction, arrangements in which these arrangements are drawn in two-axis directions, and the like. Further, the contour shape of the uneven structure G region 501 is shown in the shape of a circle in FIGS. 20A to 20D, and as shown in FIG. 20E, it is also possible to adopt an indefinite shape. For example, as the outside shape of the uneven structure G region 501, it is possible to mention shapes such as an n-gon (n≥3), corner-rounded n-gon (n≥3), circle, ellipse, the shape of a line, the shape of a star, the shape of a lattice, and the like. Furthermore, as shown in FIG. 20F, it is possible to adopt the shape in which the uneven structure G region 501 is enclosed with the non-G region 502, the outer region is enclosed with the uneven structure G region 501, and further, the outer region is enclosed with the non-G region 502. In addition, in FIGS. 20A to 20D, the uneven structure G region is described in the shape of a circle, and the contour shapes made by the uneven structure G region 501 may adopt the shapes as described with reference to FIG. 19.

FIG. 21 contains plan schematic diagrams illustrating states obtained by observing, from the surface, the pattern wafer (1) for LEDs according to this Embodiment. FIG. 21 shows the case where the uneven structure G region 501 is sandwiched between non-G regions 502. As shown in FIGS. 21A and 21B, the uneven structure G region 501 is provided on the surface of the pattern wafer (1) 500 for LEDs, and the outer regions may be comprised of the non-G regions 502. It is preferable that the uneven structure G meets the above-mentioned ratio. Further, it is preferable that the uneven structure G meets the size as described already. As shown in FIG. 21C, a plurality of uneven structure G regions 501 is arranged on the surface of the pattern wafer (1) 500 for LEDs while being mutually spaced, and regions between the uneven structure G regions 501 and outside the uneven structure G region 501 may be filled with the non-G regions 502. In this case, it is preferable that the above-mentioned ratio is met relative to the total area of the uneven structure G. Further, it is preferable that at least one uneven structure G meets the size as described already, and it is more preferable that all uneven structures G meet the size as described already. Furthermore, as shown in FIG. 21D, it is possible to make an arrangement in which the uneven structure G regions 501 include the non-G regions 502 and are continuously provided. In this case, it is preferable that the above-mentioned ratio is met relative to the area of the uneven structure G. Still furthermore, it is preferable that the uneven structure G meets the size as described already. Moreover, the interface shape between the uneven structure G region 501 and the non-G region 502 may be linear, or may be bowed as shown in FIG. 21E. As the shape of the uneven structure G region 501, there are the shape of a line, the shape of a lattice, the shape of a mesh and the like. Further, as shown in FIG. 21F, it is possible to adopt the shape in which the uneven structure G region 501 is sandwiched between the non-G regions 502, the outer regions are sandwiched between the uneven structure G regions 501, and further, the outer regions are sandwiched between the non-G regions 502. In addition, in FIG. 21, the contour line made by the uneven structure G region 501 is described as the shape of a line or substantially in the shape of a line, and it is also possible to adopt the shapes as described with reference to FIG. 19.

In the case where a plurality of uneven structure G regions 501 as described above is provided, the interface shape between each of the uneven structure G regions 501 and the non-G region 502 may be a single, or may differ for each uneven structure G region 501.

Further, in the arrangement relationship between the uneven structure G region 501 and the non-G region 502 as described above, both of the cases may coexist i.e. the case where the uneven structure G region 501 is enclosed with the non-G region 502 and the case where the uneven structure G region 501 is sandwiched between the non-G regions 502 may coexist.

Furthermore, as shown in FIGS. 20F and 21F, when the non-G region. 502 is provided outside the first uneven structure G region 501 (G1), the second uneven structure G region 501 (G2) is provided outside the region 502, and the non-G region 502 is further provided outside the region 501, the second uneven structure G region 501 (G2) may be discontiguous.

The non-G region may be comprised of the uneven structure B, may be comprised of a flat portion, or may be comprised of the uneven structure B and flat portion.

Further, in the above-mentioned description, the outside shapes of the pattern wafer (1) 500 for LEDs are all described as rectangles, but the outside shape of the pattern wafer (1) 500 for LEDs is not limited thereto, and it is possible to adopt the shape of a circle, the shape including an arc having the curvature of a circle and straight line, n-gon (n≥3), non-n-gon (n≥3), the shape of a lattice, the shape of a line, and the like. The n-gon may be a regular n-gon or non-regular n-gon. For example, when a tetragon is represented, there are a regular tetragon (square), rectangle, parallelogram, trapezoid, and shapes in which one or more sets of opposite sides of these tetragons are not parallel. Further, in the n-gon (n≥3), the case where n is "4" or more includes the shapes as shown in FIGS. 19A to 19D. FIG. 19A shows a tetragon, FIG. 19B shows a hexagon, FIG. 19C shows an octagon, and FIG. 19D shows a dodecagon. The non-n-gon is the n-gon (n≥3) as described above including a structure without a corner, e.g. circle, ellipse, shape in which the corner of the above-mentioned n-gon as described above is rounded (shape in which a radius of curvature of the corner of the above-mentioned n-gon exceeds "0"), or rounded corner (corner portion with a radius of curvature exceeding "0"). Therefore, for example, the shapes include shapes exemplified in FIGS. 19F to 19H. Among the shapes, it is preferable to adopt a line symmetrical shape.

<<Epitaxial Wafer of LEDs>>

Described next are epitaxial wafers for LEDs using the pattern wafer (1) for LEDs according to this Embodiment.

Figure 22:
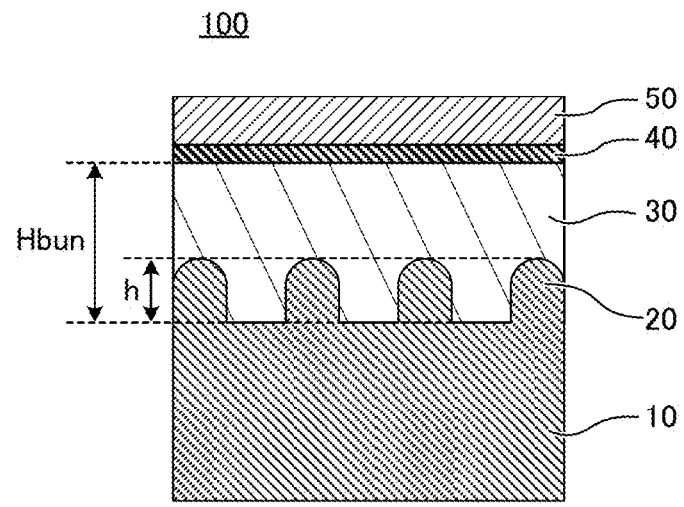
FIG. 22 is a cross-sectional schematic diagram showing an example of an epitaxial wafer for LEDs according to this Embodiment.

FIG. 22 is a cross-sectional schematic diagram showing an example of the epitaxial wafer for LEDs according to this Embodiment. As shown in FIG. 22, in the epitaxial wafer 100 for LEDs, the pattern wafer (1) 10 for LEDs is provided on its surface with an uneven structure 20. The uneven structure 20 is the uneven structure A as described above. In other words, the arrangement axis A of the uneven structure 20 and the crystal axis of the pattern wafer (1) 10 for LEDs meet the relationship of the rotation shift angle Θ as described above, and the convex portion of the uneven structure 20 is formed of the corner portion with a radius of curvature exceeding "0". A first semiconductor layer 30, light emitting semiconductor layer 40 and second semiconductor layer 50 that are semiconductor layers are sequentially layered on the surface including the uneven structure 20 of the pattern wafer (1) 10 for LEDs. Herein, in the LED chip manufactured from the epitaxial wafer 100 for LEDs, emitted light generated in the light emitting semiconductor layer 40 is extracted from the second semiconductor layer 50 side or the pattern wafer (1) 10 for LEDs. Further, the first semiconductor layer 30 and the second semiconductor layer 50 are comprised of mutually different semiconductor crystals. Herein, it is preferable that the first semiconductor layer 30 flattens the uneven structure 20. In this case, since the uneven structure 20 is the uneven structure A, dislocations of the first semiconductor layer 30 are reduced, and cracks are suppressed. When the first semiconductor layer 30 is provided so as to flatten the uneven structure 20, since it is possible to reflect performance of the first semiconductor layer 30 as a semiconductor layer in the light emitting semiconductor layer 40 and the second semiconductor layer 50, the internal quantum efficiency IQE is increased, and cracks are suppressed. In other words, from the principles described in <<Pattern wafer (1) for LEDs>>, dislocations of the first semiconductor layer 30 are reduced, while it is possible to suppress cracks, it is possible to reflect the performance of the first semiconductor layer 30 having excellent crystallinity in the light emitting semiconductor layer 40 and the second semiconductor layer 50 sequentially, and also after depositing the second semiconductor layer 50, it is possible to reduce cracks of the semiconductor layer.

Figure 23:
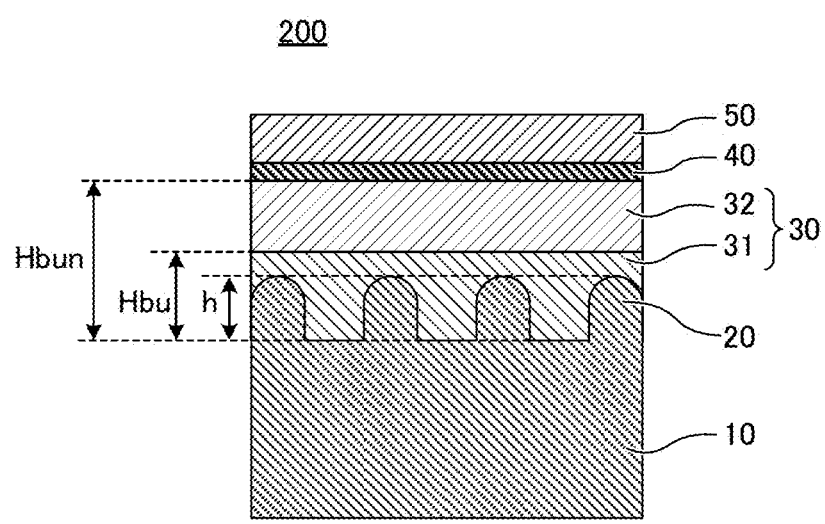
FIG. 23 is a cross-sectional schematic diagram showing another example of the epitaxial wafer for LEDs according to this Embodiment.

Further, as shown in FIG. 23, the first semiconductor layer 30 may be comprised of an undoped first semiconductor layer 31 and doped first semiconductor layer 32. FIG. 23 is a cross-sectional schematic diagram showing another example of the epitaxial wafer for LEDs according to this Embodiment. In this case, as shown in FIG. 23, in the epitaxial wafer 200 for LEDs, when the pattern wafer (1) 10 for LEDs, undoped first semiconductor layer 31 and doped first semiconductor layer 32 are layered in this order, in addition to improvements in internal quantum efficiency IQE and the effect of reducing cracks, it is possible to shorten the manufacturing time of the epitaxial wafer 200 for LEDs. Herein, when the undoped first semiconductor layer 31 is provided so as to flatten the uneven structure 20, since it is possible to reflect performance of the undoped first semiconductor layer 31 as a semiconductor in the doped first semiconductor layer 32, the light emitting semiconductor layer 40 and the second semiconductor layer 50, the internal quantum efficiency IQE is increased, and cracks are reduced. In other words, from the principles described in <<Pattern wafer (1) for LEDs>>, it is possible to enhance crystallinity of the undoped first semiconductor layer 31, it is possible to reflect the performance of the undoped first semiconductor layer 31 having excellent crystallinity in the doped first semiconductor layer 32, the light emitting semiconductor layer 40 and the second semiconductor layer 50 sequentially, and also after depositing the second semiconductor layer 50, it is possible to reduce cracks of the semiconductor layer.

Figure 24:
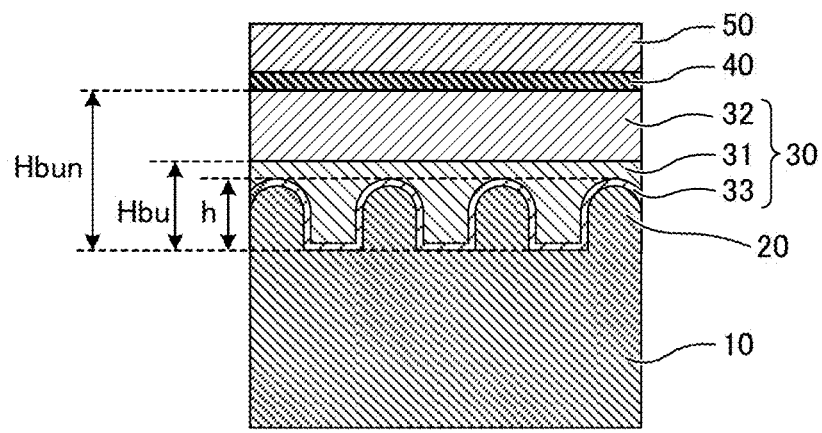
FIG. 24 is a cross-sectional schematic diagram showing still another example of the epitaxial wafer for LEDs according to this Embodiment.

Further, as shown in FIG. 24, the first semiconductor layer 30 preferably includes a buffer layer 33. FIG. 24 is a cross-sectional schematic diagram showing still another example of the epitaxial wafer for LEDs according to this Embodiment. As shown in FIG. 24, in the epitaxial wafer 300 for LEDs, the buffer layer 33 is provided on the uneven structure 20, subsequently the undoped first semiconductor layer 31 and doped first semiconductor layer 32 are sequentially layered, nucleation and nucleus growth, which is the initial conditions of crystal growth of the first semiconductor layer 30, is thereby made excellent, the performance of the first semiconductor layer 30 as a semiconductor is enhanced, and the degree of improvements in internal quantum efficiency IQE is thereby increased. Herein, the buffer layer 33 may be disposed to flatten the uneven structure 20, but since a growth rate of the buffer layer 33 is slow, from the viewpoint of shortening the manufacturing time of the epitaxial wafer 300 for LEDs, it is preferable that the uneven structure 20 is flattened with the undoped first semiconductor layer 31 provided on the buffer layer 33. When the undoped first semiconductor layer 31 is provided so as to flatten the uneven structure 20, since it is possible to reflect the performance of the undoped first semiconductor layer 31 as a semiconductor in the doped first semiconductor layer 32, the light emitting semiconductor-layer 40 and the second semiconductor layer 50, the internal quantum efficiency IQE is increased, and cracks are suppressed. In addition, in FIG. 24, the buffer layer 33 is disposed to cover the surface of the uneven structure 20, and may also be provided partially on the surface of the uneven structure 20. Particularly, it is possible to provide the buffer layer 33 preferentially in the bottom of the concave-portion of the uneven structure 20. In this case, since it is possible to carry out adherence of the nucleus preferentially on the bottom of the concave-portion of the uneven structure 20, subsequent nucleus growth properties are made excellent, and it is possible to keep coalescence of growing semiconductor layers excellent. In addition, in the case of using the pattern wafer (1) 10 for LEDs according to this Embodiment, since it is possible to increase the internal quantum efficiency IQE excellently, the buffer layer 33 may not be provided.

The epitaxial wafers 100, 200 and 300 for LEDs respectively shown in FIGS. 22 to 44 are of an example of applying the semiconductor layer of double-hetero structure, and the layered structure of the first semiconductor layer 30, light emitting semiconductor layer 40 and second semiconductor layer 50 is not limited thereto.

Figure 25:
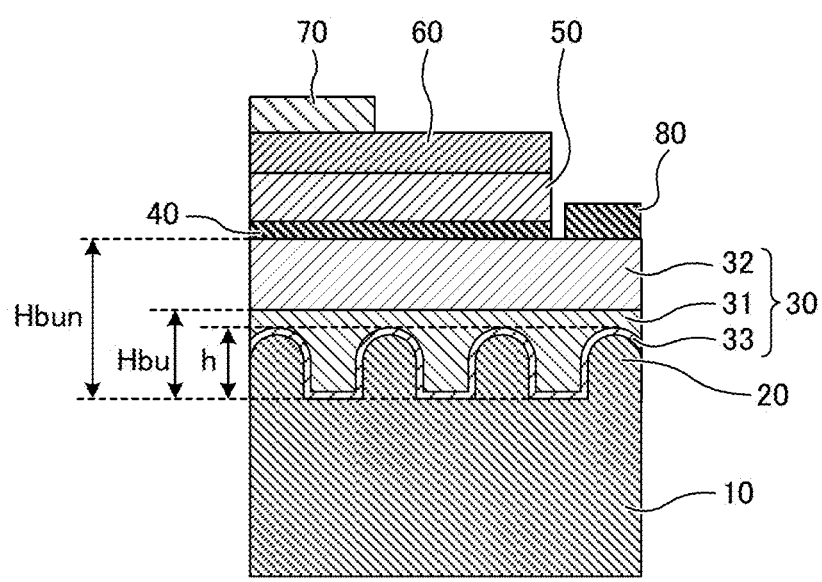
FIG. 25 is a cross-sectional schematic diagram illustrating an LED chip according to this Embodiment.

FIG. 25 is a cross-sectional schematic diagram illustrating an example of an LED chip manufactured from the epitaxial wafers for LEDs as shown in FIGS. 22 to 24. As shown in FIG. 25, in the LED chip 400, it is possible to provide a transparent conductive layer 60 on the second semiconductor layer 50, an anode electrode 70 on the surface of the transparent conductive layer 60, and a cathode electrode 80 on the surface of the first semiconductor layer 30. The arrangement of the transparent conductive layer 60, anode electrode 70 and cathode electrode 80 can be optimized as appropriate corresponding to the LED chip, is thereby not limited, and generally, is provided as exemplified in FIG. 25.

Figure 26:
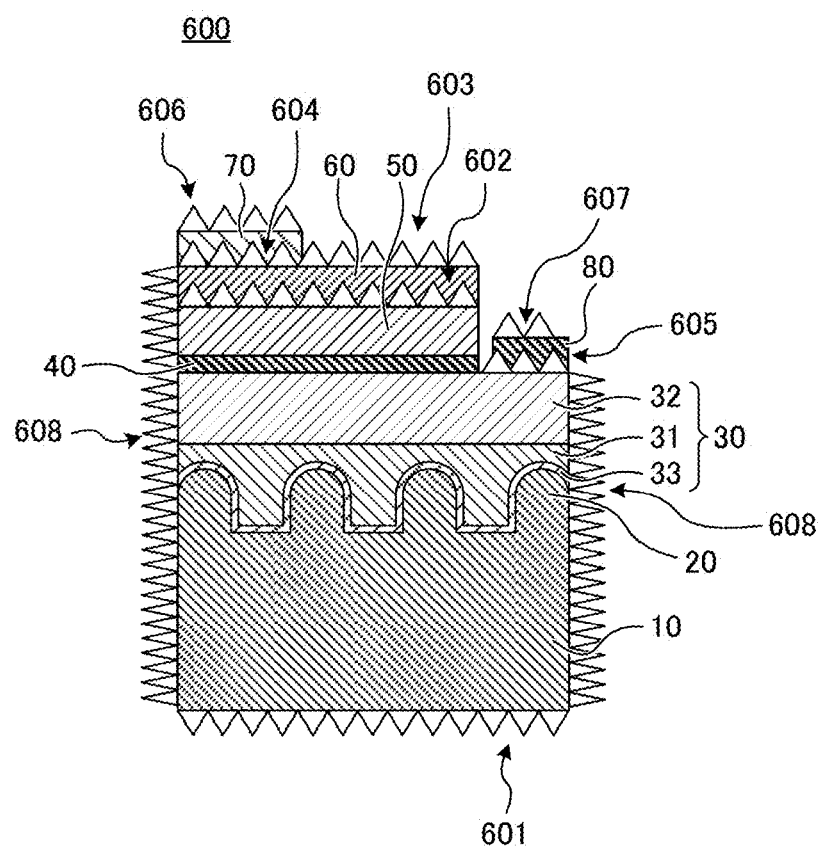
FIG. 26 is a cross-sectional schematic diagram showing another example of the LED chip according to this Embodiment.

Further, in the LED chip 400 as shown in FIG. 25, the uneven structure 20 is provided between the pattern wafer (1) 10 for LEDs and the first semiconductor layer 30, and as shown in FIG. 26, it is also possible to further provide other uneven structures. FIG. 26 is a cross-sectional schematic diagram showing another example of the LED chip according to this Embodiment. As shown in FIG. 26, as the uneven structures to separately provide, there are the following structures.

Uneven structure 601 provided on the surface on the side opposite to the light emitting semiconductor layer 40 of the pattern wafer (1) 10 for LEDs Uneven structure 602 provided between the second semiconductor layer 50 and the transparent conductive layer 60

Uneven structure 603 provided on the surface of the transparent conductive layer 60

Uneven structure 604 provided between the transparent conductive layer 60 and the anode electrode 70

Uneven structure 605 provided between the first semiconductor layer 30 and the cathode electrode 80

Uneven structure 606 provided on the surface of the anode electrode 70

Uneven structure 607 provided on the surface of the cathode electrode 80

Uneven structure 608 provided on side surfaces of the first semiconductor layer 30, light emitting semiconductor layer 40, second semiconductor layer 50 and pattern wafer (1) 10 for LEDs By further providing at least one uneven structure among the uneven structures 601 to 608 as well as the uneven structure 20, it is possible to develop effects corresponding to each of the uneven structure 601 to 608 as described below.

By providing the uneven structure 601, the light extraction efficiency LEE is increased. In the LED chip according to this Embodiment, the internal quantum efficiency IQE is increased. In other words, it is possible to produce photos effectively inside the LED chip. Therefore, in the LED chip according to this Embodiment, it is preferable to provide the uneven structure 601. In addition, instead of providing the uneven structure 601, also by removing the pattern wafer (1) for LEDs, for example, by the laser liftoff method or the like, the light extraction efficiency LEE is significantly increased similarly.

By providing the uneven structure 602, since it is possible to increase the light extraction efficiency LEE, the external quantum efficiency EQE is significantly improved. Further, since diffusion properties of electrons in the transparent conductive layer 60 are enhanced, it is possible to increase the size of the LED chip.

By providing the uneven structure 603, it is possible to increase the light extraction efficiency LEE. In the epitaxial wafer for LEDs according to this Embodiment, the internal quantum efficiency IQE is increased. In other words, it is possible to produce photos effectively inside the LED chip. Therefore, in the LED chip according to this Embodiment, it is preferable to provide the uneven structure 603.

By providing the uneven structure 604, since it is possible to increase the contact area between the transparent conductive layer 60 and the anode electrode 70, it is possible to suppress peeling of the anode electrode 70. Further, since it is possible to reduce ohmic resistance and to enhance ohmic contact, it is possible to improve the electron injection efficiency EIE, and it is possible to increase the external quantum efficiency EQE. In the epitaxial wafer for LEDs according to this Embodiment, the internal quantum efficiency IQE is increased. In other words, it is possible to produce photos effectively inside the LED chip. Therefore, in the LED chip according to this Embodiment, it is preferable to provide the uneven structure 604.

By providing the uneven structure 605, since the contact area between the first semiconductor layer 30 and the cathode electrode 80 is increased, it is possible to suppress peeling of the cathode electrode 80.

By providing the uneven structure 606, since the fix strength of wiring connected to the anode electrode 70 is increased, it is possible to suppress peeling.

By providing the uneven structure 607, since the fix strength of wiring provided on the surface of the cathode electrode 80 is increased, it is possible to suppress peeling.

By providing the uneven structure 608, since it is possible to increase emission light quantities output from the side surfaces of the first semiconductor layer 30, light emitting semiconductor layer 40, second semiconductor layer 50 and pattern wafer (1) 10 for LEDs, it is possible to reduce the rate of emitted light which attenuates and disappears, in the waveguide mode. Therefore, the light extraction efficiency LEE is increased, and it is possible to enhance the external quantum efficiency EQE.

As described above, by using the pattern wafer (1) 10 for LEDs according to this Embodiment, it is possible to increase the internal quantum efficiency IQE of the epitaxial wafer for LEDs, and to reduce the warpage of the epitaxial wafer for LEDs. Therefore, also in the case of using large wafers for LEDs with 4-inches or 6-inches, it is possible to manufacture epitaxial wafers for LEDs with little warpage, and to manufacture LED chips with low percent defective. Particularly, by using the pattern wafer (1) for LEDs with a diameter of 6 inches or more, it is possible to thin the thickness of the pattern wafer (1) for LEDs. Therefore, since environmental suitability is enhanced and heat controllability is improved in depositing the semiconductor layer, crystallinity is more enhanced in the semiconductor layer of the epitaxial wafer for LEDs. Further, as described already, since it is possible to thin the thickness of the semiconductor layer, it is possible to effectively suppress the warpage of the epitaxial wafer for LEDs. Moreover, by further providing at least one uneven structure of the uneven structures 601 to 608 as described above, it is possible to develop the effects due to the uneven structures 601 to 608. Particularly, from the viewpoint of also improving the light extraction efficiency LEE and achieving high external quantum efficiency, it is preferable to provide at least one of the uneven structure 601 and uneven structure 603. Further, from the viewpoint of also increasing the electron injection efficiency EIE, it is preferable to provide the uneven structure 604.

Moreover, the pattern wafer (1) 10 for LEDs may be removed from a layered product in which an electrode is formed on the surface on which the second semiconductor layer 50 is exposed in the epitaxial wafers 100, 200, 300 for LEDs exemplified in FIG. 22 to 24 as described above and a support substrate is disposed on the surface with the electrode exposed. It is possible to attain removal of the pattern wafer (1) 10 for LEDs by liftoff using laser light, and complete dissolution or partial dissolution of the pattern wafer (1) 10 for LEDs. Particularly, in the case of adopting a silicon wafer as the pattern wafer (1) 10 for LEDs, removal by dissolution is preferable, from the viewpoint of accuracy of the surface (hereinafter, referred to as uneven structure surface) with the uneven structure provided thereon. By thus removing the pattern wafer (1) 10 for LEDs, it is possible to further increase the light extraction efficiency LEE more in a state in which improvements in internal quantum efficiency IQE are maintained. This is because differences in the refractive index are large between the pattern wafer (1) 10 for LEDs and the first semiconductor layer 30, the light emitting semiconductor layer 40 and the second semiconductor layer 50. By removing the pattern wafer 1 (10) for LEDs, it is possible to assemble an LED epitaxial wafer with the first semiconductor layer 30 as a light output surface.

Described next are terms used in the description of elements constituting the epitaxial wafers 100, 200 and 300 for LEDs. In addition, the following description is also applied to LED chips 400 and 500.

<Average Height (Have) of the Uneven Structure>

The height of the uneven structure 20 is given as an arithmetical mean value of distances between the top of the convex-portion and the bottom of the concave-portion of the uneven structure. First, a region of a square of 50 μm×50 μm parallel to the main surface of the pattern wafer (1) 10 for LEDs is made on the uneven structure 20 surface of the pattern wafer (1) 10 for LEDs. In addition, in the case of an epitaxial wafer for LEDs with a semiconductor layer deposited on the pattern wafer (1) 10 for LEDs, the semiconductor layer is removed, and observed is the uneven structure surface of the pattern wafer (1) 10 for LEDs. Next, the region of a square of 50 μm×50 μm is divided into 25 regions each of a square of 10 μm×10 μm so as not to overlap mutually. Next, 5 regions are selected arbitrarily from among 25 regions each of a square of 10 μm×10 μm existing. Herein, it is assumed that the selected regions each of a square of 10 μm×10 μm are respectively a region A, region B, region C, region D and region E. Subsequently, the region A is observed with a higher magnification, and is enlarged so that at least 100 convex portions are sharply observed. Next, 10 convex portions are selected arbitrarily from the observed convex portions, and a height h of each of the convex portions is obtained. Herein, it is possible to judge the height h of the convex portion by observation with Tilt reflected in scanning electron microscope observation or atomic force microscope observation. The arithmetical mean height of 10 convex portions measured in the region A is defined as ha.

The same operation as the region A is performed on the region B, region C, region D and region E to obtain hb, hc, hd and he, respectively. The average height (Have) of the uneven structure 20 is given as (ha+hb+hc+hd+he)/5. In addition, the above-mentioned description is the description in the case where the uneven structure 20 is comprised of a plurality of independent convex portions, and in the case where the uneven structure 20 is comprised of a plurality of concave portions, the height h of the uneven structure 20 is defined by replacing the convex portion as described above with the concave portion to read. Further, in the case of the epitaxial wafer for LEDs, it is assumed that the term related to the thickness of the semiconductor layer as described below is first calculated, the semiconductor layer is then removed, and that the average height (Have) of the uneven structure 20 is obtained. In other words, it is assumed that the information related to the thickness of the semiconductor layer as described below and the average height (Have) of the uneven structure 20 as described above are measured in approximately the same portions in the same sample. Further, the average interval Pave of the uneven structure 20 and the average diameter (average diameter) Φave of the bottom portion of the convex portion of the uneven structure 20 are obtained in the same measurement portions in the same sample as the sample used in obtaining the average height (Have) of the uneven structure.

<Distance Hbun>

A distance Hbun is defined as a distance between the surface on the light emitting semiconductor layer 40 side of the pattern wafer (1) 10 for LEDs and the surface on the light emitting semiconductor layer 40 side of the first semiconductor layer 30. Herein, the surface on the light emitting semiconductor layer 40 side of the pattern wafer (1) 10 for LEDs is defined as an average bottom of the concave-portion position of the uneven structure 20. Further, the surface on the light emitting semiconductor layer 40 side of the first semiconductor layer 30 is defined as an average surface. The average is arithmetical mean, and the number of average points is determined to "10". In other words, the distance Hbun is an average thickness of the first semiconductor layer 30 with the average bottom of the concave-portion position of the uneven structure 20 as a reference. In addition, the above-mentioned arithmetical mean is calculated by observing the cross section of the epitaxial wafer for LEDs. As the observation method, it is possible to adopt transmission electron microscope observation or scanning electron microscope observation. Further, the observation range is assumed to be a range in which the number of 5 or more and 20 or less of convex portions (or concave portions) is capable of being observed sharply in the observation.

<Distance Hbu>

A distance Hbu is defined as a distance between the surface on the light emitting semiconductor layer 40 side of the pattern wafer (1) 10 for LEDs and the surface on the light emitting semiconductor layer 40 side of the undoped first semiconductor layer 31. Herein, the surface on the light emitting semiconductor layer. 40 side of the pattern wafer (1) 10 for LEDs is defined as an average bottom of the concave-portion position of the uneven structure 20. Further, the surface on light emitting semiconductor layer 40 side of the undoped first semiconductor layer 31 is defined as an average surface. The average is arithmetical mean, and the number of average points is determined to "10". In other words, the distance Hbu is an average thickness of the undoped first semiconductor layer 31 with the average bottom of the concave-portion position of the uneven structure 20 as a reference. In addition, the above-mentioned arithmetical mean is calculated by observing the cross section of the epitaxial wafer for LEDs. As the observation method, it is possible to adopt-transmission electron microscope observation or scanning electron microscope observation. Further, the observation range is assumed to be a range in which the number of 5 or more and 20 or less of convex portions (or concave portions) is capable of being observed sharply in the observation.

Next, each of the elements constituting the epitaxial wafer 100 (including 200, 300 and LED chips 400, 600, the same in the following description) will be described in detail.

<The Ratio (Hbun/Have) of the Distance Hbun to the Average Height (Have)>

The ratio (Hbun/Have) of the distance Hbun to the average height (Have) meets 2≤Hbun/Have≤300.

The ratio (Hbun/Have) means the ratio between the average height (Have) of the uneven structure 20 and the average thickness Hbun of the first semiconductor layer 30, and as the ratio (Hbun/Have) increases, the average thickness Hbun of the first semiconductor layer 30 increases. In the case where the ratio (Hbun/Have) is 2 or more, it is possible to develop the effect of improving the internal quantum efficiency IQE due to the uneven structure 20, and therefore, such a case is preferable. When the ratio (Hbun/Have) is 2 or more, the degree of flattening the uneven structure A due to the first semiconductor layer 30 is enhanced with cracks suppressed. By this means, it is possible to effectively enhance deposition accuracy of the light emitting semiconductor layer 40 and second semiconductor layer 50 provided on the first semiconductor layer 30. Therefore, it is possible to reflect performance as a semiconductor of the first semiconductor layer 30 with few dislocations in the light emitting semiconductor layer 40 and second semiconductor layer 50 in a state in which cracks are suppressed, and it is possible to obtain epitaxial wafers for LEDs with cracks suppressed and high internal quantum efficiency IQE. Further, when the ratio (Hbun/Have) is 3.5 or more, since flatness of the surface of the first semiconductor layer 30 is excellent, and in association therewith, film thickness uniformity is enhanced in the light emitting semiconductor layer 40, and in-plane uniformity of emission wavelengths is enhanced. From the viewpoints of more exerting these effects, the ratio is preferably is 5.5 or more, and more preferably 8.0 or more. Particularly, when the ratio (Hbun/Have) is 10 or more, it is possible to more decrease the effect of the top of the convex-portion of the uneven structure 20 on the surface of the first semiconductor layer 30, and it is thereby possible to achieve more excellent flatness of the surface on the light emitting semiconductor layer 40 of the first semiconductor layer 30. In other words, increased is the effect of enhancing the internal quantum efficiency IQE. From the same viewpoint, the (Hbun/Have) is preferably 12 or more, more preferably 14 or more, and most preferably 16 or more. Further, from the viewpoints of increasing the probability of collision between dislocations in between the average top of the convex-portion position of the uneven structure 20 of the first semiconductor layer 30 and the light emitting semiconductor layer 40 and more increasing the internal quantum efficiency IQE, the ratio (Hbun/Have) is more preferably 20 or more, and most preferably 25 or more. On the other hand, when the ratio (Hbun/Have) is 300 or less, it is possible to suppress the warpage of the epitaxial wafer 100 for LEDs, and it is thereby possible to enhance chipping efficiency.

An indicator concerning the warpage after depositing the semiconductor layer is generally known as BOW. The BOW is inversely proportional to the thickness of the pattern wafer (1) 10 for LEDs, while being proportional to the size (diameter) of the pattern wafer (1) 10 for LEDs and the square of the thickness of the semiconductor layer. As the BOW increases, it is harder to manufacture LED chips, and in consideration of photolithography process in manufacturing LED chips, it is preferable that the BOW is 1.5 or less. Herein, in consideration of decreasing the BOW, it is preferable to increase the thickness of the pattern wafer (1) 10 for LEDs, thin the thickness of the semiconductor layer, and decrease the size of the pattern wafer (1) 10 for LEDs. However, in the case of thickening the thickness of the pattern wafer (1) 10 for LEDs, since the manufacturing cost of LED chips is significantly increased and the thermal behavior of the pattern wafer (1) 10 for LEDs changes in depositing the semiconductor layer, deposition properties of the semiconductor layer may degrade, and the internal quantum efficiency IQE may decrease. Further, decreasing the size of the pattern wafer (1) 10 for LEDs is a factor of significantly degrading the yield of LED chips. In other words, when it is possible to suppress the BOW by thinning the thickness of the semiconductor layer, it is understand that the effect of thinning is significant. Herein, it has been already described that deposition properties of the semiconductor layer are enhanced by using the uneven structure A. In other words, by using the pattern wafer (1) 10 for LEDs provided with the uneven structure A, even when the thickness of the semiconductor layer is thinned, it is possible to effectively decrease dislocations, and to suppress cracks, and it is thereby possible to reduce the warpage. From this viewpoint, the ratio (Hbun/Have) is preferably 200 or less, and more preferably 150 or less. Further, from the viewpoints of shortening the deposition time of the semiconductor layer, decreasing a use amount of the semiconductor layer, and achieving environmental supportability, the ratio (Hbun/Have) is more preferably 100 or less, and most preferably 50 or less. From the foregoing, by the ratio (Hbun/Have) meeting the predetermined range, it is possible to deposit the semiconductor layer high in internal quantum efficiency IQE with cracks suppressed, and to suppress the warpage of the pattern wafer (1) 10 for LEDs with the semiconductor layer deposited, and it is thereby possible to produce high-efficient LED chips with high efficiency.

<The Ratio (Hbu/Have) of the Distance Hbu to the Average Height (Have)>

The ratio (Hbu/Have) of the distance Hbu to the average height (Have) meets 1.55≤Hbu/Have≤200.

The ratio (Hbu/Have) means the ratio between the average height (Have) of the uneven structure 20 and the average thickness Hbu of the undoped first semiconductor layer 31, and as the ratio (Hbu/Have) increases, the average thickness Hbu of the undoped first semiconductor layer 31 increases. When the ratio (Hbu/Have) is 1.5 or more, the degree of flattening the uneven structure A due to the undoped first semiconductor layer 31 is enhanced with cracks suppressed. By this means, it is possible to effectively enhance deposition accuracy of the doped first semiconductor layer 32, light emitting semiconductor layer 40 and second semiconductor layer 50 provided on the undoped first semiconductor layer 31. Therefore, it is possible to reflect crystallinity of the undoped first semiconductor layer 31 with few dislocations in the doped first semiconductor layer 32, light emitting semiconductor layer 40 and second semiconductor layer 50 in a state in which cracks are suppressed, and it is possible to obtain epitaxial wafers for LEDs with cracks suppressed and high internal quantum efficiency IQE while shortening the production time. Further, when the ratio (Hbu/Have) is 2.5 or more, flattening of the uneven structure 20 is more excellent due to the undoped first semiconductor layer 31, in association therewith film thickness uniformity is enhanced in the light emitting semiconductor layer 40, and in-plane uniformity of emission wavelengths is enhanced. From the viewpoints of more exerting these effects, the ratio is most preferably is 3.5 or more. Particularly, when the ratio (Hbu/Aave) is 4 or more, it is possible to more decrease the effect of the top of the convex-portion of the uneven structure 20 on the surface of the undoped first semiconductor layer 31, and it is thereby possible to achieve more excellent flatness of the surface on the light emitting semiconductor layer 40 of the doped first semiconductor layer 32. In other words, the effects are increased to enhance the internal quantum efficiency IQE and suppress cracks. From the same viewpoints, the (Hbu/Aave) is preferably 5 or more, more preferably 8 or more, and most preferably 10 or more. Further, from the viewpoints of increasing the probability of collision between dislocations inside the undoped first semiconductor layer 31 and more increasing the internal quantum efficiency IQE, the ratio (Hbu/Have) is more preferably 12 or more, and most preferably 15 or more. On the other hand, when the ratio (Hbu/Have) is 200 or less, it is possible to suppress the warpage of the epitaxial wafer 100 for LEDs. This is capable being determined from the viewpoint of BOW as described already. From the same viewpoint, the ratio (Hbu/Have) is preferably 100 or less, and more preferably 50 or less. Further, from the viewpoints of decreasing a use amount of the semiconductor layer, shortening the deposition time, and achieving environmental supportability, the ratio (Hbu/Have) is most preferably 30 or less. From the foregoing, by the ratio (Hbu/Have) meeting the predetermined range, it is possible to deposit the semiconductor layer high in internal quantum efficiency IQE with cracks suppressed, and to suppress the warpage of the pattern wafer (1) 10 for LEDs with the semiconductor layer deposited, and it is thereby possible to produce high-efficient LED chips with high efficiency.

<Uneven Structure 20>

As described in <<Pattern wafer (1) for LEDs>>, the uneven structure 20 of the epitaxial wafer 100 for LEDs according to this Embodiment i.e. the uneven structure A is not limited particularly, as long as the uneven structure is the uneven structure substantially having regularity with n-fold symmetry, and the top of the convex-portion is comprised of the corner portion with a radius of curvature exceeding "0". Among the structures, the crack suppression effect and the effect of improving the internal quantum efficiency IQE are increased, by meeting the relationship between the Duty and the rotation shift angle Φ described with reference to FIG. 8, and the relationship between the average interval Pave and the Duty described with reference to FIG. 9. Further, by meeting the relationship between the average interval Pave and the Duty described with reference to FIG. 16, it is possible to concurrently increase the light extraction efficiency LEE. Further preferable aspects of the uneven structure 20 will be described below.

The uneven structure 20 is capable of adopting the dot-shaped structure comprised of a plurality of independent convex portions and consecutive concave portion, hole-shaped structure comprised of a plurality of independent concave portions and consecutive convex portion, or hybrid structure including both a plurality of independent concave portions and a plurality of independent concave portions. Among the structures, the dot-shaped structure is the most preferable. As the reason, the dot-shaped structure makes adherence of the nucleus of the semiconductor layer and its growth excellent as described already, and increases the effect of suppressing cracks and the effect of improving the internal quantum efficiency IQE. In the dot-shaped structure, hole-shaped structure, or hybrid structure, as the contour shape of the bottom portion of one convex portion or the opening shape of one concave portion, it is possible to adopt the shape of a circle, the shape of an ellipse, the shape of a bar, the shape of 卍, n-gon (n≥3), n-gon (n≥3) having a corner portion with a radius of curvature of the corner portion exceeding "0" and the like. Among the shapes, when the portion is in the shape of a circle, the shape of an ellipse, the shape of a bar, or triangle having a corner portion with a radius of curvature of the corner portion exceeding "0", it is possible to reduce stress applied to the growing semiconductor layer by the uneven structure 20, and therefore, the effect of suppressing cracks is increased. Particularly, the shape of a circle is the most preferable. In addition, the shape of a circle is substantial circular shape, and slight distortion is considered.

As described already, when the average interval Pave of the uneven structure 20 meets 50 nm≤Pave≤1500 nm, it is possible to deposit the semiconductor layer with cracks suppressed and high internal quantum efficiency IQE. Further, in the case of viewing as the epitaxial wafer for LEDs, by the average interval Pave being 1500 nm or less, it is possible to suitably develop the effect of the ratio (Hbun/Have) or ratio (Hbu/Have) as described above. This is because the semiconductor layer viewed from the uneven structure 20 is increased, and the effect of the ratio (Hbun/Have) or ratio (Hbu/Have) based on the principles already described is not disturbed by the uneven structure 20. Accordingly, it is possible to concurrently improve the internal quantum efficiency IQE and cracks. From the same principles, the average interval is preferably 1200 nm or less, more preferably 1000 nm or less, and most preferably 950 nm or less. In addition, the lower limit value is as described already.

<Shape of the Convex Portion>

As the shape of the convex portions constituting the uneven structure 20, as described already, from the viewpoints of adherence of the nucleus of the semiconductor layer, growth and coalescence of growing semiconductor layers, such a structure is preferable that the diameter of the bottom of the convex-portion is larger than the diameter of the top of the convex-portion, it is more preferable that the side face of the convex-portion connecting the top of the convex-portion and the bottom of the concave-portion has tilt angles of two or more stages, and it is the most preferable that the radius of curvature of the point in which the tilt changes exceeds "0" to form a curved surface. Particularly, in the case of considering as the epitaxial wafer for LEDs, the aspect ratio that is a parameter representing the shape of the convex portion i.e. the ratio (Have/(ave) preferably ranges from 0.1 to 5.0. First, when the ratio is 0.1 or more, the volume of the convex portion increases from the viewpoint of photons generated from the light emitting semiconductor layer, and it is thereby possible to increase the light extraction efficiency LEE. Particularly, in the case where the aspect ratio is 0.3 or more, it is possible to increase the number of modes of light diffraction and strengthen scattering properties with respect to the emitted light, and therefore, such a case is preferable. From the same viewpoints, the aspect ratio is more preferably 0.5 or more, and most preferably 0.6 or more. On the other hand, when the aspect ratio is 5.0 or less, it is possible to smooth the tilt angle of the convex-portion side surface. By this means, it is considered that it is possible to suppress particles occurring in obtaining LED chips. From the viewpoints of the same effects, deposition properties of the semiconductor layer, and suppression of cracks, the aspect ratio is preferably 3.0 or less, more preferably 2.0 or less, and most preferably 1.1 or less.

<Bottom Portion of the Concave Portion>

As described above, from the viewpoints of adherence of the nucleus of the semiconductor layer, growth and coalescence of growing semiconductor layers, it is preferable that the bottom of the concave-portion has a flat surface. Particularly, in the case of viewing as the epitaxial wafer for LEDs, it is preferable that the flat surface (hereinafter, referred to "flat surface B") that the bottom of the concave-portion of the uneven structure 20 has is parallel to a surface (hereinafter, referred to as "parallel stable growth surface") almost parallel to a stable growth surface of the first semiconductor layer 30. In this case, growth properties of the first semiconductor layer 30 are made excellent in the vicinity of the concave portion of the uneven structure 20, a decrease in dislocations is increased based on coalescence of growing semiconductor layers, it is thereby possible to effectively disperse dislocations inside the first semiconductor layer 30 corresponding to the uneven structure 20, and the internal quantum efficiency IQE is thereby enhanced. The stable growth surface refers to a surface with the lowest growth rate in the material to grow. Generally, it is known that the stable growth surface appears as a facet surface during the growth. For example, in the case of gallium nitride-based compound semiconductor, a plane parallel to the A-axis typified by the M-surface is the stable growth surface. The stable growth surface of the GaN-based semiconductor layer is the M-surface (1-100), (01-10), (-1010) of a hexagonal crystal, and is one of surfaces parallel to the A-axis. In addition, depending on the growth conditions, there is the case where the stable growth surface is another plane including the A-axis that is a plane except the M-surface of the GaN-based semiconductor.

<Buffer Layer>

As materials of the buffer layer 33, it is possible to adopt AlGaN structure, AlN structure, AlInN structure, InGaN/GaN superlattice structure, InGaN/GaN layered structure, AlInGaN/InGaN/GaN layered structure and the like. As deposition of the buffer layer, it is possible to set the deposition temperature at a range of 350° C. to 600° C. By this means, also for deposition from the narrow bottom of the concave-portion, it is possible to enhance uniformity. By using these buffer layers 33, it is possible to effectively decrease the difference in the lattice constant between the wafer for LEDs and the first semiconductor layer 30, and it is possible to improve deposition properties and crystallinity of the first semiconductor layer 30. Further, the film thickness of the buffer layer 33 is desirably ⅕ or less the average height (Have) of the uneven structure 20. This is because of suppressing adherence of the nucleus to the side surface portion of the convex portion with respect to re-diffusion and recrystallization of the buffer layer 33 in the RAMP process. From this viewpoint, the film thickness of the buffer layer 33 is more preferably 1/10 or less, and most preferably 1/20 or less with respect to the average height (Have) of the uneven structure 20. Further, it is preferable that the buffer layer 33 is deposited by MOCVD (Metal Organic Chemical Vapor Deposition) method or sputtering method. Particularly, it is more preferable to adopt the sputtering method, in terms of the fact that uniformity of the buffer layer 33 is enhanced.

<First Semiconductor Layer>

Materials of the first semiconductor layer 30 are capable of being selected from the undoped first semiconductor layer 31 and doped first semiconductor layer 32 as described below. The film thickness (Hbun) of the first semiconductor layer 30 is preferably 800 nm or more, from the viewpoints of suppressing cracks to flatten the uneven structure 20, reducing dislocations inside the first semiconductor layer 30, reflecting performance as a semiconductor in the light emitting semiconductor layer 40 and the second semiconductor layer 50 and thereby increasing the internal quantum efficiency IQE. Particularly, from the viewpoint of more exerting the effect of reducing dislocations due to the uneven structure 20, the thickness is preferably 1,500 nm or more, and more preferably 2,000 nm or more. Further, from the viewpoint of reflecting the performance as a semiconductor in the light emitting semiconductor layer 40 and the second semiconductor layer 50 and effectively increasing the internal quantum efficiency IQE, the thickness is preferably 2,500 nm or more, more preferably 3,000 nm or more, and most preferably 4,000 nm or more. On the other hand, from the viewpoint of the warpage and environmental supportability, the upper limit value is preferably 100,000 nm or less, more preferably 7,500 nm or less, and most preferably 6,500 nm or less.

The doped first semiconductor layer 32 is not limited particularly, as long as the layer is capable of being used as an n-type semiconductor layer suitable for uses of LED. For example, it is possible to apply materials obtained by doping various elements as appropriate to element semiconductors such as silicon and germanium, and chemical semiconductors of group III-V, group II-VI, group VI-VI and the like. Particularly, an n-type GaN layer is desirable. As the n-type GaN layer, for example it is possible to supply a silane gas containing $NH_3$ at $3 \times 10^{-2}$ to $4.2 \times 10^{-2}$ mol/min. trimethyl gallium (TMGa) at $0.8 \times 10^{-4}$ to $1.8 \times 10^{-4}$ mol/min. and an n-type dopant typified by Si at $5.8 \times 10^{-9}$ to $6.9 \times 10^{-9}$ mol/min. to form. From the viewpoint of election injection properties to the light emitting semiconductor layer 40, the film thickness of the doped first semiconductor layer 32 is preferably 800 nm or more, more preferably 1, 500 nm or more, and most preferably 2,000 nm or more. On the other hand, from the viewpoint of reducing the warpage, the upper limit value is preferably 5,000 nm or less. From the viewpoints of reducing a use amount of the doped first semiconductor layer 32 and shortening the manufacturing time of the epitaxial wafers 200, 300 for LEDs, the upper limit value is preferably 4,300 nm or less, more preferably 4,000 nm or less, and most preferably 3,500 nm or less.

The undoped first semiconductor layer 31 is capable of being selected as appropriate within a scope of not interfering with performance as the n-type semiconductor layer of the doped first semiconductor layer 32. For example, it is possible to apply element semiconductors such as silicon and germanium, and chemical semiconductors of group III-V, group II-VI, group VI-VI and the like. Particularly, an undoped nitride layer is preferable. As the undoped nitride layer, for example, it is possible to supply $NH_3$ and TMGa onto the buffer layer or wafer for LEDs at a grow temperature of 900° C. to 1500° C. to deposit. From the viewpoint of flattening the uneven structure 20, the film thickness (Hbu) of the undoped first semiconductor layer 31 is preferably 1,000 nm or more. Particularly, from the viewpoint of effectively reducing dislocations inside the undoped first semiconductor layer 31, the thickness is preferably 1,500 nm or more, more preferably 2,000 nm or more, and most preferably 2,500 nm or more. On the other hand, from the viewpoint of reducing the warpage of the epitaxial wafer 100 for LEDs, the upper limit value is preferably 6,000 nm or less. Particularly, from the viewpoint of shortening the manufacturing time of the epitaxial wafers 200, 300 for LEDs, the value is preferably 5,000 nm or less, more preferably 4,000 nm or less, and most preferably 3,500 nm or less.

In addition, when at least the undoped first semiconductor layer 31 and doped first semiconductor layer 32 are sequentially layered on the uneven structure 20 of the pattern wafer (1) 10 for LEDs, it is also possible to further provide another undoped semiconductor layer (2) on the doped first semiconductor layer 32, and provide the light emitting semiconductor layer 40 thereon. In this case, as another undoped semiconductor layer (2), it is possible to use the materials as described in the undoped first semiconductor layer 31 as described above. From the viewpoint of light emitting properties of the epitaxial wafers 200, 300 for LEDs, a film thickness of the undoped semiconductor layer (2) is preferably 10 nm or more, more preferably 100 nm or more, and most preferably 200 nm or more. On the other hand, from the viewpoint of recombination of hole and electron inside the light emitting semiconductor layer 40, the upper limit value is preferably 500 nm or less, more preferably 400 nm or less, and most preferably 350 nm or less.

<Light Emitting Semiconductor Layer>

The light emitting semiconductor layer 40 is not limited particularly, as long as the layer has light emission characteristics as a semiconductor light emitting device (for example, LED). For example, as the light emitting semiconductor layer 40, it is possible to apply semiconductor layers of AsP, GaP, ALGaAs, InGaN, GaN, AlGaN, ZnSe, AlHaInP, ZnO and the like. Further, the light emitting semiconductor layer may be doped with various elements as appropriate corresponding to characteristics. The light emitting semiconductor layer 40 is an active layer of single or multiple quantum well structure. For example, at a growth temperature of 600° C. to 850° C., by using nitrogen as a carrier and gas and supplying $NH_3$, TMGa and trimethyl indium (TMIn), it is possible to grow an active layer made of INGaN/GaN in a thickness of 100 Å to 1250 Å. Further, in the case of multiple quantum well structure, concerning InGaN forming a single layer, it is also possible to change the In element concentration. Further, it is possible to provide an electron block layer between the light emitting semiconductor layer 40 and the second semiconductor layer 50. For example, the electron block layer is comprised of p-AlGaN.

<Materials of the Second Semiconductor Layer>

Materials of the second semiconductor layer 50 are not limited particularly, as long as it is possible to use the materials as the p-type semiconductor layer suitable for uses of LED. For example, it is possible to apply materials obtained by doping various elements as appropriate to element semiconductors such as silicon and germanium, and chemical semiconductors of group III-V, and group II-VI, group VI-VI and the like. For example, in the case of the P-type GaN layer, by raising the growth temperature to 900° C. or more, and supplying TMGa and $CP_2Mg$, it is possible to deposit in a thickness of several hundreds to thousands of angstroms (Å).

<Materials of the Pattern Wafer (1) for LEDs>

Materials of the pattern wafer (1) for LEDs are not limited particularly, as long as the materials are used as the pattern wafer (1) for LEDs it is possible to use substrates of sapphire, silicon carbide (SiC), silicon nitride ($Si_3N_4$), gallium nitride (GaN), copper-tungsten (W—Cu), silicon, zinc oxide, magnesium oxide, manganese oxide, zirconium oxide, manganese oxide-galvanized iron, magnesium aluminum oxide, zirconium boride, gallium oxide, indium oxide, lithium gallium oxide, lithium aluminum oxide, neodymium gallium oxide, lanthanum strontium aluminum tantalum oxide, strontium titanium oxide, titanium oxide, hafnium, tungsten, molybdenum, GaP, GaAs and the like. Among the substrates, from the viewpoint of lattice matching with the first semiconductor layer 30, it is preferable to apply sapphire, GaN, GaP, GaAs, silicon carbide, silicon, spinel (for example, insulation substrates typified by $MgAl_2O_4$) and the like. Further, the materials may be used alone, or a wafer of hetero structure may be used in which another wafer is provided on the wafer for LEDs. For example, as the wafer for LEDs, it is possible to use a sapphire wafer with the C-surface (0001) as the main surface. In this case, the M-surface that is a stable growth surface of the GaN-based semiconductor layer is a surface parallel to the sapphire wafer A-surface (11-20), (1-210), (-2110).

The size of the pattern wafer 1 (10) for LEDs is not limited particular, and examples thereof are 2-inches, 4-inches, 6-inches and 8-inches. These wafers may be the shape of a disk or shape with orientation flat. Herein, from the viewpoints of averaging the effects of the uneven structure A in terms of deposition phenomenon of the semiconductor layer, and manufacturing epitaxial wafers for LEDs of high quality, and the viewpoint of excellently exerting the effect of reducing the warpage of the epitaxial wafer for LEDs among the above-mentioned effects, 4-inches or 6-inches is preferable.

Further, the pattern wafer (1) 10 for LEDs may be removed in a step after layering at least the first semiconductor layer 30. By removing the pattern wafer (1) 10 for LEDs, since the effect of disturbing the waveguide mode is increased, the light extraction efficiency LEE is significantly enhanced. In this case, the output surface of emitted light of the LED is preferably the first semiconductor layer 30 side viewed from the light emitting semiconductor layer 40.

<Transparent Conductive Layer>

The transparent conductive layer 60 is provided on the second semiconductor layer 50. For example, the transparent conductive layer 60 is formed of a transmission oxide film made of at least one or more of ITO ($In_2O_3$—$SnO_2$), ZnO, RuOx, TiOx, IrOx, SnOx, AZnO (ZnO—$Al_2O_3$), IZnO ($In_2O_3$—ZnO), GZO (ZnO—$Ga_2O_3$) and InxOy. Further, it is possible to form the transparent conductive layer 60 by a vacuum deposition method, sputtering method or CVD (Chemical Vapor Deposition) method.

<Anode Electrode>

The anode electrode 70 is provided on the transparent conductive layer 60. As the anode electrode 70, it is possible to use the transmission oxide film or transparent metal as described in the aforementioned transparent conductive layer 60. In the case of adopting the transmission oxide film, it is also possible to cause the interface between the anode electrode 70 and the transparent conductive layer 60 to disappear. Further, among the transparent metals are alloys or multi-layer film containing at least one kind selected from the group consisting of Ni, Co, Fe, Ti, Cu, Rh, Au, Ru, W, Zr, Mo, Ta, Pt, oxides thereof, and nitrides thereof. Particularly, in terms of adhesion force, preferable is a multi-layer film with Au layered on Ni. Further, for example, it is possible to adopt a multi-layer film with Au layered on Ni and RhO layered on the Au.

<Cathode Electrode>

The cathode electrode 80 is formed on an exposed surface of the first semiconductor layer 30 obtained by etching the first semiconductor layer 30 from the second semiconductor layer 50 side. For example, it is possible to use metals such as gold, silver, titanium and chromium and metal oxides. Particularly, a metal multi-layer film is preferable.

<Reflecting Film>

It is possible to form a reflecting film on the surface opposite to the uneven structure 20 of the pattern wafer (1) 10 for LEDs. By forming the reflecting film, it is possible to more increase the light extraction efficiency LEE due to the uneven structure 20. The reflectance of the reflecting film is preferably 80% or more, more preferably 90% or more and most preferably 91% or more at a light emission wavelength of the light emitting semiconductor layer 40. For example, it is possible to use a dielectric multi-layer film. The dielectric multi-layer film is a multi-layer film obtained by alternately layering two or more dielectric materials with different refractive indexes. For example, it is possible to layer $ZrO_2$, AlN, $Nb_2O_3$ or $Ta_2O_3$ and $SiO_2$ with the number of pairs of 3 to 8.

<Manufacturing Method of the Uneven Structure 20>

Described above are the epitaxial wafer 100 for LEDs and pattern wafer (1) 10 for LEDs according to this Embodiment. Manufacturing methods of the uneven structure 20 will be described next.

It is possible to manufacture by a transfer method, photolithography method, thermal lithography method, electron beam lithography method, interference exposure method, lithography method using nanoparticles as a mask, lithography method using a self-organizing structure as a mask and the like. Particularly, from the viewpoints of processing accuracy and processing speed of the uneven structure 20 of the pattern wafer (1) 10 for LEDs, it is preferable to adopt the transfer method.

The transfer method in the present description is defined as a method including a step of transferring a fine pattern of a mold provided with the fine pattern on its surface to a wafer for LEDs (pattern wafer (1) 10 for LEDs without the uneven structure 20 being prepared yet). In other words, the method is a method including at least a step of bonding the fine pattern of the mold to the wafer for LEDs via a transfer material, and a step of peeling off the mold. By adopting this method, it is possible to meet the rotation shift angle Θ as described above with ease. More specifically, it is possible to classify the transfer method into two. First, there is the case of using a transfer material that is transfer-added to the wafer for LEDs as a permanent material. In this case, the wafer for LEDs is different from materials constituting the uneven structure 20. Further, it is a feature that the uneven structure 20 remains as the permanent material and is used as the epitaxial wafer 100 for LEDs. In this case, in order to ensure growth properties of the first semiconductor layer 30, it is preferable to adopt a method of partially exposing the surface of the wafer for LEDs. In other words, the method makes a state in which the transfer material is partially disposed on the surface of the wafer for LEDs, and the partially disposed transfer material functions as a mask for inhibiting growth of the first semiconductor layer 30. Since the LED is used over a long term such as several tens of thousands of hours, in the case of using the transfer material as the permanent material, it is preferable that materials constituting the transfer material contain the metal element. Particularly, by containing metal alkoxide causing hydrolysis and polycondensation reaction, or condensation compound of metal alkoxide in raw materials, performance as the permanent material is increased, and therefore, such materials are preferable. A more preferable method is to transfer and add a mask material typified by $SiO_2$ deposited by a vacuum process such as deposition and sputtering.

Further, a mask is partially formed on the wafer for LEDs by the transfer method, and next, an inorganic material typified by $SiO_2$ is deposited by deposition or sputtering. Subsequently, by removing the mask prepared by the transfer method, it is also possible to pattern the inorganic material on the wafer for LEDs. Alternatively, it is possible to beforehand deposit a layer of an inorganic material on the main surface of the wafer for LEDs, and process the layer of the inorganic material by the transfer method to obtain. When materials of the wafer for LEDs and the uneven structure 20 are different as described above, as the uneven structure 20, it is the most preferable to adopt one or a mixture of two or more of metal aluminium, amorphous aluminium oxide, polycrystalline aluminium oxide, polycrystalline sapphire, silicon oxide ($SiO_2$), silicon nitride ($Si_3N_4$), silver (Ag), chromium (Cr), nickel (Ni), gold (Au) and platinum (Pt). By this means, it is possible to exert the effects of the rotation shift angle Θ completely.

Second, there is a nanoimprint lithography method. The nanoimprint lithography method is a method including a step of transferring a fine pattern of a mold onto the wafer for LEDs, a step of providing a mask to process the wafer for LEDs by etching, and a step of etching the wafer for LEDs. For example, in the case of using one kind of transfer material, first, the wafer for LEDs and mold are bonded via the transfer material. Next, the transfer material is cured by heat or light (UV), and the mold is peeled off. Etching typified by oxygen ashing is performed on the uneven structure comprised of the transfer material to partially expose the wafer for LEDs. Subsequently, the wafer for LEDS is processed by etching using the transfer material as a mask. As the processing method at this point, it is possible to adopt dry etching and wet etching. In the case of intending to increase the height h of the uneven structure 20 of the pattern wafer (1) 10 for LEDs, dry etching is useful. Further, for example, in the case of using two kinds of transfer materials, a first transfer material layer is first formed on the wafer for LEDs. Next, the first transfer material layer and mold are bonded via a second transfer material. Subsequently, the transfer material is cured by heat or light (UV) to peel off the mold. Etching typified by oxygen ashing is performed on the uneven structure comprised of the second transfer material to partially expose the first transfer material. Next, using the second transfer material layer as a mask, the first transfer material layer is etched by dry etching. Subsequently, using the transfer material as a mask, the wafer for LEDs is processed by etching. As the processing method at this point, it is possible to adopt dry etching and wet etching. In the case of intending to increase the height h of the uneven structure 20, dry etching is useful.

Further, as the nanoimprint lithography method, it is also possible to adopt a nano-fabrication sheet method that eliminates the need for residual film processing as described below. A diluted mask layer (2) material is applied onto the uneven structure surface of the mold, and the solvent is removed. By this operation, the mask layer (2) is capable being disposed inside the concave portion of the mold. A diluted mask layer (1) material is applied on the uneven structure of the mold with the mask layer (2) included inside the concave portion of the mold, and the solvent is removed. By this operation, the mask layer (2) is filled into the inside of the concave portion of the mold, and it is possible to deposit the mask layer (1) to fill and flatten the uneven structure and mask layer (2). By this means, a nano-fabrication sheet is manufactured. Then, the mask layer (1) of the nano-fabrication sheet is layered to the wafer for LEDs for lamination. Then, an energy line typified by UV light is applied to peel off the mold. Dry etching is performed on obtained mask layer (2)/mask layer (1)/wafer for LEDs from the mask layer (2) surface side to expose partially the wafer for LEDs. Next, by etching over the mask layer, it is possible to process the wafer for LEDs and manufacture the pattern wafer (1) 10 for LEDs. Particularly, by adopting the nano-fabrication sheet method, it is possible to control the arrangement direction of the uneven structure using the direction in which the sheet is bonded. For example, the nano-fabrication sheet is fed out and set in a winding apparatus. Next, the wafer for LEDs is loaded. A position of orientation flat of the wafer for LEDS at this point is detected and controlled. Then, the nano-fabrication sheet is bonded to the loaded wafer for LEDs. In other words, although the nano-fabrication sheet is bonded in a particular direction mechanically, by controlling the direction of the wafer for LEDs that is a target for bonding, it is possible to easily control the rotation shift angle Θ. Resolution of the rotation shift angle Θ was ±1°.

As described above, by adopting the transfer method, since it is possible to reflect the fine pattern of the mold in the wafer for LEDs, it is possible to obtain excellent pattern wafers (1) 10 for LEDs.

By applying the transfer method typified by the nanoimprint lithography method and the nano-fabrication sheet method, it is possible to transfer and form the mask layer to process and form the uneven structure 20 on the main surface of the wafer for LEDs. Herein, the dry etching method is described in manufacturing the uneven structure 20 using the mask layer. Particularly, the method is effective in the case where two or more mask layers are provided on the wafer for LEDs. For example, in the case of laminating in the order of organic resist/inorganic resist from the main surface side of the wafer for LEDs, and using the mask layer having the uneven structure comprised of the organic resist and inorganic resist, the effect of the dry etching method as described below is developed at the maximum.

In the following description, an etching processed material refers to a laminate in which a mask layer used to form the uneven structure 20 by performing dry etching processing on the wafer for LEDs is disposed on the main surface of the wafer for LEDs. The etching processed material is an etching processed material provided with a mask layer having a pattern with a pattern width of 5 μm or less and an aspect ratio of 0.1 to 5.0 on the wafer for LEDs, and an entire thermal resistance value is preferably $6.79 \times 10^{-3}$ (m²·K/W) or less in placing the etching processed material on a placement member used in etching processing. The thermal resistance value is a value obtained by dividing a thickness of a member by thermal conductivity λ of materials forming the member.

By this configuration, etching damage is reduced to the mask layer by heat generated in etching processing, and it is possible to manufacture the pattern wafer (1) for LEDs having the desired uneven structure 20 by etching. Further, by using the placement member that is a component of the etching processed material as a transport member, it is possible to increase throughput in the dry etching process.

The etching processed material is placed on a placement region of the placement member. Further, the etching processed material may be directly placed on the placement region of the placement member or may be placed via another member such as a heat transfer sheet. In either case, it is important that the entire thermal resistance value is $6.79 \times 10^{-3}$ (m²·K/W) or less. Herein, using the case where the etching processed material is disposed on the placement region of the placement member via a heat transfer sheet as an example, the entire thermal resistance value is the sum of a thermal resistance value of the placement member in the placement region, a thermal resistance value of the etching processing member, and a thermal resistance value of the heat transfer sheet. In addition, it is possible to replace the heat transfer value with another member to read. Further, in the case of not using another member typified by the heat transfer sheet, the thermal resistance value of the heat transfer sheet is made "0".

The thermal resistance value is a value obtained by dividing a thickness of a member by thermal conductivity $\lambda$ of materials forming the member. In other words, the thermal resistance value R ($m^2 \cdot K/W$) is a value calculated by thickness d (m) of the member/thermal conductivity $\lambda$ (W/m·K) of the member. Materials and thicknesses of members and layers forming the etching processed material and materials and thicknesses forming the placement member are adjusted so that the entire thermal resistance value is $R \leq 6.79 \times 10^{-3}$ ($m^2 \cdot K/W$). In other words, by applying conditions meeting the range of the entire thermal resistance value R and performing dry etching, it is possible to manufacture the pattern wafer (1) for LEDs with high accuracy. As the entire thermal resistance value, it is more preferable that the value is $R \leq 3.04 \times 10^{-3}$ ($m^2 \cdot K/W$) or less, and it is further preferable that the value is $R \leq 1.21 \times 10^{-3}$ ($m^2 \cdot K/W$) or less. In addition, as the lower limit value of the entire thermal resistance value R, it is preferable that $0 \leq R$. In addition, it is possible to measure the thermal resistance value with ease by a laser flash method.

Concerning the thickness d of the placement member, there is no lower limit from the viewpoint of the thermal resistance value, however, when the thickness d of the placement member is too small, since there is a possibility of breakage at the time of transporting the placement member and the like, it is preferable to adopt a range for providing durability e.g. 0.001 m or more. Further, there is an upper limit value of the considerable thickness d from the viewpoint of the thermal resistance value, and at the same, from the viewpoints of operability in transport and the cost, the thickness d of the placement member is preferably 0.05 m or less.

The placement member is a member to place the etching processed material, and is capable of being used as a transport tray to fix or transport the etching processed material. By using the placement member, it is possible to reduce misalignment of the etching processed material in transporting the etching processed material to a vacuum reactor of a dry etching apparatus, and to concurrently transport a plurality of etching processed materials, and the throughput is thereby increased. As materials forming the placement member, examples thereof are metal materials such as silicon (Si), aluminium (Al) and stainless, ceramics such as quartz ($SiO_2$), silicon carbide (SiC), silicon nitride (SiN), alumina ($Al_2O_3$), aluminium nitride (AlN), zirconium oxide ($ZrO_2$) and yttrium oxide ($Y_2O_3$), and metal materials such as silicon and aluminium coated with alumite, yettirum and aluminium with ceramic thermally sprayed onto the surface, and silicon and aluminium coated with resin material. These materials are not limited particularly, as long as the materials meet the above-mentioned condition of the entire thermal resistance value R, and it is preferable to select materials that do not generate a reactant with high deposition property against a dry etching gas. As more preferable examples, silicon (Si), quartz ($SiO_2$) and aluminium (Al) are preferable in terms of availability and high processability of the placement member, and silicon carbide (SiC), alumina ($Al_2O_3$), aluminium nitride (AlN), zirconium oxide ($ZrO_2$), yttrium oxide ($Y_2O_3$) and inorganic members coated with one or more thereof are particularly preferable in terms of the respect that the reactant with high deposition properties is hard to occur. In addition, specifically, the inorganic members used herein are metal materials such as silicon (Si) and aluminium with high processability, for example. By coating such an inorganic member with a material such as silicon carbide (SiC) that does not generate the reactant with high deposition properties, it is possible to achieve compatibility between processing easiness and support for dry etching. Further, in this case, in aluminium nitride (AlN) and the like, there is a case where 100% thereof does not become aluminium nitride (AlN), a part thereof becomes alumina ($Al_2O_3$) and the like, and the coating layer is a mixture. Accordingly, the description of "coated with one or more thereof" means that the case where another material coexists in coating with some material is included.

Shapes of the placement member are not limited particularly when the condition of the above-mentioned entire resistance value R is satisfied, and examples thereof are the shape of a thin-sheet circle and the shape of a thin-sheet rectangle. The surface of the placement member does not need to be flat, and a concave portion (counter bore, pocket) may be formed to store the etching processed material. Further, the placement member does not need to be comprised of a single material, and may be comprised of two or more kinds of materials. Furthermore, the placement member does not need to be formed of a single structure, and may be comprised by combining two or more kinds of structures such as a base portion and portion like a lid to cover a part of the etching processed material and thereby fix the etching processed material.

By the dry etching processing that meets the range of the thermal resistance value R as described above, it is possible to reduce etching damage. By this means, it is possible to manufacture the pattern wafer (1) for LEDs having the uneven structure A with high accuracy. Herein, as the mask layer, two or more mask layers are preferable as described already, and are capable of being prepared with ease by the nano-fabrication sheet method or nanoimprint method on two or more resist layers. Particularly, by using the nano-fabrication sheet, it is possible to form two or more mask layers with high accuracy.

For example, by applying the transfer method, two resist layers are obtained on the main surface of the wafer for LEDs. For example, it is assumed that deposition is performed in the order of organic resist/inorganic resist from the side closer to the wafer for LEDs, and that at least the inorganic resist forms the uneven structure. In this case, first, in the case of the nanoimprint method, it is necessary to partially remove a residual film existing on the inorganic resist and organic resist, and in the case of the nano-fabrication sheet, only the organic layer is partially removed. This step is called the residual film removal step. In the residual film removal step, for example, it is preferable to use reactive etching with a gas containing at least one kind of $O_2$ gas, $H_2$ gas, Xe gas and Ar gas. For example, when the etching pressure ranges from 0.1 Pa to 5 Pa, the processing accuracy is enhanced. Particularly, by using only the $O_2$ gas, or a gas by adding the Ar gas to the $O_2$ gas in an amount of 50 volume % or less, the processing accuracy is enhanced. By this means, it is possible to form a fine pattern mask with a high aspect ratio on the wafer for LEDs.

In the fine pattern mask formation step, it is always not necessary to use the placement member, and it is not necessary to select the material and shape of each member so as to meet the range of the entire thermal resistance value R as described previously either.

In an etching method to enhance the processing accuracy of the uneven structure 20 of the pattern wafer (1) for LEDs, the etching processed material is obtained which is provided with a mask layer having a pattern width of 5 µm or less and an aspect ratio of 0.1 to 5.0 on the wafer for LEDs, and is placed on the placement member, and the wafer for LEDs is etched using the mask layer as a mask in a state in which the entire thermal resistance value R is $6.79 \times 10^{-3}$ (m$^2$·K/W) or less. By this means, since etching damage is suppressed to the fine pattern mask, etching uniformity of the fine pattern mask is kept in the etching step, and the accuracy of the uneven structure 20 is enhanced in the pattern wafer (1) for LEDs.

From the viewpoint of etching the wafer for LEDs, it is possible to perform etching using a chlorine-based gas and fluorocarbon-based gas. Among fluorocarbon-based gases (CxHzFy: x=1 to 4, y=1 to 8, and z=0 to 3 of integers in these ranges) easy to perform reactive etching on the wafer for LEDS, a mixed gas containing at least one kind is used. As the fluorocarbon-based gases, examples thereof are $CF_4$, $CHF_3$, $C_2F_6$, $C_3F_8$, $C_4F_6$, $C_4F_8$, $CH_2F_2$, and $CH_3F$. Further, in order to enhance the etching rate of the wafer for LEDs, used is a mixed gas obtained by mixing Ar gas, $O_2$ gas, and Xe gas to the fluorocarbon-based gas in an amount of 50% or less of the entire gas flow rate. In the case of etching the wafer for LEDs (hard etching substrate) hard to undergo the reactive etching with the fluorocarbon-based gas and the case of etching the wafer for LEDs that generates a reactant with high deposition properties, a mixed gas is used which contains at least one among chlorine-based gases capable of performing reactive etching. As the chlorine-based gases, examples thereof are $Cl_2$, $BCl_3$, $CCl_4$, $PCl_3$, $SiCl_4$, HCl, $CCl_2F_2$ and $CCl_3F$. Further, in order to enhance the etching rate of the hard etching substrate, the $O_2$ gas, Ar gas or mixed gas of $O_2$ gas and Ar gas may be added to the chlorine-based gas.

Since ion incident energy contributing to the reactive etching is increased and the etching rate of the wafer for LEDs is enhanced, the pressure in the etching preferably ranges from 0.1 Pa to 20 Pa, and more preferably ranges from 0.1 Pa to 10 Pa.

Further, by mixing two kinds of fluorocarbon gases with different ratios (y/x) of C and F (CxHzFy: x=1 to 4, y=1 to 8, and z=0 to 3 of integers in these ranges) to increase or decrease the deposition amount of the fluorocarbon film to protect etching side walls of the wafer for LEDs, it is possible to independently create the angle of the taper shape of the fine pattern prepared for the wafer for LEDs. In the case of controlling the shape of the mask for the wafer for LEDs with higher accuracy by dry etching, the ratio between the flow rate of fluorocarbon gas with F/C≥3 and the flow rate of fluorocarbon gas with F/C<3 is preferably 95 sccm:5 sccm to 60 sccm:4.0 sccm, and more preferably 70 sccm:30 sccm to 60 sccm:40 sccm. Also in the case where the total flow rate of gas is changed, the above-mentioned flow rate ratios are not changed.

Furthermore, as the mixed gas of fluorocarbon-based gas and Ar gas and mixed gas of $O_2$ gas or Xe gas, when the reactive etching component and ion incident component are proper amounts, from the viewpoint of enhancing the etching rate of the wafer for LEDs, the ratio of gas flow rates is preferably 99 sccm:1 sccm to 50 sccm:50 sccm, more preferably 95 sccm:5 sccm to 60 sccm:40 sccm, and further preferably 90 sccm:10 sccm to 70 sccm:30 sccm. Further, as the mixed gas of chlorine-based gas and Ar gas and mixed gas of $O_2$ gas or Xe gas, when the reactive etching component and ion incident component are proper amounts, from the viewpoint of enhancing the etching rate of the wafer for LEDs, the ratio of gas flow rates is preferably 99 sccm:1 sccm to 50 sccm:50 sccm, more preferably 95 sccm:5 sccm to 80 sccm:20 sccm, and further preferably 90 sccm:10 sccm to 70 sccm:30 sccm. Also in the case where the total flow rate of gas is changed, the above-mentioned flow rate ratios are not changed.

Still furthermore, for etching of the wafer for LEDs using the chlorine-based gas, it is preferable to use only $BCl_3$ gas, or a mixed gas of a mixed gas of $BCl_3$ gas and $Cl_2$ gas and the Ar gas or Xe gas. In these mixed gases, when the reactive etching component and ion incident component are proper amounts, from the viewpoint of enhancing the etching rate of the wafer for LEDs, the ratio of gas flow rates is preferably 99 sccm:1 sccm to 50 sccm:50 sccm, more preferably 99 sccm:1 sccm to 70 sccm:30 sccm, and most preferably 99 sccm:1 sccm to 90 sccm:10 sccm. Also in the case where the total flow rate of gas is changed, the above-mentioned flow rate ratios are not changed.

As plasma etching, it is possible to use capacity coupling type RIE, inductive coupling type RIE, inductive coupling type RIE or RIE using ion drawing-in voltage. For example, using only the $CHF_3$ gas or a gas obtained by mixing $CF_4$ and $C_4F_8$ in the ratio of gas flow rates of 90 sccm:10 sccm to 60 sccm:40 sccm, the processing pressure is set in the range of 0.1 Pa to 5 Pa, and used is capacity coupling type RIE, or RIE using ion drawing-in voltage. Further, for example, in the case of using the chlorine-based gas, used is only the $BCl_3$ gas, or a gas obtained by mixing the $BCl_3$ gas and $Cl_2$ gas or Ar gas in the gas flow rate ratio of 95 sccm:5 sccm to 85 sccm:15 sccm, the processing pressure is set in the range of 0.1 Pa to 10 Pa, and used is capacity coupling type RIE, conductive coupling type RIE or RIE using ion drawing-in voltage.

Moreover, for example, in the case of using the chlorine-based gas, used is only the $BCl_3$ gas, or a gas obtained by mixing the $BCl_3$ gas and $Cl_2$ gas or Ar gas in the gas flow rate ratio of 95 sccm:5 sccm to 70 sccm:30 sccm, the processing pressure is set in the range of 0.1 Pa to 10 Pa, and used is capacity coupling type RIE, conductive coupling type RIE or RIE using ion drawing-in voltage. Further, also in the case where the total gas flow rate of the mixed gas used in etching is changed, the above-mentioned flow rate ratio is not changed.

In the dry etching step for the wafer for LEDs, etching is performed on the wafer for LEDs in the state of the etching processed material in the range of the entire thermal resistance value R as described previously. By thus performing dry etching on the wafer for LEDs, also in the case of using, as a mask, the fine pattern mask with the pattern width of 5 µm or less and the aspect ratio in the range of 0.1 to 5.0, while ensuring high throughput, it is possible to reduce dry etching damage and form the uneven structure for the wafer for LEDs as expected.

The fine pattern mask formation step and the dry etching step for the wafer for LEDs may undergo successive processing in the same apparatus. In this case, the placement member is also used in the fine pattern mask formation step, and each material and shape are selected so as to meet the range of the entire thermal resistance value R as described previously.

<<Manufacturing Method of the Epitaxial Wafer for LEDs>>

Described next is a method of manufacturing the epitaxial wafer 100 for LEDs. It is possible to manufacture the epitaxial wafer 100 for LEDs according to this Embodiment by sequentially depositing the first semiconductor layer 30, light emitting semiconductor layer 40, and second semiconductor layer 50 on the uneven structure 20 of the pattern wafer (1) 10 for LEDs so as to meet the ratio (Hbun/Have) and/or the ratio (Hbu/Have) as described above. Particularly, it is preferable to include the step of preparing the pattern wafer (1) 10 for LEDs, the step of performing optical measurement on the pattern wafer (1) 10 for LEDs, and the step of manufacturing the epitaxial wafer 100 for LEDs using the pattern wafer (1) 10 for LEDs in this order. In this case, since it is possible to beforehand evaluate accuracy of the pattern wafer (1) 10 for LEDs, it is possible to estimate the degree of improvements in internal quantum efficiency IQE and light extraction efficiency LEE in advance. As the optical measurement, it is possible to adopt both measurement for detecting reflected light and measurement for detecting transmitted light. Particularly, since it is possible to divert apparatuses with high general versatility, in the case of detecting transmitted light, it is preferable to measure the haze. On the other hand, from the viewpoint of judging the accuracy of the uneven structure 20 more accurately, the scheme for detecting reflected light is preferable. In this case, according to the arrangement and size of the uneven structure 20, it is possible to set whether to detect a regular reflection component or a diffuse reflection component as appropriate. By using the regular reflection component, it is possible to evaluate accuracy of the contour shape of the uneven structure 20, and by using the diffuse reflection component, it is possible to evaluate volume accuracy of the uneven structure 20. It is possible to select which component to adopt as appropriate according to the used uneven structure 20 and the purpose. Further, it is also possible to use a ratio between the diffuse reflection component and the regular reflection component, (diffuse reflection component-regular reflection component), (diffuse reflection component-regular reflection component)/regular reflection component, (diffuse reflection component-regular reflection component)/diffuse reflection component and the like. In the above-mentioned optical measurement, by making the wavelength of the light source larger than the average interval (Pave) of the uneven structure 20, it is also possible to effectively evaluate the defect of the uneven structure 20.

As described above, by using the pattern wafer (1) for LEDs, developed are the effects of the rotation shift angle Θ and the shape of the top of the convex-portion, and it is thereby possible to suppress cracks in the semiconductor layer excellently. Then, it is possible to effectively improve the internal quantum efficiency IQE. Herein, by using a pattern wafer (2) for LEDs as described below, it is possible to more improve the light extraction efficiency LEE, while maintaining the effects as described above. The pattern wafer (2) for LEDs is characterized by further providing another uneven structure L to the pattern wafer (1) for LEDs. By the uneven structure L, it is possible to provide strong light scattering properties and more enhance the light extraction efficiency LEE.

Concerning the pattern wafer (2) for LEDs, the uneven structure A corresponds to the uneven structure A described in the pattern wafer (1) for LEDs. In other words, the pattern wafer (2) for LEDs is obtained by adding the uneven structure L to the pattern wafer (1) for LEDs as a further uneven structure. Therefore, in addition to the effects due to the pattern wafer (1) for LEDs, it is possible to develop effects due to the newly added uneven structure L. Accordingly, in addition to effectively suppressing cracks, significantly enhancing crystallinity of the semiconductor layer, and enhancing the internal quantum efficiency IQE, it is made possible to effectively enhance the light extraction efficiency LEE.

The pattern wafer (2) for LEDs will specifically be described below. In addition, as described already, the pattern wafer (2) for LEDs is obtained by further adding the uneven structure L to the pattern wafer (1) for LEDs. Accordingly, in the following description, the description of the added uneven structure L will be given mainly. Therefore, detailed descriptions are omitted on the other components of the pattern wafer (2) for LEDs, epitaxial wafer for LEDs using the pattern wafer (2) for LEDs, LED chip using the pattern wafer (2) for LEDs, and manufacturing method of the pattern wafer (2) for LEDs, and for these matters, it is possible to apply the matters of the pattern wafer (1) for LEDs without modification.

Further, the definitions described in the description of the pattern wafer (1) for LEDs are also applied to the pattern wafer (2) for LEDs.

The pattern wafer (2) for LEDs according to this Embodiment is characterized by being provided with the uneven structure A having an arrangement with n-fold symmetry substantially and the uneven structure L having an arrangement with m-fold symmetry substantially that is different from the uneven structure A on the main surface, where in at least a part of the uneven structure A, the rotation shift angle Θ meets $0°<Θ≤(180/n)°$ in which Θ is the rotation shift angle of the arrangement axis A of the uneven structure A with respect to a crystal axis direction of the pattern wafer (2) for LEDs in the main surface. In other words, the pattern wafer (2) for LEDs according to this Embodiment is characterized by being further provided with the uneven structure L having the arrangement with m-fold symmetry substantially, different form the uneven structure A, on the surface with the concavo-convex A existing of the pattern wafer (1) for LEDs.

According to this configuration, it is possible to increase the internal quantum efficiency IQE of the epitaxial wafer for LEDs using the pattern wafer (2) for LEDs, and to suppress cracks inside the semiconductor layer deposited on the surface (hereafter, uneven structure) having the uneven structure of the pattern wafer (2) for LEDs. Further, it is possible to extract the light efficiently emitted from the LED to the outside of the LED. In other words, it is possible to develop the effects as described in the pattern wafer (1) for LEDs, and to further achieve increases in light extraction efficiency LEE due to the uneven structure L.

First, since the uneven structure A of the pattern wafer for LEDs is the uneven structure A of the pattern wafer (1) for LEDs as described already, from the same principles, it is possible to deposit the semiconductor layer with cracks reduced, and it is thereby possible to obtain the semiconductor crystal of high quality. Further, it is possible to improve the internal quantum efficiency IQE of the epitaxial wafer for LEDs. Hereinafter, the effects of the uneven structure A are described, and are capable of being replaced with the same effects as the effects due to the uneven structure 20 of the pattern wafer (1) for LEDs to read.

In the pattern wafer (2) for LEDs according to this Embodiment, the uneven structure L is comprised of pluralities of convex portions and concave portions having a first average interval (PL), and the uneven structure A is provided on surfaces of at least either the convex portions or the concave portions forming the uneven structure L, and is comprised of pluralities of convex portions and concave portions having a second average interval (PA), where it is preferable that the ratio (PL/PA) of the first average interval (PL) to the second average interval (PA) exceeds 1 and is 2000 or less. Herein, the second average interval (PA) refers to the average interval (Pave) described in the pattern wafer (1) for LEDs.

According to this configuration, it is possible to prevent the effects of the uneven structure A from being suppressed by the uneven structure L, and to increase a difference between the uneven structure A and the uneven structure L as viewed from the emitted light. That is, it is possible to effectively develop the function of the pattern wafer (1) for LEDs, and further increase the light extraction efficiency LEE. The light extraction efficiency LEE is due to provision of large optical scattering properties due to the uneven structure L.

In the pattern wafer (2) for LEDs according to this Embodiment, it is preferable that a plurality of the convex portions forming the uneven structure L is mutually spaced, and that the convex portions or concave portions forming the uneven structure A are provided at least in bottom portions of a plurality of the concave portions forming the uneven structure L.

According to this configuration, development of the effects of the uneven structure A is particularly made excellent. By the uneven structure A provided on the concave portions of the uneven structure L, it is possible to grow the semiconductor layer preferentially from the bottom portion of the concave portion of the uneven structure L. Herein, since the uneven structure A is provided on the bottom portion of the concave portion, from the principles described already, it is possible to effectively achieve suppression of cracks and improvements in internal quantum efficiency IQE.

In the pattern wafer (2) for LEDs according to this Embodiment, it is preferable that a plurality of the concave portions forming the uneven structure L is mutually spaced, and that the convex portions or concave portions forming the uneven structure A are provided at least on tops of a plurality of the convex portions forming the uneven structure L.

According to this configuration, particularly, it is possible to increase the light extraction efficiency LEE. By the uneven structure A provided on the vertex portion of the convex portion of the uneven structure L with a larger average interval, it is possible to develop the effect of crack suppression and the effect of improvements in internal quantum efficiency IQE in the semiconductor layer growing from the top of the convex-portion of the uneven structure L. In this case, it is possible to form space in which the semiconductor layer is not deposited in the concave portion of the uneven structure L. This space is extremely low in the refractive index from the viewpoint of the semiconductor layer. In other words, since it is possible to increase the difference in the refractive index, optical scattering properties are increased, and the light extraction efficiency LEE is more enhanced. Further, it is made easy to remove the pattern wafer (2) for LEDs, and therefore, depending on the type of LED, it is possible to cause laser liftoff to suitably act.

In the pattern wafer (2) for LEDs according to this Embodiment, it is preferable that a coverage of the uneven structure A to the uneven structure L exceeds 0% and is less than 100%.

According to this configuration, by the coverage exceeding 0%, it is possible to exert the effects due to the uneven structure A as described above i.e. the effects of suppressing cracks and improving the internal quantum efficiency IQE. On the other hand, by the coverage being less than 100%, it is possible to keep excellent adherence of the nucleus of the semiconductor layer and growth properties. Therefore, the growth properties of the semiconductor layer are made excellent, cracks are suppressed, and it is possible to deposit the semiconductor layer with high internal quantum efficiency IQE.

In the pattern wafer (2) for LEDs according to this Embodiment, the uneven structure A is comprised of pluralities of convex portions and concave portions having a first average interval (PA), and the uneven structure L is provided on the surface of the uneven structure A apart from each other so as to expose a part of the uneven structure A, and is comprised of a plurality of convex portions having a second average interval (PL), where it is preferable that the ratio (PL/PA) between the first average interval (PA) and the second average interval (PL) exceeds 1 and is 2000 or less. Herein, the first average interval (PA) refers to the average interval (Pave) described in the pattern wafer (1) for LEDs.

According to this configuration, it is possible to develop the effects of the uneven structure A and to increase the light extraction efficiency LEE. First, since the pattern wafer (2) for LEDs has the uneven structure A on its surface and the uneven structure A includes the exposed portion, from the principles described already, cracks are suppressed, and it is possible to deposit the semiconductor layer with high internal quantum efficiency IQE. Next, the uneven structure L is provided on the surface of the uneven structure A. The uneven structure L has a larger average interval than that of the uneven structure A. Accordingly, optical scattering properties are strengthened. In other words, it is possible to deposit the semiconductor layer with cracks suppressed, and since dislocations of the semiconductor layer are decreased, the internal quantum efficiency IQE is increased. Then, it is possible to extract the light effectively emitted by high internal quantum efficiency IQE to the outside of the LED by optical scattering properties.

In the pattern wafer (2) for LEDs according to this Embodiment, the average interval (PA) of the uneven structure A preferably ranges from 50 nm to 1500 nm. Herein, the average interval (PA) refers to the average interval (Pave) described in the pattern wafer (1) for LEDs.

According to this configuration, from the principles described in the pattern wafer (1) for LEDs, the effects due to the uneven structure A are more enhanced.

In the pattern wafer (2) for LEDs according to this Embodiment, in using the Duty ($\Phi$ave/PA) that is a ratio of the average diameter ($\Phi$ave) of the bottom of the convex-portion of the uneven structure A to the average interval (PA), it is preferable that the rotation shift angle $\Theta$ meets a range of a $\tan(\text{Duty}/2)° \leq \Theta \leq (180/n)°$.

According to this configuration, from the same principles as in the pattern wafer (1) for LEDs, the effects of the uneven structure A are more remarkable. Accordingly, the internal quantum efficiency IQE is more increased, and cracks occurring in the semiconductor layer are effectively suppressed.

In the following description, the expression of uneven structure AL is used, in the case of describing the uneven structure A and the uneven structure L at the same time. The pattern wafer (2) for LEDs according to this Embodiment is provided on its surface with the uneven structure AL. The uneven structure AL may be obtained by processing one main surface of the wafer for LEDs or may be provided on one main surface of the wafer for LEDs separately. In other words, materials constituting the wafer for LEDs may be the same as or different from materials constituting the uneven structure A and/or uneven structure L. Herein, the uneven structure A substantially has an arrangement with n-fold symmetry, the rotation shift angle $\Theta$ described already exhibits a predetermined range, and the shape of the top of the convex-portion is a corner portion with a radius of curvature exceeding "0". In addition, as described already in the pattern wafer (1) for LEDs, the shape of the top of the convex-portion is also capable of including a tabletop of the size of 100 nm or less.

The relationship between the arrangement of the uneven structure A and the arrangement of the uneven structure L will be described next. As described already, the uneven structure A is provided on the wafer for LEDs so that the rotation shift angle Θ meets the predetermined range. Herein, the rotation shift angle of an arrangement axis L of the uneven structure L is not limited particular with respect to the pattern wafer for LEDs, but by meeting the following range, it is possible to more increase the internal quantum efficiency IQE and the effect of suppressing cracks. In addition, in the following description, the rotation shift angle Θ for the arrangement axis A of the uneven structure A is described as ΘA, and the rotation shift angle Θ for the arrangement axis L of the uneven structure L is described as ΘL. Further, it is possible to define the rotation shift angle ΘL by replacing the uneven structure A with the uneven structure L and the arrangement axis A with the arrangement axis L to read in the definition description of the rotation shift angle ΘA.

ΔΘ(=|ΘL−ΘA|) that is a difference between the rotation shift angle ΘL and the rotation shift angle ΘA meets a range of 0°≤ΔΘ≤(180/n)°. Particularly, by meeting 0°ΔΘ≤a tan (Duty/2)°, the internal quantum efficiency IQE and the crack suppression effect are further increased. In addition, the Duty is the Duty of the uneven structure. This is because the position relationship between the surface formed by the semiconductor layer when the semiconductor layer grows and the convex portion of the uneven structure L is moderate in adherence of the nucleus of the semiconductor layer, growth and coalescence of growing semiconductor layer improved by the uneven structure A.

More specifically, since an angle made by the arrangement axis L of the uneven structure L and the surface formed by growth of the semiconductor layer is decreased, it is possible to reduce stress applied to the growing semiconductor layer by the uneven structure L. By this means, it is possible to keep growth properties of the semiconductor layer excellent, the coalescence of growing semiconductor layers is made excellent, dislocations turn and are reduced, and it is possible to suppress cracks. In the range, by meeting 0°≤ΘL≤a tan(Duty/2)°, the effects are further exerted, and therefore, such a range is preferable. Particularly, by meeting 0°≤ΘL≤[a tan(Duty/2)°]/2, uniformed is the density of convex portions of the uneven structure L that the growing semiconductor layer passes, it is thereby possible to suppress disturbance of growth of the semiconductor layer, and therefore, such a range is preferable. From the same effects, it is the most preferable to meet 0°≤ΘL [a tan(Duty/2)°]/4. On the other hand, by meeting a tan(Duty/2)°≤ΔΘ≤(180/n)°, it is considered that it is possible to decrease an amount of particles occurring in chipping the LED. In meeting this range, this is because the number of convex portions of the uneven structure L is decreased in viewing from the cleavage direction in chipping the LED. In the range, by meeting a tan(Duty/2)°≤ΘL≤(180/n)°, the effects are further exerted, and therefore, such a range is preferable.

The uneven structure A has substantially the arrangement with n-fold symmetry, and meets the rotation shift angle Θ as described already. On the other hand, the uneven structure L has substantially the arrangement with m-fold symmetry. The rotation shift angle ΘL with respect to the uneven structure L and the relationship ΔΘ between the rotation shift angle ΘA and the rotation shift angle ΘL are as described already. Further, the rotation symmetry degree n of the uneven structure A may be the same as or different from the rotation symmetry degree m of the uneven structure L. In other words, when the combination of the rotation symmetry degree n of the uneven structure A and the rotation symmetry degree m of the uneven structure L is described as (n,m), among the combinations are (6,6), (6,4), (6,2), (4,6), (4,4), (4,2), (2,6), (2,4) and (2,2). Among the combinations, in order to more excellently develop the function of the uneven structure A and the function of the uneven structure L, (6,6), (4,6), (2,6), (6,2), (4,2) or (2,2) is preferable, and (6,6), (4,6) or (2,6) is the most preferable.

(Uneven Structure L)

The uneven structure L will be described next. The principal function of the uneven structure L is to increase the light extraction efficiency LEE. Therefore, the structure L is preferably a structure for effectively causing the optical scattering (light scattering or light diffraction) phenomenon or the reflection phenomenon, and is capable of adopting the uneven structure L as described below.

From the viewpoint of effectively developing the optical scattering properties (light scattering or light diffraction) or reflection, it is preferable that the average interval PL of the uneven structure L meets a range wider than the average interval PA of the uneven structure A i.e. average interval PL>average interval PA, and concurrently ranges from 1000 nm to 100 μm. Particularly, from the viewpoints of more strongly developing light diffraction properties, and effectively disturbing the waveguide mode to increase the light extraction efficiency LEE, the average interval PL is preferably 1200 nm or more, more preferably 1500 nm or more, and most preferably 2000 nm or more. On the other hand, from the viewpoints of manufacturing time of the uneven structure L and a use amount of the semiconductor layer, the upper limit value is preferably 50 μm or less, more preferably 20 μm, and most preferably 10 μm or less.

Figure 27A:
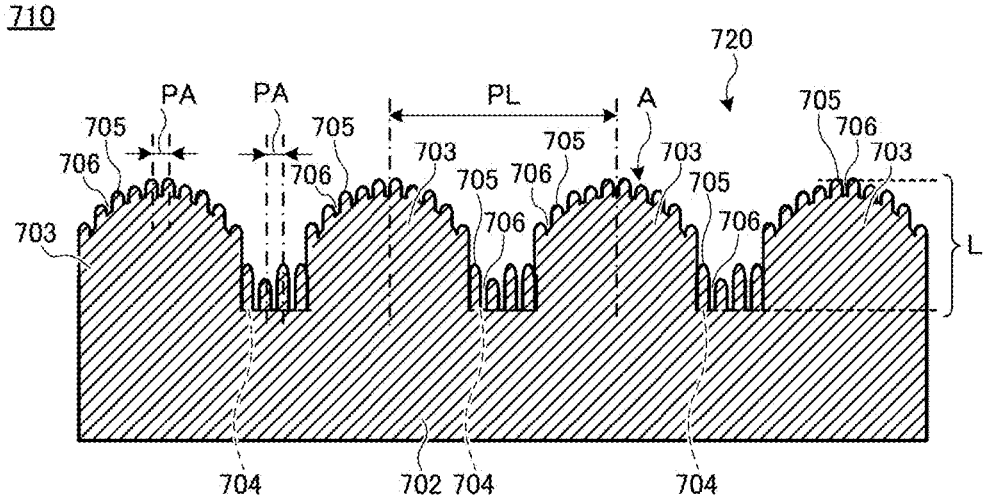
FIG. 27 contains cross-sectional schematic diagrams showing an example of a pattern wafer (2) for LEDs according to this Embodiment.
Figure 27B:
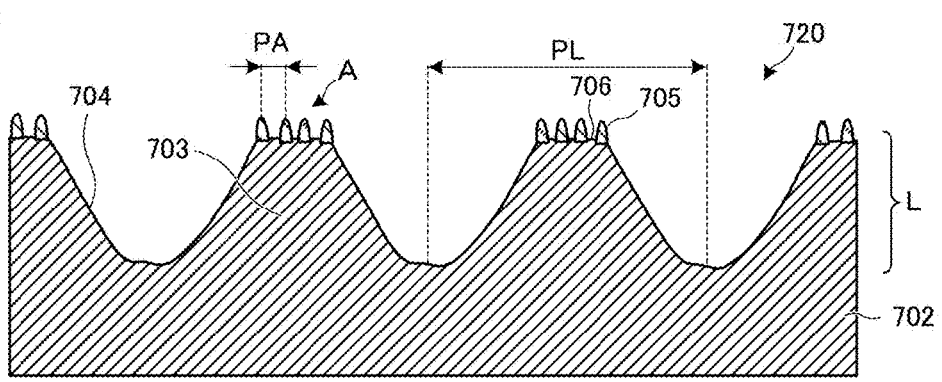

The width of the top of the convex-portion of the uneven structure L is not limited particularly when the uneven structure A is provided on convex portions 703 of the uneven structure L as shown in FIGS. 27A and 27B described later, irrespective of materials of the uneven structure L. This is because the first semiconductor layer grows from the exposed surface of a wafer 702 for LEDs when materials are different between the uneven structure L and the wafer 702 for LEDs. On the other hand, when materials of the uneven structure L and the wafer 702 for LEDs are the same, this is because it is possible to reduce dislocations occurring from the vertex portion of the convex structure 703 of the uneven structure L by the uneven structure A. When materials of the uneven structure L and the wafer 702 for LEDs are the same, from the viewpoints of increasing the internal quantum efficiency IQE and the light extraction efficiency LEE irrespective of the arrangement of the uneven structure A with respect to the uneven structure L, as the ratio (width of the top of the convex-portion/width of the opening part of the concave-portion) of the width of the top of the convex-portion of the uneven structure L to the width of the opening part of the concave-portion of the uneven structure L, the ratio is preferably smaller, and most preferably substantially "0". In other words, as in the top of the convex-portion of the uneven structure A, it is the most preferable that the top of the convex-portion of the uneven structure L is also the corner portion with a radius of curvature exceeding "0". In addition, from the study results of the pattern wafer (1) for LEDs, it is conceivable that the corner portion with a radius of curvature exceeding "0" includes the case where the size of a tabletop is 100 nm or less. In addition, the ratio of "0" means that the width of the top of the convex-portion is 0 nm. However, for example, even when the width of the top of the convex-portion is measured with the scanning electron microscope, it is not possible to accurately measure "0 nm". Accordingly, the width of the top of the convex-portion herein is assumed to include all cases less than measurement resolution. When the ratio (width of the top of the convex-portion/width of the opening part of the concave-portion) is 3 or less, it is possible to keep deposition properties of the semiconductor layer excellent. This is because it is possible to decrease an amount of the semiconductor growing from the vertex portion of the convex portion 703 of the uneven structure L. Further, by the ratio being 1 or less, it is possible to increase the light extraction efficiency LEE. This is because the refractive index distribution of the uneven structure L made by the pattern wafer (2) 710 for LEDs and the semiconductor layer is suitable from the viewpoint of the emitted light. From the viewpoints of significantly increasing both the internal quantum efficiency IQE and the light extraction efficiency LEE as described above, the ratio is preferably 0.4 or less, more preferably 0.2 or less, and further preferably 0.15 or less.

Further, when the materials of the uneven structure L and the wafer 702 for LEDs are the same, in the case where the bottom portion of a concave portion 704 of the uneven structure L has a flat surface, it is possible to increase the internal quantum efficiency IQE and to decrease a difference between semiconductor deposition apparatuses, and therefore, such a case is preferable. In order to increase the internal quantum efficiency IQE, it is necessary to disperse dislocations inside the semiconductor layer to decrease local and macroscopic dislocation densities. Herein, the initial conditions of these physical phenomena are nucleation and nucleus growth in depositing the semiconductor layer by CVD (Chemical Vapor Deposition), VPE (Vapor Phase Epitaxy) or sputtering. When the bottom portion of the concave portion 704 of the uneven structure L has a flat surface, since it is possible to suitably generate nucleation with respect to the bottom portion of the concave portion of the uneven structure L, growth of the semiconductor layer is stabilized. As a result, it is possible to more increase the internal quantum efficiency IQE.

On the other hand, in the case where the materials of the uneven structure L and the wafer 702 for LEDs are different from each other, when the uneven structure L is partially provided on the wafer 702 for LEDs i.e. there is the exposed surface on the wafer 702 for LEDs, growth of the first semiconductor layer is achieved. Accordingly, in the case where the materials of the uneven structure L and the wafer 702 for LEDs are different from each other, the uneven structure L is comprised a plurality of convex portions provided on the wafer 702 for LEDs and the exposed surface of the wafer 702 for LEDs where the convex portion is not provided. For example, in using sapphire, SiC, nitride semiconductor, Si or spinel as the wafer 702 for LEDs, it is possible to provide the convex portion 703 comprised of one or a mixture of two or more of metallic aluminium, amorphous aluminium oxide, polycrystalline aluminium oxide, polycrystalline sapphire, silicon nitride ($SiO_2$), silicon nitride ($Si_3N_4$), silver (Ag), chromium (Cr), nickel (Ni), gold (Au) and platinum (Pt).

As the Duty of the uneven structure L expressed by the ratio (average diameter of the bottom of the convex-portion/PL) of the average diameter of the bottom of the convex-portion to the average interval PL of the uneven structure L, from the viewpoint of increasing the light extraction efficiency LEE, the Duty preferably ranges from 0.03 to 0.83. By the Duty being 0.03 or more, the volume of the convex portion of the uneven structure L is increased to enhance optical scattering properties. From the same effect, the ratio is more preferably 0.17 or more, and most preferably 0.33 or more. On the other hand, by the ratio being 0.83 or less, it is possible to increase the area of the bottom portion of the concave portion of the uneven structure L, and it is thereby possible to make excellent adherence of the nucleus of the semiconductor layer, growth and coalescence of growing semiconductor layers. By this means, it is possible to increase the internal quantum efficiency IQE. From the same effect, the ratio is more preferably 0.73 or less, and most preferably 0.6 or less.

When the aspect ratio of the uneven structure L i.e. average height of the uneven structure L/average diameter of the bottom of the convex-portion of the uneven structure L is 0.1 or more, it is possible to increase the light extraction efficiency LEE due to the optical scattering properties by the uneven structure L. Particularly, from the viewpoint of increasing the number of modes of light diffraction, the ratio is preferably 0.3 or more, more preferably 0.5 or more, and most preferably 0.8 or more. On the other hand, from the viewpoints of suppressing cracks and voids in the semiconductor layer, the aspect ratio is preferably 5 or less. Further, since it is possible to shorten the time for preparing the uneven structure L and reduce a use amount of the semiconductor, the ratio is more preferably 2 or less, and most preferably 1.5 or less.

It is preferable that a height H of the convex portion 703 of the uneven structure L is two times or less the average interval PL, from the viewpoints of time taken for preparation of the uneven structure L and a used semiconductor crystal amount. Particularly, in the case of the average interval PL or less, since the refractive index distribution of the uneven structure L is suitable from the viewpoint of the emitted light, it is possible to more increase the light extraction efficiency LEE. From this viewpoint, the height H of the uneven structure L is more preferably 0.8 time or less the average interval PL, and most preferably 0.7 time or less.

The relationship between the uneven structure A and the uneven structure L will be described next. The pattern wafer (2) for LEDs of the present invention is provided with the uneven structure A having the average interval PA meeting the rotation shift angle ΘA described already, and the uneven structure L having the average interval PL, and the average interval PL and the average interval PA are different from each other in the predetermined ratio range.

Herein, one uneven structure L with a larger average interval principally develops the function of increasing the light extraction efficiency LEE, and the other uneven structure A with a smaller average interval principally develops the function of improving the internal quantum efficiency IQE and suppressing cracks. Further, in order for the respective functions of the uneven structures (L and A) to work synergistically and compensate with/for each other i.e. in order that the light extraction efficiency LEE is not decreased by one uneven structure A for improving the internal quantum efficiency IQE and suppressing cracks, and that the internal quantum efficiency IQE is not decreased or cracks do not occur by the other uneven structure L for improving the light extraction efficiency LEE, it is a feature that the other uneven structure (A or L) is provided on at least a part of the surface of one uneven structure (L or A).

In addition, the rotation shift angle $\Theta L$ and $\Delta\Theta$ are as described already.

FIG. 27 contains cross-sectional schematic diagrams showing an example of the pattern wafer (2) for LEDs according to this Embodiment. In the pattern wafer (2) 710 for LEDs shown in FIGS. 27A and 27B, an uneven structure 720 is provided on the main surface of the wafer 702 for LEDs, and is comprised of a first uneven structure (hereinafter, referred to as uneven structure L) and a second uneven structure (hereinafter, referred to as uneven structure A). The uneven structure L is comprised of convex portions 703 (or concave portions 704) provided while being mutually spaced, and concave portions 704 (or convex portions 703) connecting between adjacent convex portions 703 (or concave portions 704). A plurality of convex portions 703 (or concave portions 704) has the average interval PL.

On the other hand, the uneven structure A is comprised of a plurality of convex portions 705 (or concave portions 706) provided on surfaces of the convex portions 703 and concave portions 704 constituting the uneven structure L, and concave portions 706 (or convex portions 705) connecting among the plurality of convex portions 705 (or concave portions 706). The plurality of convex portions 705 (or concave portions 706) has the average interval PA. In FIG. 27A, the uneven structure A is provided on the vertex-portion surfaces of the plurality of convex portions 703 and the bottom portions of the concave portions 704. On the other hand, in FIG. 27B, the uneven structure A is provided on the tops of the convex portions 703 connecting among a plurality of independent concave portions 704. In addition, the uneven structure A is not limited to the examples of FIGS. 27A and 27B, and it is essential only that the uneven structure A is provided on the surface of at least the convex portion 703 or the concave portion 704.

In addition, the uneven structure A meets the rotation shift angle $\Theta$ as described already. Further, the uneven structure A preferably meets the shape as described already. Furthermore, the arrangement of the uneven structure L preferably meets the rotation shift angle $\Theta L$ or $\Delta\Theta$ as described already.

In addition, it is also possible to provide the uneven structure A on the side surface of the convex portion 703 that connects between the convex portion 703 and the bottom portion of the concave portion 704. In the case where the uneven structure A is provided on the side surface of the convex portion 703, it is considered that the effect of disturbing the waveguide mode is further strengthened, and that it is possible to change the travelling direction of disturbed emitted light more to the thickness direction of the LED. Therefore, it is made easy to select a sealant in packaging the LED.

(Case 1)

Particularly, it is preferable that the uneven structure L is comprised of a plurality of mutually spaced convex portions 703, and that the uneven structure A is provided on at least bottom portions of the concave portions 704 of the uneven structure L.

In this case, it is possible to start growth of the semiconductor layer from the bottom portion of the concave portion 704 of the uneven structure L, as a starting point. Particularly, since the uneven structure A is provided on the bottom portion of the concave portion 704, adherence of the nucleus of the semiconductor layer, growth and coalescence of growing semiconductor layers is made excellent as described already, and it is thereby possible to suppress dislocations of the semiconductor layer near the uneven structure A, and to concurrently decrease cracks. Further, since the uneven structure L is comprised of a plurality of convex portions 703, it is possible to suppress cracks, near the convex portion 703, of the semiconductor layer growing from the bottom portion of the concave portion 704. In other words, it is possible to increase the internal quantum efficiency IQE and enhance reliability of the LED. Further, as described below, since the uneven structures L and A meet the predetermined relationship of average interval, optical scattering properties are increased. Particularly, since there is the configuration that the uneven structure A is provided on at least the bottom portion of the concave portion 704, it is possible to more disturb the waveguide mode by light scattering or optical reflection, it is possible to suppress re-waveguide of the waveguide mode, and therefore, the light extraction efficiency LEE is concurrently increased.

(Case 2)

Further, it is preferable that the uneven structure L is comprised of a plurality of mutually spaced concave portions 704, and that the convex portions 705 or concave portions 706 constituting the uneven structure A are provided on at least tops of the convex portions 703 of the uneven structure L.

In this case, it is possible to start growth of the semiconductor layer from the vertex portion of the convex portion 703 of the uneven structure L, as a starting point. Particularly, since the uneven structure A is provided on the vertex portion of the convex portion 703, it is possible to suppress cracks in the semiconductor layer and to improve the internal quantum efficiency IQE as described already. At this point, growth properties are more excellent in the semiconductor layer growing from the vertex portion of the convex portion 703 than those of the semiconductor crystal growing from the bottom portion of the concave portion 704. Therefore, it is possible to block the semiconductor layer growing from the bottom portion of the concave portion 704 by the semiconductor layer growing from the vertex portion of the convex portion 703. Accordingly, cracks are suppressed, and the internal quantum efficiency IQE is effectively increased. Further, depending on the growth condition of the semiconductor layer, it is made easy to generate voids inside the concave portion 704. In this case, for example, when the pattern wafer (2) 710 for LEDs is removed by laser liftoff, removal accuracy is enhanced. Further, as described below, since the uneven structures L and A meet the predetermined relationship of average interval, optical scattering properties are increased. Particularly, since the uneven structure L is comprised of a plurality of concave portions 704, the volume change is more increased, the effect of disturbing the waveguide mode is increased, and the light extraction efficiency LEE is enhanced.

In the pattern wafer (2) 710 for LEDs according to this Embodiment descried as the above-mentioned cases 1 and 2, it is preferable that the coverage of the uneven structure A to the uneven structure L exceeds 0% and is less than 100%.

In this case, since the uneven structure A is necessarily provided on the convex portion 703 or concave portion 704 of the uneven structure L, from the above-mentioned principles, the internal quantum efficiency IQE is effectively increased, and it is possible to suppress cracks inside the semiconductor layer. On the other hand, all of the convex portions 703 and concave portions 704 of the uneven structure L are not embedded by the uneven structure A. By this means, it is possible to suppress degradation of the effect of increasing the light extraction efficiency LEE due to the uneven structure L by the uneven structure A. In other words, the effect of concurrently increasing the internal quantum efficiency IQE and the light extraction efficiency LEE is further enhanced.

(Case 3)

Figure 27C:
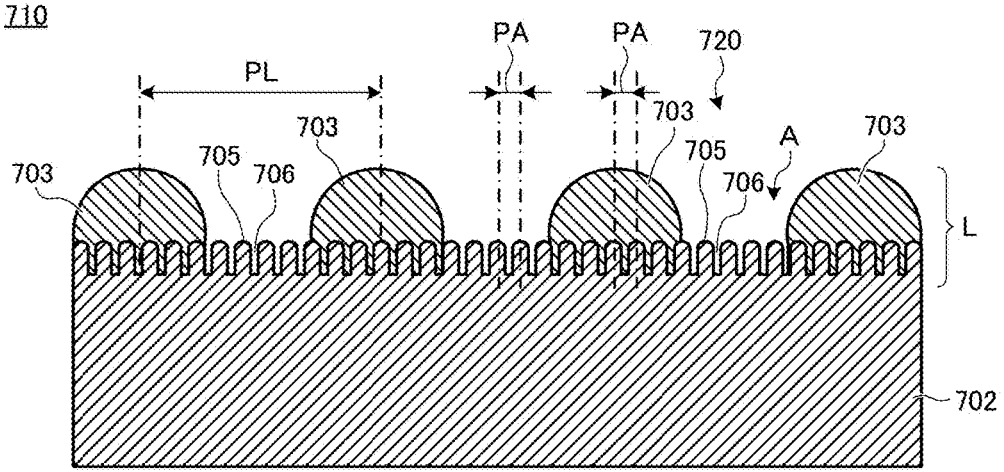

FIG. 27C is a cross-sectional schematic diagram showing another example of the pattern wafer (2) for LEDs. In the pattern wafer (2) 710 for LEDs, the uneven structure 720 is provided on the main surface of the wafer 702 for LEDs, and is comprised of a first uneven structure (hereinafter, referred to as uneven structure A) and a second uneven structure (hereinafter, referred to as uneven structure L). The uneven structure A is comprised of mutually spaced convex portions 705, and concave portions 706 connecting between adjacent convex portions 705. A plurality of convex portions 705 has the average interval PA.

On the other hand, the uneven structure L is comprised of a plurality of convex portions 703, which are provided apart from one another on the surface of the uneven structure A to expose a part of the uneven structure A and are provided on the surfaces of the convex portions 705 and concave portions 706 constituting the uneven structure A. The plurality of convex portions 703 has the average interval PL.

The ratio, which is between the average interval PL of the uneven structure L and the average interval PA of the uneven structure A of the pattern wafer (2) 710 for LEDs described with reference to FIGS. 27B and 27C, exceeds 1 and is 2000 or less. By the ratio exceeding 1 and being 2000 or less, it is possible to deposit the semiconductor layer with cracks suppressed and the internal quantum efficiency IQE increased, and to increase the light extraction efficiency LEE. Particularly, from the viewpoint of increasing the difference between the average interval PL and the average interval PA, and suppressing an obstacle to the light extraction efficiency LEE by the uneven structure A and an obstacle to the internal quantum efficiency IQE by the uneven structure L, the ratio (PL/PA) is preferably 1.1 or more, more preferably 1.5 or more, and further preferably 2.5 or more. Further, from the viewpoints of increasing processing resolution of the uneven structure A, more increasing the internal quantum efficiency IQE, and suppressing cracks, the ratio (PL/PA) is preferably 5.5 or more, more preferably 7.0 or more, and most preferably 10 or more. On the other hand, from the viewpoints of increasing optical scattering properties (light diffraction or light scattering) due to the uneven structure A, and achieving improvements in internal quantum efficiency IQE due to the uneven structure A and improvements in light extraction efficiency LEE due to the uneven structure L and uneven structure A, the ratio (PL/PA) is preferably 700 or less, more preferably 300 or less, and further preferably 100 or less. Further, from the viewpoints of reducing stress applied to the semiconductor layer from the uneven structure L to more suppress cracks, increasing the volume change of the uneven structure L, increasing the density of the uneven structure A, and enhancing processing accuracy of the uneven structure L and the uneven structure A, the ratio (PL/PA) is preferably 50 or less, more preferably 40 or less, and further preferably 30 or less.

As the epitaxial wafer for LEDs using the pattern wafer (2) for LEDs and LED chip, it is possible to adopt the same states as in the case of using the pattern wafer (1) for LEDs. In this case, the uneven structure 720 comprised of the uneven structure L and the uneven structure A of the pattern wafer (2) for LEDs is capable of being replaced with the uneven structure 20 of the pattern wafer (1) for LEDs to read.

Concerning the pattern wafer (2) for LEDs, the ratio (Hbun/Have) of the distance (Hbun) between the surface on the light emitting semiconductor layer side and the surface on the first semiconductor layer side of the light emitting semiconductor layer to the average height (Have) of the uneven structure A corresponds to the ratio (Hbun/Have) as described in the pattern wafer (1) for LEDs.

Concerning the pattern wafer (2) for LEDs, the ratio (Hbu/Have) of the distance (Hbu) between the surface on the light emitting semiconductor layer side of the pattern wafer (2) for LEDs and the surface on the doped first semiconductor layer side of the undoped first semiconductor layer to the average height (Have) of the uneven structure A corresponds to the ratio (Hbu/Have) as described in the pattern wafer (1) for LEDs.

As the shape of the uneven structure AL, for example, it is possible to adopt the line-and-space structure with a plurality of bar-shaped bodies arranged, lattice structure with a plurality of bar-shaped bodies crossing, dot structure with a plurality of dot(convex portion, protrusion)-shaped structures arranged, hole structure with a plurality of hole (concave portion)-shaped structures arranged, and the like. As the dot structure and hole structure, examples thereof are a cone, cylinder, quadrangular pyramid, quadrangular prism, hexagonal pyramid, hexagonal prism, n-gonal pyramid (n≥3), n-gonal prism (n≥3), the shape of a caldera, the shape of a double ring, and the shape of a multi-ring. Herein, the shape of a caldera refers to the shape obtained by bringing the front end of a large cone into contact with the front end of a small hollow cone, and subsequently, pressing the small cone into the large cone, and is also called the volcano type. In addition, these shapes include shapes that the outside diameter of the bottom is distorted, the corner portion of the bottom portion of the n-gon has a radius of curvature exceeding "0" and is rounded, the side surface is curved, and that the vertex portion has a radius of curvature exceeding "0" and is rounded.

In addition, the dot structure is a structure where a plurality of convex portions is arranged independently of one another. That is, each convex portion is separated by a continuous concave portion. In addition, convex portions may be smoothly connected by the continuous concave portion. On the other hand, the hole structure is a structure where a plurality of concave portions is arranged independently of one another. That is, each concave portion is separated by a continuous convex portion. In addition, concave portions may be smoothly connected by the continuous convex portion.

For selecting the dot structure or selecting the hole structure, it is possible to select as appropriate according to the apparatus used in manufacturing the epitaxial wafer for LEDs and use of the LED. Particularly, in an environment for giving priority to suppression of cracks and improvements of the internal quantum efficiency IQE, the uneven structure L is preferably the dot-shaped structure. This is because it is possible to induce Epitaxial Lateral Overgrowth of the semiconductor layer, while suppressing cracks in the top of the convex-portion, and increase the internal quantum efficiency IQE also due to the uneven structure L with a large average interval PL. On the other hand, in an environment for particularly increasing the light extraction efficiency LEE, the uneven structure AL is preferably the hole structure. In the case of hole structure, this is because a change of the refractive index viewed from the semiconductor layer is suitable for optical scattering properties. In addition, the combination (uneven structure L, uneven structure A) of the uneven structure L and uneven structure A may be one of (dot structure, dot structure), (hole structure, hole structure), (dot structure, hole structure), and (hole structure, dot structure).

Described next are the uneven structure A and uneven structure L constituting the uneven structure 720.

Figure 28A:
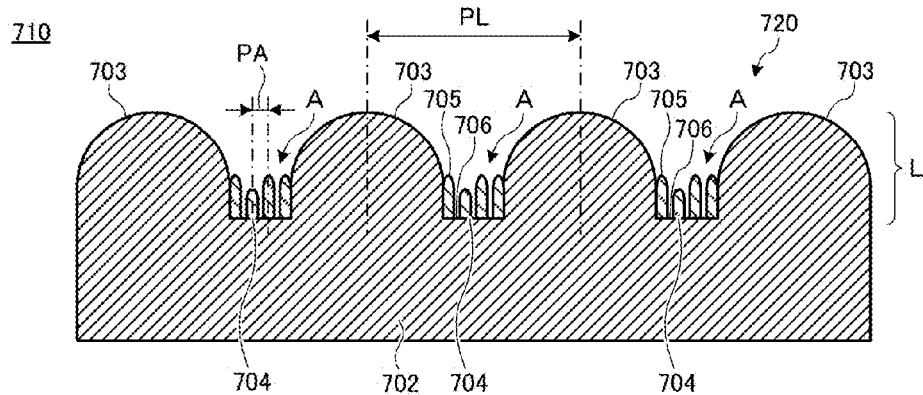
FIG. 28 contains cross-sectional-schematic diagrams showing another example of the pattern wafer (2) for LEDs according to this Embodiment.
Figure 28B:
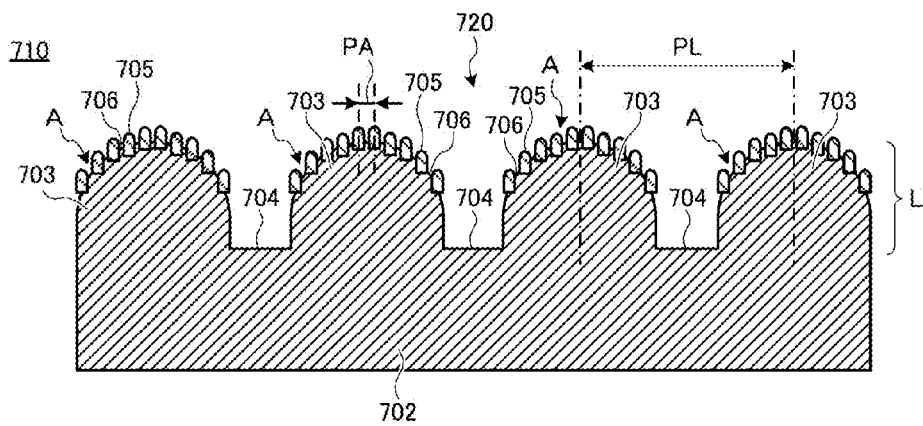
Figure 28C:
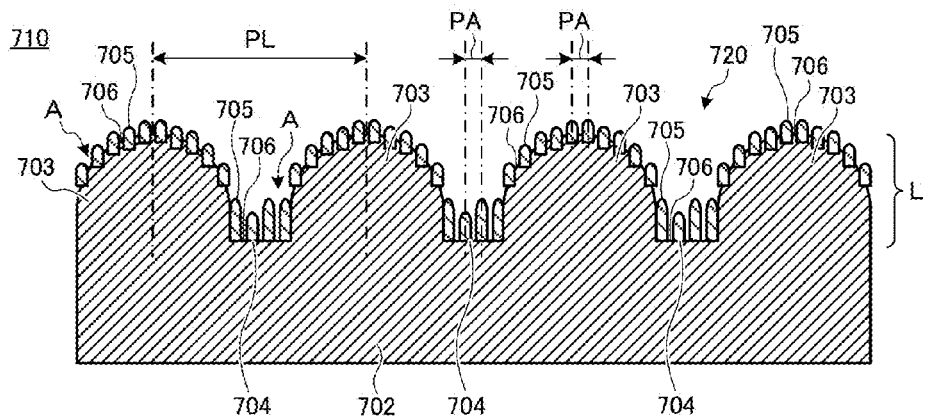

FIG. 28 contains cross-sectional schematic diagrams showing another example of the pattern wafer (2) for LEDs according to this Embodiment, and is the case of including the (Case 1) and (Case 2) described with reference to FIGS. 27A and 27B. As shown in FIGS. 28A to 28C, the uneven structure L with a large volume change is provided on the surface of the pattern wafer (2) 710 for LEDs, and the uneven structure A with a large structure density is provided on surfaces of at least either the convex portions 703 or the concave portions 704 constituting the uneven structure L. By adopting such a configuration, it is possible to increase the internal quantum efficiency IQE, while decreasing cracks due to the uneven structure A, and to increase the light extraction efficiency LEE by optical scattering properties (light diffraction or light scattering) due to the uneven structure L. FIGS. 28A to 28C show arrangement examples of the uneven structure A with respect to the uneven structure L.

Particularly, as shown in FIG. 28A, it is preferable that the first uneven structure L is comprised of a plurality of mutually spaced convex portions 703, and that the convex portions 705 or concave portions 706 constituting the uneven structure A are provided on at least bottom portions of the concave portions 704 of the first uneven structure L.

In this case, as described already in the (Case 1) and (Case 2), since it is possible to start growth of the semiconductor layer from the bottom portion of the concave portion 704 of the uneven structure L as a starting point, the internal quantum efficiency IQE is increased, and it is possible to suppress cracks. Further, it is possible to enhance reliability of the LED. Furthermore, as described already, since the uneven structures L and A meet the predetermined relationship of average interval, optical scattering properties are increased. Particularly, since there is the configuration that the uneven structure A is provided on at least the bottom portion of the concave portion 704, it is possible to more disturb the waveguide mode by light scattering or optical reflection, it is possible to suppress re-waveguide of the waveguide mode, and therefore, the light extraction efficiency LEE is concurrently increased.

Alternatively, as shown in FIG. 28B, it is preferable that the uneven structure L is comprised of a plurality of mutually spaced concave portions 704, and that the convex portions 705 or concave portions 706 constituting the uneven structure A are provided on at least tops of the convex portions 703 of the uneven structure L.

In this case, as described already in the (Case 1) and (Case 2), it is possible to start growth of the semiconductor layer from the vertex portion of the convex portion 703 of the uneven structure L as a starting point. Accordingly, it is possible to effectively reduce dislocations of the semiconductor layer growing from the vertex portion of the convex portion 703 and to suppress cracks. Further, since it is made easy to generate voids inside the concave portion 704, for example, when the pattern wafer (2) 710 for LEDs is removed by laser liftoff, removal accuracy is enhanced. Furthermore, since the uneven structures L and A meet the predetermined relationship of average interval, optical scattering properties are increased. Particularly, since the uneven structure L is comprised of a plurality of concave portions 704, the volume change is more increased, the effect of disturbing the waveguide mode is increased, and the light extraction efficiency LEE is enhanced.

In addition, in the case where the uneven structure A is provided on the surfaces of both the convex portions 703 and the concave portions 704 of the uneven structure L as shown in FIG. 28C, it is possible to achieve both of the effects described with reference to FIGS. 28A and 28B.

In the pattern wafer (2) 710 for LEDs as described above, it is preferable that the coverage of the uneven structure A to the uneven structure L exceeds 0% and is less than 100%.

In this case, since the uneven structure A is necessarily provided on the convex portion 703 or concave portion 704 of the uneven structure L, from the above-mentioned principles, the internal quantum efficiency IQE is effectively increased, and cracks are suppressed. On the other hand, all of the convex portions 703 and concave portions 704 are not embedded by the uneven structure A. By this means, it is possible to suppress degradation of the effect of increasing the light extraction efficiency LEE due to the uneven structure L by the uneven structure A. In other words, it is possible to concurrently increase the internal quantum efficiency IQE and the light extraction efficiency LEE, and to suppress cracks.

Particularly, from the viewpoints of suppressing increases in roughness of the surface of the uneven structure L, and increasing the effect due to the uneven structure L of disturbing the travelling direction of emitted light forming the waveguide mode inside the semiconductor layer, the coverage is preferably 90% or less, more preferably 80% or less, and most preferably 50% or less. Further, from the viewpoint of exerting the effect of increasing the internal quantum efficiency IQE due to the uneven structure A, decreasing a use amount of the semiconductor layer, and enhancing productivity of LEDs, the coverage is preferably 0.01% or more, more preferably 0.1% or more, and most preferably 0.15% or more. In addition, in the case of particularly more increasing the internal quantum efficiency IQE, within the above-mentioned widest range, the coverage preferably ranges from 50% to 90%, more preferably ranges from 60% to 86%, and most preferably ranges from 70% to 84%. In the case of meeting these ranges, it is possible to most effectively develop the effects due to the uneven structure A. On the other hand, in the case of intending to particularly increase the light extraction efficiency LEE, within the above-mentioned widest range, the coverage is preferably in a range of 0.1% to 30%, more preferably in a range of 0.1% to 10%, and most preferably in a range of 0.1% to 5%. By meeting these ranges, since it is possible to prevent the emitted light with the waveguide mode disturbed from forming again the waveguide mode, and therefore, the light extraction efficiency is more increased.

Herein, the coverage is a plane occupancy rate of the convex portion 705 or concave portion 706 of the uneven structure A with respect to the surface of the convex portion 703 or concave portion 704 of the uneven structure L. In other words, in the case of observing some convex portion 703 from the top surface side and assuming that S is a plane area of the convex portion 703 and the concave-portion 704 surrounding the circumference of the contour of the convex portion 703, assuming that Si is a total plane area of the convex portions 705 or concave portions 706 of the uneven structure A inside the observation image, the coverage is (Si/S)×100.

Figure 29A:
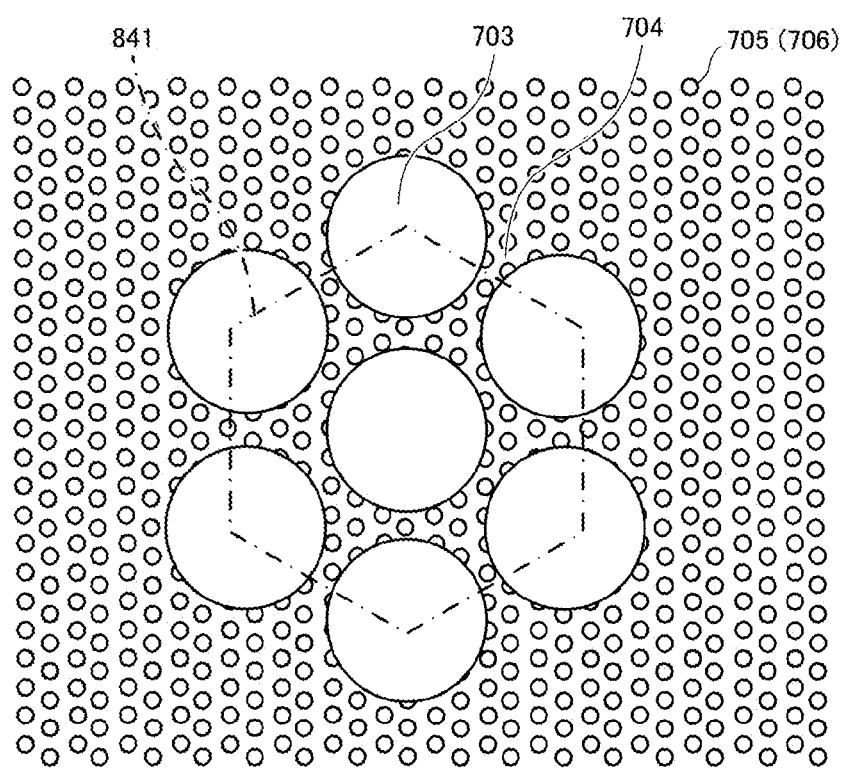
FIG. 29 contains schematic diagrams illustrating an uneven structure in the pattern wafer (2) for LEDs according to this Embodiment.
Figure 29B:
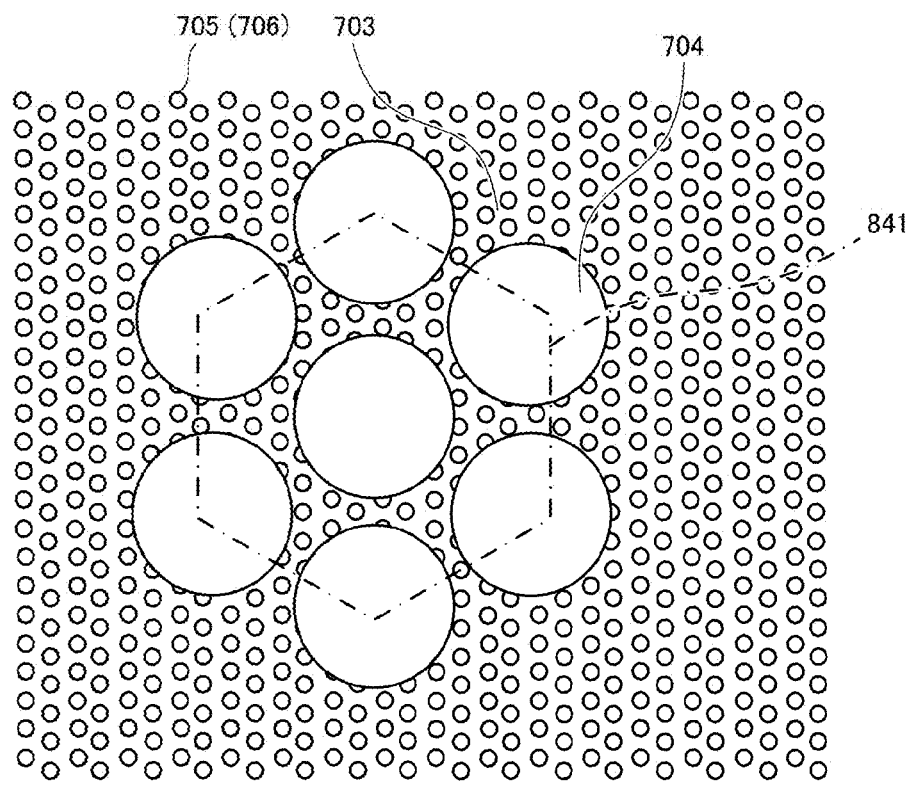

FIG. 29 contains schematic diagram illustrating uneven structures in the pattern wafer (2) for LEDs according to this Embodiment. FIG. 29A shows the case where the uneven structure L is comprised of a plurality of independent convex portions 703, and particularly, shows the case the uneven structure A is provided on the bottom portion of the concave portion 704. Alternatively, the case is shown where the uneven structure L is provided on the surface of the uneven structure A to partially expose the uneven structure A. In this example, each of the contour shape of the bottom portion of the convex portion 703 and the contour shape of the bottom portion of the convex portion 705 is circular. It is assumed that S is the area of the convex portion 703 in a plane image obtained by observing from the vertex portion side of the convex portion 703, and the concave portion 704 surrounding the circumference of the contour of the convex portion 703. Herein, the area S is an area of a polygon 841 made by joining vertex-portion center portions of other convex portions 703 adjacent to some convex portion 703. By assuming that Si is the total area of areas made by contours of the bottom portions of convex portions 705 of the uneven structure A included inside the area A, or the total area of opening portions of concave portions 706, the coverage is given as Si/S×100. In addition, FIG. 29A exemplifies the case where the uneven structure A is disposed on only the bottom of the concave-portion of the uneven structure L, but the arrangement of the uneven structure A is not limited thereto as described already. Similarly, FIG. 29B shows the case where the uneven structure L is comprised of a plurality of independent concave portions 704, and particularly, the uneven structure A is provided on the top surface of the convex portion 703. In this example, the opening shape of the concave portion 704 and the contour shape of the bottom portion of the convex portion 703 are circular. It is assumed that S is the area of the concave portion 704 in a plane image obtained by observing from the vertex portion side of the convex portion 703, and the convex portion 703 surrounding the circumference of the contour of the concave portion 704. Herein, the area S is an area of a polygon 841 made by joining opening-portion center portions of other concave portions 704 adjacent to some concave portion 704. By assuming that Si is the total area of areas made by contours of the bottom portions of convex portions 705 of the uneven structure A included inside the area A, or the total area of opening portions of concave portions 706, the coverage is given as Si/S×100. In addition, FIG. 29B exemplifies the case where the uneven structure A is disposed on only the vertex portion of the convex portion 703 of the uneven structure L, but the arrangement of the uneven structure A is not limited thereto as described already.

In addition, as shown in FIG. 29B, in the case where the uneven structure A is disposed on only the vertex-portion top surface of the convex portion 703 of the uneven structure L, by assuming that ST is the area of the vertex-portion top surface of the convex portion 703 in observing from the vertex portion side of the convex portion 703, and that SiT is the total plane area of the uneven structure A included inside the vertex-portion top surface of the convex portion 703 having the area ST, it is possible to obtain coverage (SiT/ST×100). In addition, this coverage is called the coverage T with respect to the vertex-portion top surface of the convex portion 703.

Similarly, as shown in FIG. 29A, in the case where the uneven structure A is disposed on only the bottom surface of the concave portion 704 of the uneven structure L, by assuming that SB is the area of the bottom surface of the concave portion 704 in observing from the vertex portion side of the convex portion 705, and that SiB is the total plane area of the uneven structure A included inside the bottom surface of the concave portion 704 having the area SB, it is possible to obtain coverage (SiB/SB×100). In addition, this coverage is called the coverage B with respect to the bottom surface of the concave portion 704.

Each of the coverage T with respect to the vertex-portion top surface of the convex portion 703 and the coverage B with respect to the bottom surface of the concave portion 704 preferably ranges from 1% to 90%. Particularly, from the viewpoints of excellently increasing the internal quantum efficiency IQE and enhancing light emission output of the LED, each of the coverage T with respect to the vertex-portion top surface of the convex portion 703 and the coverage B with respect to the bottom surface of the concave portion 704 preferably ranges from 3% to 60%, more preferably ranges from 5% to 55%, and most preferably ranges from 10% to 40%. Further, also when the uneven structure A is provided on the vertex portion of the convex portion 703, side surface of the convex portion 703 and bottom portion of the concave portion 704 of the uneven structure L, it is preferable that a coverage of the uneven structure A with respect to the vertex-portion top surface of the convex portion 703 of the uneven structure L or a coverage of the uneven structure A with respect to the bottom surface of the concave portion 704 of the uneven structure L meets the coverage T with respect to the vertex-portion top surface of the convex portion 703 or the coverage B with respect to the bottom surface of the concave portion 704, respectively.

In addition, in the uneven structure L, when a plurality of convex portions 703 is separately provided on the wafer 702 for LEDs, the uneven structure L is comprised of the main surface of the wafer 702 for LEDs and the plurality of convex portions 703. In this case, the plurality of convex portions 703 corresponds to convex portions of the uneven structure L, and exposed portions, between convex portions 703, of the main surface of the wafer 702 for LEDs correspond to the concave portions 704 of the uneven structure L.

On the other hand, when the uneven structure L is provided by directly processing the wafer 702 for LEDs, materials of the uneven structure L and the wafer 702 for LEDs are the same.

FIG. 28A is the case where the uneven structure L is comprised of a plurality of independent convex portions 703, and the uneven structure A is provided on the surfaces of the concave portions 704 of the uneven structure L. FIG. 28B is the case where the uneven structure L is comprised of a plurality of independent convex portions 703, and the uneven structure A is provided on the surfaces of the convex portions 703 of the uneven structure L. FIG. 28C is the case where the uneven structure L is comprised of a plurality of independent convex portions 703, and the uneven structure A is provided on the surfaces of the convex portions 703 and concave portions 704 of the uneven structure L. In addition, concerning FIGS. 28A to 28C, the shape of the vertex portion of the convex portion 703 of the uneven structure L is drawn in the rounded shape, and as described already, it is also possible to make the shape of the vertex portion of the convex portion 703 of the uneven structure L in the shape of a tabletop and the like.

As shown in FIG. 28A, since the uneven structure A is provided on the concave portions 704 of the uneven structure L, it is possible to excellently increase the internal quantum efficiency IQE. Further, since the concavo-convex L is comprised of a plurality of convex portions 703, the effect of suppressing cracks is increased in the semiconductor layer. This is because growth of the semiconductor layer starts from the concave portion 704 of the uneven structure L. In other words, adherence of the nucleus of the semiconductor layer, growth and coalescence properties of growing semiconductor layers are made excellent due to the uneven structure A, the semiconductor layer with excellent growth properties grows from the concavo portion 704 of the uneven structure L, and it is thereby possible to suppress dislocations in the concave portion 704 of the uneven structure L. In addition, in FIG. 28A, the uneven structure A is not drawn on the side surface portion of the convex portion 703, but it is also possible to provide the uneven structure A on side surface portion of the convex portion 703. In this case, it is considered that the effect of disturbing the waveguide mode is further strengthened, and that it is possible to change the travelling direction of disturbed emitted light more to the thickness direction of the LED. Therefore, it is made easy to select a sealant in packaging the LED.

When the uneven structure L is comprised of the same material as that of the wafer 702 for LEDs, in order to suppress dislocations occurring from the vertex portion of the convex portion 703 of the uneven structure L, such a structure is preferable that the diameter of the convex portion 703 of the uneven structure L decreases from the bottom portion to the vertex portion. Particularly, preferable is a structure that the vertex portion of the convex portion 703 of the uneven structure L continuously connects to the side surface portion of the convex portion 703 of the uneven structure L i.e. a structure that the vertex portion of the convex portion is comprised of the corner portion with a radius of curvature exceeding "0". The uneven structure L is capable of adopting shapes such as the shape of a disk, shape of a cone, the shape of an n-gonal prism (n≥3) and the shape of an n-gonal pyramid (n≥3), and among the shapes, from the viewpoints of enhancing uniformity of growth of the first semiconductor layer and more reducing cracks and dislocations occurring inside the first semiconductor layer, preferable is one of the shape of a cone, the shape of a disk, the shape of a triangular prism, the shape of a triangular pyramid, the shape of a hexagonal prism and the shape of a hexagonal pyramid. In addition, the vertex portion of the pyramid may be a corner portion with a radius of curvature of "0" or a rounded corner portion with a radius of curvature exceeding "0". Particularly, in the case of the shape of a pyramid, by having the corner portion with a radius of curvature exceeding "0", it is possible to suppress cracks occurring in growth of the semiconductor layer, and therefore, long-term reliability of the LED is enhanced. Particularly, in these shapes, it is preferable that the tilt angle of the side surface portion of the convex portion 703 has change points ranging from 1 to 5. In addition, the number of points more preferably ranges from 1 to 3. Further, instead of a liner shape, the side surface portion of the convex portion 703 may be in the shape having a bulge.

On the other hand, when the uneven structure L and the wafer 702 for LEDs are comprised of different materials, as well as shapes such as the shape of a cone and the shape of an n-gonal pyramid (n≥3), the convex portion 703 of the uneven structure L may be of structure such as the shape of a disk and the shape of an n-gonal prism (n≥3) where the tilt angle of the side surface portion of the convex portion 703 is substantially a right angle with respect to the surface forming the bottom portion of the convex portion 703. Particularly, from the viewpoints of enhancing uniformity of growth of the first semiconductor layer, and reducing cracks and dislocations occurring inside the first semiconductor layer, preferable is one of the shape of a cone, the shape of a disk, the shape of a triangular prism, the shape of a triangular pyramid, the shape of hexagonal prism and the shape of a hexagonal pyramid. Further, from the viewpoint of suppressing cracks occurring inside the first semiconductor layer such a structure is preferable that the diameter of the convex portion 703 of the uneven structure L decreases from the bottom portion to the vertex portion. Particularly, in these shapes, it is preferable that the tilt angle of the side surface portion of the convex portion 703 has change points ranging from 1 to 5. In addition, the number of points more preferably ranges from 0.1 to 3. Further, instead of a liner shape, the side surface portion of the convex portion 703 may have a shape having a bulge. In addition, when the uneven structure L and the wafer 702 for LEDs are comprised of different materials, as an absolute value |nL−ns| of a difference between the refractive index nL of the uneven structure L and the refractive index ns of the wafer 702 for LEDs, the absolute value is preferably 0.1 or more. By meeting such a range, it is possible to increase the optical presence of the uneven structure L viewed from the semiconductor layer. In other words, since optical scattering properties are increased, the effect of disturbing the waveguide mode is increased. Furthermore, it is made easy to design light extraction from the side surface direction of the LED or light extraction from the top surface direction.

As shown in FIG. 28B, since the uneven structure A is provided on the convex portions 703 of the uneven structure L, even when a flat surface exists on the vertex portion of the convex portion 703 of the uneven structure L, it is possible to excellently increase the internal quantum efficiency IQE. This is because growth of the semiconductor layer starts from the flat surface of the uneven structure L. In other words, since adherence of the nucleus of the semiconductor layer and growth is made excellent on the flat surface of the vertex portion of the convex portion 703 of the uneven structure L, and coalescence of growing semiconductor layers is also made excellent, cracks are suppressed, the collision of dislocations increases, and the internal quantum efficiency IQE is enhanced. Further, with respect to the semiconductor layer growing from the bottom portion of the concavo portion 704 of the uneven structure L, it is possible to reduce dislocations by Epitaxial Lateral Overgrowth of the semiconductor layer. Alternatively, by the semiconductor layer growing from the vertex portion of the convex portion 703 of the uneven structure L, it is possible to inhibit growth of the semiconductor layer growing from the concave portion 704 of the uneven structure L. Accordingly, the dislocation density of the semiconductor layer is decreased, and it is possible to increase the internal quantum efficiency IQE. In this case, in order to promote growth of the semiconductor layer, it is preferable that the bottom portion of the concave portion 704 of the uneven structure L has a flat surface. Further, such a structure is preferable that the vertex portion of the convex portion 703 of the uneven structure L is smaller than the bottom portion. Further, from the viewpoints of keeping the internal quantum efficiency IQE excellent due to the uneven structure A, it is preferable that the uneven structure A is the dot structure comprised of a plurality of convex portions 705, and that the bottom portion of the concave portion 706 of the uneven structure A has a flat surface. Furthermore, in the structure that the diameter of the convex portion 703 of the uneven structure A decreases from the bottom portion to the vertex portion, dislocation dispersion is more promoted, and therefore, such a structure is preferable. The uneven structure L is capable of adopting shapes such as the shape of a disk, shape of a cone, the shape of an n-gonal prism (n≥3) and the shape of an n-gonal pyramid (n≥3), and among the shapes, from the viewpoints of enhancing uniformity of growth of the first semiconductor layer and reducing cracks and dislocations occurring inside the first semiconductor layer, preferable is one of the shape of a cone, the shape of a disk, the shape of a triangular prism, the shape of a triangular pyramid, the shape of a hexagonal prism and the shape of a hexagonal pyramid. In addition, the vertex portion of the pyramid may be a corner portion with a radius of curvature of "0" or a rounded corner portion with a radius of curvature exceeding "0". Particularly, in the case of the shape of a pyramid, by having the corner portion with a radius of curvature exceeding "0", it is possible to suppress cracks occurring in growth of the semiconductor layer, and therefore, long-term reliability of the LED is enhanced. Particularly, in these shapes, it is preferable that the tilt angle of the side surface portion of the convex portion 703 has change points ranging from 1 to 5. In addition, the number of points more preferably ranges from 1 to 3. Further, instead of a liner shape, the side surface portion of the convex portion 703 may be in the shape having a bulge. Furthermore, when the uneven structure A is provided on the convex-portion 703 vertex portion of the uneven structure L, for example, it is made easy to remove the pattern wafer (2) 710 for LEDs by laser liftoff, and it is thereby possible to increase the emission intensity per charged power of the LED.

By the structure as shown in FIG. 28C, it is possible to combine the effects developed by the structures of FIGS. 28A and 28B as described above.

FIG. 28 exemplifies the case where the uneven structure L is comprised of a plurality of independent convex portions 703, and the uneven structure L may be comprised of a plurality of independent concave portions 704.

Figure 30A:
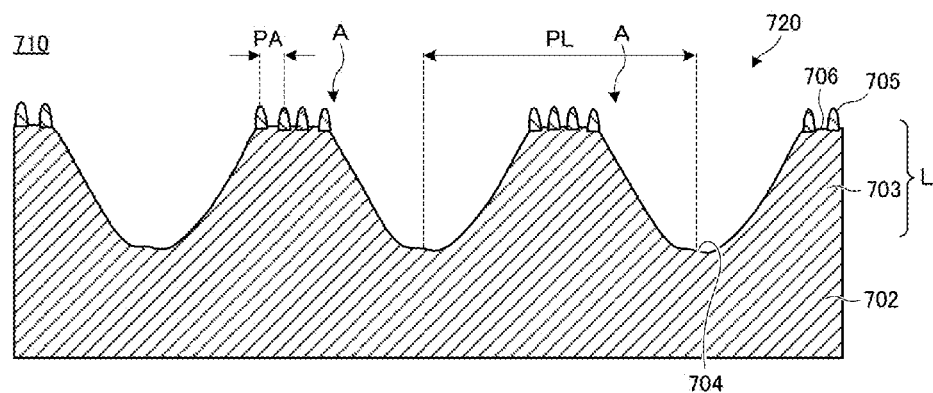
FIG. 30 contains cross-sectional schematic diagrams showing another example of the pattern wafer (2) for LEDs according to this Embodiment.
Figure 30B:
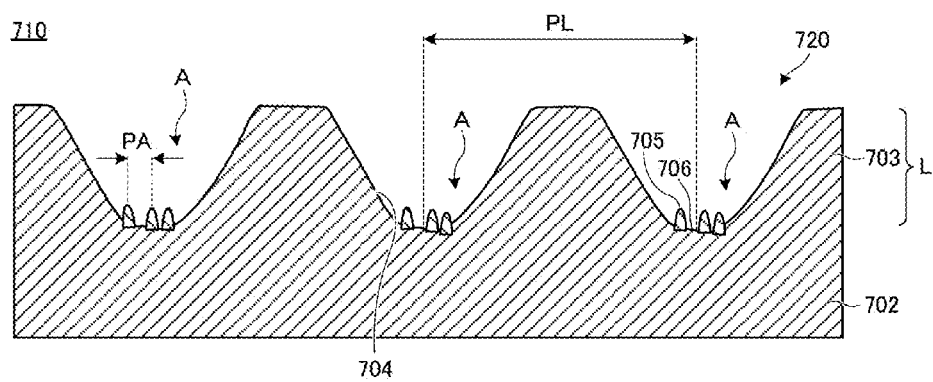
Figure 30C:
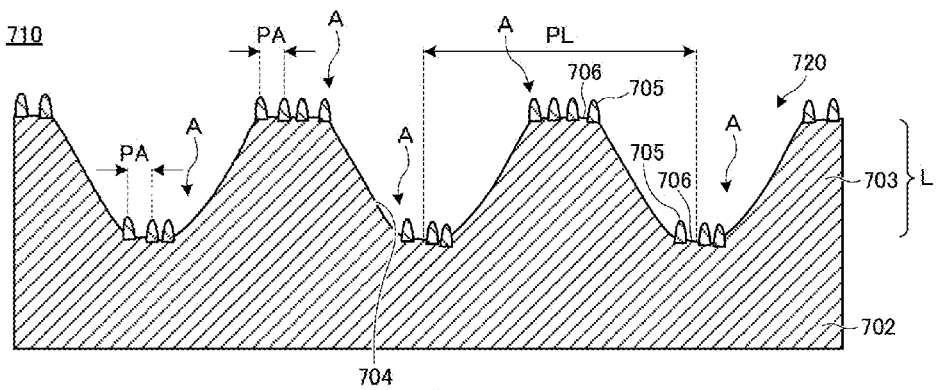

FIG. 30 contains cross-sectional schematic diagrams showing another example of the pattern wafer (2) for LEDs according to this Embodiment. FIG. 30A is the case where the uneven structure L is comprised of a plurality of independent concave portions 704, and the uneven structure A is provided on the surfaces of the convex portions 703 of the uneven structure L. FIG. 30B is the case where the uneven structure L is comprised of a plurality of independent concave portions 704, and the uneven structure A is provided on the surfaces of the concave portions 704 of the uneven structure L. FIG. 30C is the case where the uneven structure L is comprised of a plurality of independent concave portions 704, and the uneven structure A is provided on the surfaces of the convex portions 703 and concave portions 704 of the uneven structure L.

As shown in FIG. 30A, since the uneven structure A is provided on the convex portions 703 of the uneven structure L, it is possible to excellently increase the internal quantum efficiency IQE. Further, since the uneven structure L is comprised of a plurality of independent concave portions 704, it is made easy to form voids inside the concave portion 704 of the uneven structure L. In this case, removal accuracy by laser liftoff is enhanced in the pattern wafer (2) for LEDs. Further, when voids are formed, the difference in the refractive index is significantly increased between the semiconductor layer and the void, and therefore, the degree of increases in light extraction efficiency LEE is sharply increased. This is the same as in the uneven structure shown in FIG. 30B or 30C.

As described above, the principal function of the uneven structure A is to improve the internal quantum efficiency IQE and suppress cracks. Therefore, it is preferable that the material of the uneven structure A is the same as the material constituting the wafer 702 for LEDs. On the other hand, the principal function of the uneven structure L is to improve the light extraction efficiency LEE. Therefore, the material of the uneven structure L may be the same as or different from the material constituting the wafer 702 for LEDs. Examples thereof are a case where both the uneven structure A and the uneven structure L are comprised of sapphire, SiC (silicon carbide), nitride semiconductor, Si (silicon) or spinel, and another case where the uneven structure A is comprised of sapphire, SiC, nitride semiconductor, Si or spinel, and the uneven structure L is one or a mixture of two or more of metal aluminium, amorphous aluminium oxide, polycrystalline aluminium oxide, polycrystalline sapphire, silicon oxide ($SiO_2$), silicon nitride ($Si_3N_4$), silver (Ag), chromium (Cr), nickel (Ni), gold (Au) and platinum (Pt).

FIG. 27C is a cross-sectional schematic diagram showing another example of the pattern wafer (2) for LEDs. As shown in FIG. 27C, the uneven structure A with a high structure density is provided on the surface of the pattern wafer (2) 710 for LEDs, and the uneven structure L with a large volume change is provided on at least a part of the surface of the uneven structure A. More specifically, the uneven structure A comprised of pluralities of convex portions 705 and concave portions 706 is formed on the main surface of the wafer 702 for LEDs, and further, a plurality of convex portions 703 is formed apart from one another to expose a part of the surface of the uneven structure A to constitute the uneven structure L.

By such a configuration, it is possible to improve cracks and increase the internal quantum efficiency IQE due to the uneven structure A exposed between convex portions 703 constituting the uneven structure L, and it is thereby possible to increase the light extraction efficiency LEE by optical scattering properties (light diffraction or light scattering) due to the uneven structure L.

As shown in FIG. 27C, since the uneven structure L is provided on a part of the surface of the uneven structure A, it is possible to increase the internal quantum efficiency IQE and increase the light extraction efficiency LEE. This is because adherence of the nucleus of the semiconductor layer, growth and coalescence of growing semiconductor layers is made excellent due to the uneven structure A, the collision of dislocations excellently occurs to increase the internal quantum efficiency IQE, it is possible to disperse the coalescence portions, and it is thereby possible to suppress cracks. Further, this is because it is possible to disturb the waveguide mode by optical scattering properties due to the uneven structure L.

When the material of the uneven structure L is different from the material of the wafer 702 for LEDs, the uneven structure L may a structure such as the shape of a disk and the shape of an n-gonal prism (n≥3) where the width of the top of the convex-portion is substantially the same as the width of the bottom of the convex-portion. Particularly, from the viewpoint of more excellently suppressing cracks occurring inside the first semiconductor layer, such a structure is preferable that the width of the top of the convex-portion of the uneven structure L is smaller than the width of the bottom of the convex-portion of the uneven structure L.

On the other hand, when materials of the uneven structure L and the wafer 702 for LEDs are the same, in order to suppress dislocations occurring from the vertex portion of the convex portion 703 of the uneven structure L, such a structure is preferable that the vertex portion of the convex portion 703 of the uneven structure L is smaller than the bottom portion thereof. Particularly, preferable is a structure where the vertex portion of the convex portion 703 of the uneven structure L is continuously connected to the side surface portion thereof i.e. structure where the width of the top of the convex-portion is close to "0". In addition, from the study in the pattern wafer (1) for LEDs, it is also conceivable that the expression that the width of the top of the convex-portion is close to "0" is capable of being interpreted as including the case where the size of the tabletop is 100 nm or less.

Further, from the viewpoint of more increasing the internal quantum efficiency IQE also due to the uneven structure L, the uneven structure L is preferably the dot structure comprised of a plurality of convex portions 703. This is because it is possible to reduce dislocations inside the semiconductor layer growing from the concave portion 704 provided between the convex portions 703 by Epitaxial Lateral Overgrowth. From the same effect, it is preferable that the width of the top of the convex-portion of the uneven structure L is smaller than the width of the bottom of the convex-portion.

On the other hand, from the viewpoint of more increasing the internal quantum efficiency IQE, it is preferable that the uneven structure A is the dot structure comprised of a plurality of convex portions 705 and that the bottom portion of the concave portion 706 of the uneven structure A has a flat surface. Further, in a structure where the width of the top of the convex-portion of the uneven structure A is smaller than the width of the bottom of the convex-portion, dislocation dispersion is more promoted, and therefore, such a structure is preferable.

As described above, the principal function of the uneven structure A is to improve the internal quantum efficiency IQE. Therefore, it is preferable that the material of the uneven structure A is the material constituting the wafer 702 for LEDs. On the other hand, the principal function of the uneven structure L is to improve the light extraction efficiency LEE. Therefore, the material of the uneven structure L may be the same as or different from the material of the wafer 702 for LEDs.

By using the pattern wafer (2) 710 for LEDs according to this Embodiment, from the principles described already, it is possible to obtain the semiconductor layer with cracks suppressed and high internal quantum efficiency IQE. Further, the LED chip exhibits high light extraction efficiency LEE. In other words, while efficiently emitting light, it is possible to effectively extract the emitted light to the outside of the LED chip, and it is possible to enhance reliability of the LED chip. Therefore, in the LED device manufactured using the pattern wafer (2) 710 for LEDs according to this Embodiment, a heating value is small. By the heating value being small, it is meant that long-term stability of the LED device is not only increased, and that it is also possible to reduce a load (for example, provision of excessive radiating members) according to measures for heat dissipation.

As materials constituting the uneven structure when materials of the wafer 702 for LEDs and the uneven structure are different from each other, for example, it is possible to use the materials of the wafer 702 for LEDS as described above, and one or a mixture of two or more of metal aluminium, amorphous aluminium Oxide, polycrystalline aluminium oxide, polycrystalline sapphire, silicon oxide ($SiO_2$), silicon nitride ($Si_3N_4$), silver (Ag), chromium (Cr), nickel (Ni), gold (Au) and platinum (Pt).

<<Manufacturing Method of the Pattern Wafer (2) for LEDs>>

Described next are manufacturing methods of the pattern wafer (2) 710 for LEDs according to this Embodiment of the present invention.

As long as the pattern wafer (2) 710 for LEDs according to this Embodiment is provided with the uneven structure meeting the above-mentioned conditions, manufacturing methods thereof are not limited, and it is possible to manufacture by the same manufacturing method as that of the pattern wafer (1) for LEDs.

In the case of the pattern wafer (2) 710 for LEDs, it is possible to manufacture the uneven structure 720 by preparing the uneven structure L, and next, preparing the uneven structure A. The manufacturing methods of the uneven structure L are capable being sorted into two.

(1) The Case of Directly Processing the Wafer for LEDs to Provide the Uneven Structure L As the method of directly processing the wafer 702 for LEDs to provide the uneven structure L, it is possible to manufacture by the transfer method, photolithography method, thermal lithography method, electron beam lithography method, interference exposure method, lithography method using nanoparticles as a mask, lithography method using a self-organizing structure as a mask and the like. Particularly, from the viewpoints of processing accuracy and processing speed of the uneven structure of the wafer 702 for LEDs, it is preferable to adopt the photolithography method or the transfer method. In addition, as the etching method, either of wet etching and dry etching is preferable. Particularly, in the case of precisely controlling the plane direction of the side surface of the convex portion of the uneven structure L, wet etching is preferable. On the other hand, from the viewpoint of precision control of the shape of the uneven structure L, the dry etching method is preferable, and it is possible to adopt the dry etching method as described in the pattern wafer (1) for LEDs. The transfer method is as described in the pattern wafer (1) for LEDs.

(2) The Case of Providing the Uneven Structure L Separately on the Wafer for LEDs As the method of providing the uneven structure L separately on the wafer 702 for LEDs, among the methods are the transfer method, a method of forming a thin film with particles included therein on the wafer 702 for LEDs, and subsequently, removing the binder filling between the particles, another method of removing a part of a resist formed on the wafer 702 for LEDs, filling the removed portion with the material constituting the uneven structure L (for example, deposition, sputtering method, electroforming or the like), and finally, removing the resist, still another method of depositing the material of the uneven structure L on the wafer 702 for LEDs, and directly processing the deposited material of the uneven structure L, and the like.

It is possible to manufacture the uneven structure 720 by preparing the uneven structure L by the above-mentioned method, and next, preparing the uneven structure A.

As the method of providing the uneven structure A on the uneven structure L, among the methods are the transfer method, photolithography method, thermal lithography method, electron beam lithography method, interference exposure method, lithography method using nanoparticles as a mask, lithography method using a self-organizing structure as a mask and the like. Particularly, from the viewpoints of processing accuracy and processing speed of the uneven structure of the wafer pattern for LEDs, it is preferable to adopt the lithography method using nanoparticles as a mask or the transfer method. The transfer method will be described later.

Further, it is possible to manufacture the uneven structure 720 by preparing the uneven structure A, and next, preparing the uneven structure L.

As the method of providing the uneven structure A, among the methods are the transfer method, photolithography method, thermal lithography method, electron beam lithography method, interference exposure method, lithography method using nanoparticles as a mask, lithography method using a self-organizing structure as a mask and the like. Particularly, from the viewpoints of processing accuracy and processing speed of the uneven structure, it is preferable to adopt the lithography method using nanoparticles as a mask or the transfer method. The transfer method is as described in the pattern wafer (1) for LEDs.

It is possible to manufacture the uneven structure 720 by preparing the uneven structure L on the wafer for LEDs provided with the uneven structure A.

It is possible to manufacture the uneven structure 720 by further processing the uneven structure A. As the method of further processing the uneven structure A, it is possible to manufacture by the transfer method, photolithography method, thermal lithography method, electron beam lithography method, interference exposure method, lithography method using nanoparticles as a mask, lithography method using a self-organizing structure as a mask and the like. Particularly, from the viewpoints of processing accuracy and processing speed of the uneven structure of the pattern wafer (2) 710 for LEDs, it is preferable to adopt the photolithography method or the transfer method. The transfer method is as described in the pattern wafer (1) for LEDs.

In the case of separately providing the uneven structure layer having the uneven structure 720 on the wafer 702 for LEDs, it is possible to manufacture the uneven structure 720 by preparing the uneven structure A, and next, preparing the uneven structure L.

As the method of providing the uneven structure A, among the methods are the transfer method, photolithography method, thermal lithography method, electron beam lithography method, interference exposure method, lithography method using nanoparticles as a mask, lithography method using a self-organizing structure as a mask and the like. Particularly, from the viewpoints of processing accuracy and processing speed of the uneven structure, it is preferable to adopt the lithography method using nanoparticles as a mask or the transfer method. The transfer method is as described in the pattern wafer (1) for LEDs.

It is possible to manufacture the pattern wafer (2) 710 for LEDs by separately providing the uneven structure L on the wafer for LEDs provided with the uneven structure A.

As the method of separately providing the uneven structure L, examples thereof are the transfer method, and a method of forming a thin film with particles included therein on the wafer 702 for LEDs, and subsequently, removing the binder filling between the particles. Further, there is another method of removing a part of a resist formed on the wafer 702 for LEDs, filling the removed portion with the material constituting the uneven structure L (for example, deposition, sputtering method, electroforming or the like), and finally, removing the resist. Furthermore, there is still another method of depositing the material of the uneven structure L, and directly processing the deposited film of the uneven structure L.

EXAMPLES

Examples performed to confirm the effects of the present invention will be described below.

Symbols used in the following description represent the following meaning.

DACHP . . . Fluorine-containing urethane (meth)acrylate (OPTOOL (Registered Trademark) DAC HP (made by Daikin Industries, Ltd.))

M350 . . . Trimethylolpropane (EO-modified) triacrylate (made by TOAGOSEI Co., Ltd. M350)

I.184 . . . 1-Hydroxy-cyclohexyl-phenyl-ketone (made by BASF Company Irgacure (Registered Trademark; the same in the following description) 184)

I.369 . . . 2-Benzyl-2-dimethylamino-1-(4-morpholino phenyl)-butanone-1 (made by BASF Company Irgacure 369)

TTB . . . Titanium (IV) tetrabutoxide monomer (made by Wako Pure Chemical Industries, Ltd.)

SH710 . . . Phenyl-modified silicone (made by Dow Corning Toray Co., Ltd.)

3APTMS . . . 3-Acryloxypropyl trimethoxysilane (KBM5103 (made by Shin-Etsu silicone corporation))

MEK . . . Methyl ethyl ketone

MIBK . . . Methyl isobutyl ketone

DR833 . . . Tricyclodecane dimethanol diacrylate (SR833 (made by SARTOMER company))

SR368 . . . Tris(2-hydroxyethyl) isocyanurate triacrylate (SR833 (made by SARTOMER company))

The pattern wafer (1) for LEDs was prepared, the epitaxial wafer for LEDs was prepared using the pattern wafer (1) for LEDs, and the internal quantum efficiency IQE and cracks were evaluated. Next, chipping was performed to compare efficiency of LEDs.

In the following study, in order to prepare the pattern wafer (1) for LEDs, first, (1) a cylindrical master mold was prepared, and (2) a reel-shaped resin mold was prepared by applying a light transfer method to the cylindrical master mold. (3) Subsequently, the reel-shaped resin mold was processed to a film for nano-fabrication. Next, (4) using the film for nano-fabrication, the pattern wafer (1) for LEDs was prepared. Finally, (5) using the pattern wafer (1) for LEDs, the epitaxial wafer for LEDs was prepared, and performance was evaluated. In addition, the uneven structure A was controlled by an uneven structure of the cylindrical master mold prepared in (1), the light transfer method performed in (3), and the film for nano-fabrication prepared in (4).

(1) Preparation of Cylindrical Master Molds

An uneven structure was formed on a surface of cylindrical quartz glass by a direct-write lithography method using a semiconductor laser. First, a resist layer was formed on the cylindrical quartz glass surface by a sputtering method. The sputtering method was performed with power of RF 100 W using CuO of 3-inches (containing 8 atm % Si) as a target (resist layer) to form a resist layer of 20 nm. Next, while rotating the cylindrical quartz glass, the entire surface was exposed using a semiconductor laser with a wavelength of 405 nm. Subsequently, pulse exposure was performed on the exposed resist layer using the semiconductor laser with a wavelength of 405 nm. In addition, the pulse pattern was set to be an regular-hexagonal arrangement. Next, the exposed resist layer was developed. The development of the resist layer was performed for 240 seconds using 0.03 wt % glycine aqueous solution. Next, using the developed resist layer as a mask, etching was performed on the etching layer (quartz glass) by dry etching. The dry etching was performed using $SF_6$ as an etching gas on the conditions that the processing gas pressure was 1 Pa, and that processing power was 300 W. Finally, only the resist layer residual was peeled off from the cylindrical quartz glass provided with the uneven structure on the surface, using hydrochloric acid of pH1. The peeling time was 6 minutes.

The uneven structure of the obtained cylindrical quartz glass was coated with Durasurf (Registered Trademark, the same in the following description) HD-1101Z (made by HARVES Co., Ltd.) that is a fluorine-based mold release agent, heated at 60° C. for 1 hour, and then, allowed to stand at room temperature for 24 hours to fix. Then, cleaning was performed three times using Durasurf HD-ZV (made by HARVES Co., Ltd.) to obtain a cylindrical master mold.

(2). Preparation of Reel-Shaped Resin Molds

Reel-shaped resin molds G1 were prepared successively using the prepared cylindrical master mold as a mold by applying the photo nanoimprint method. Next, using the reel-shaped resin mold G1 as a template, reel-shaped resin molds G2 were obtained successively by applying the photo nanoimprint method.

The material 1 described below was applied to an easy adhesion surface of a PET film A-4100 (made by Toyobo Co., Ltd.: width 300 mm, thickness 100 μm) by Micro Gravure coating (made by Yasui Seiki Co., Ltd.) so that the coating film thickness was 3 μm. Next, the PET film coated with the material 1 was pressed against the cylindrical master mold with a nip roll, and was irradiated with ultraviolet rays at a temperature of 25° C. and humidity of 60% under atmospheric pressure using a UV exposure apparatus (H bulb) made by Fusion UV Systems Japan Co., Ltd. so that the integral amount of exposure below the center of the lamp was 1,500 mJ/cm$^2$, photo-curing was performed successively, and obtained was a reel-shaped resin mold G1 (length 200 m, width 300 mm) with the uneven structure transferred to the surface. Herein, the adjustment was made by the pressing force of the nip roll so that the film thickness of a cured product of the material 1 provided on the PET film was 1,500 nm.

Next, regarding the reel-shaped resin mold G1 as a template, reel-shaped resin molds G2 were prepared successively by applying the photo nanoimprint method. The material 1 was applied to an easy adhesion surface of the PET film A-4100 (made by Toyobo Co., Ltd.: width 300 mm, thickness 100 μm) by Micro Gravure coating (made by Yasui Seiki Co., Ltd.) so that the coating film thickness was 3 μm. Next, the PET film coated with the material 1 was pressed against the uneven structure surface of the reel-shaped resin mold G1 with the nip roll (0.1 MPa), and was irradiated with ultraviolet rays at a temperature of 25° C. and humidity of 60% under atmospheric pressure using the UV exposure apparatus (H bulb) made by Fusion UV Systems Japan Co., Ltd. so that the integral amount of exposure below the center of the lamp was 1,200 mJ/cm$^2$, photo-curing was performed successively, and obtained was a plurality of reel-shaped resin molds G2 (length 200 m, width 300 mm) with the uneven structure transferred to the surface.

Material 1 . . . DACHP: M350: I.184: I.369=17.5 g: 100 g: 5.5 g: 2.0 g (3) Preparation of the Film for Nano-Fabrication The uneven structure surface of the reel-shaped resin mold G2 was coated with a diluent of the following material 2. Next, a diluent of the following material 3 was applied onto the uneven structure surface of the reel-shaped resin mold G2 with the material 2 included inside the uneven structure, and the film for nano-fabrication was obtained.

Material 2 . . . TTB: 3APTMS: SH710: I.184: I.369=65.2 g: 34.8 g: 5.0 g: 1.9 g: 0.7 g Material 3 . . . Binding polymer: SR833: SR368: I.184: I.369=38 g: 11.5 g: 11.5 g: 1.47 g: 0.53 g Binding polymer . . . Methyl ethyl ketone solution of two-dimensional copolymer of benzyl methacrylate 80 mass % and methacrylic acid 20 mass % (solid 50%, weight average molecular weight 29,000)

(2) The material 2 diluted with a mixed solvent of PGME, acetone and isopropanol was directly applied onto the uneven structure surface of the reel-shaped resin mold G2 using the same apparatus as in preparation of the reel-shaped resin mold. Herein, the dilution concentration was set so that the solid amount included in the coating raw material (material 2 diluted with the mixed solvent) per unit area was smaller than the volume of the uneven structure per unit area by 20% or more. After coating, the resultant was passed inside an air-fan oven of 105° C. for 5 minutes, and the reel-shaped resin mold G2 with the material 2 included inside the uneven structure was wound and collected.

Next, while winding off the reel-shaped resin mold G2 with the material 2 included inside the uneven structure, the material 3 diluted with a mixed solvent of PGME, MEK, MIBK and acetone was directly applied onto the uneven structure surface using the same apparatus as in (2) preparation of the reel-shaped resin mold. Herein, setting was made so that the distance between the interface between the material 2 arranged inside the uneven structure and the applied material 3 and the surface of the material 3 was 400 nm to 800 nm. After coating, the resultant was passed inside the air-fan oven of 105° C. for 5 minutes, a cover film comprised of a PET film provided with mold release treatment was bonded to the surface of the material 3, and the resultant was wound and collected.

(4) Manufacturing of the Pattern Wafer (1) 10 for LEDs

As the pattern wafer (1) 10 for LEDs, used was a sapphire wafer of 4-inches of C-surface (0001) with orientation flat existing on the A-surface (11-20).

UV-O$_3$ treatment was performed on the sapphire wafer for 5 minutes to remove particles on the surface, and the surface was made hydrophilic. Next, the material 3 surface of the film for nano-fabrication was bonded to the sapphire wafer. Herein, the uneven structure of the reel-shaped resin mold G2 was the uneven structure with a plurality of concave portions in an regular-hexagonal arrangement. In other words, the film for nano-fabrication included the reel-shaped resin mold G2 provided with the concave portion arrangement with 6-fold symmetry. Herein, the crystal axis of the sapphire wafer and the arrangement axis A of the uneven structure of the film for nano-fabrication were adjusted within the predetermined range of the rotation shift angle Θ to bond. The bonding was performed, while adjusting the rotation shift angle Θ in a state in which the sapphire wafer was heated to 110° C. Next, using a high-pressure mercury-vapor lamp light source, using a UV-LED light source with a center wavelength of 365 nm, the light was applied over the reel-shaped resin mold G2 so that the integral light amount was 1,200 mJ/cm$^2$. Subsequently, the reel-shaped resin mold G2 was peeled off.

Etching (oxygen ashing) using oxygen gas was performed from the material 2 surface side of the obtained layered product (layered product comprised of material 2/material 3/sapphire wafer), nano-fabrication was performed on the material 3 by using the material 2 as the mask, and the sapphire wafer surface was partially exposed. The oxygen ashing was performed on the conditions of processing gas pressure of 1 Pa and power of 300 W. Next, reactive ion etching using a mixed gas of BCl$_3$ gas and Cl$_2$ gas was performed from the material 2 surface side, and the sapphire wafer was subjected to nano-fabrication. The etching was performed on the conditions that ICP: 150 W, BIAS: 50 W, and pressure 0.2 Pa, and a reactive ion etching apparatus (RIE-101iPH, made by SAMCO Inc.) was used.

Finally, the resultant was cleaned with a solution obtained by mixing sulfuric acid and hydrogen peroxide solution in a weight ratio of 2:1, and a plurality of sapphire wafers each provided with the uneven structure 20 i.e. uneven structure A on its surface was obtained.

The shape of the top of the convex-portion of the uneven structure A prepared on the sapphire wafer was adjusted with processing time of the reactive ion etching. In other words, the shape with a tabletop on the top of the convex-portion was prepared by halting the reactive ion etching before the material 3 completely disappeared, and the rounded vertex portion without having any tabletop on the top of the convex-portion was prepared by performing the reactive ion etching until the material 3 completely disappeared. Further, by performing the reactive ion etching excessively i.e. applying over etching, the diameter (Φ) of the bottom portion of the convex portion was adjusted.

(5) Preparation of the Epitaxial Wafer for LEDs

On the obtained pattern wafer (1) for LEDs, as a buffer layer, a low-temperature growth buffer layer of $Al_xGa_{1-x}N$ ($0 \leq x \leq 1$) was deposited in 1.00 Å. Next, as the undoped first semiconductor layer, undoped GaN was deposited, and as the doped first semiconductor layer, Si-doped GaN was deposited. Next, a distortion absorption layer was provided, and then, as the light emitting semiconductor layer, an active layer of multiple quantum well (well layer, barrier layer=undoped InGaN, Si-doped GaN) with a respective film thickness of 60 Å or 250 Å was alternately layered so that the number of well layers was 6 and that the number of barrier layers was 7. On the light emitting semiconductor layer, as the second semiconductor layer, Mg-doped AlGaN, undoped GaN and Mg-doped GaN were layered so as to include an electro-blocking layer. Next, ITO was deposited, and electrode pads were attached after etching processing. In this state, using a probe, a current of 20 mA was passed between the p electrode pad and the n electrode pad, and light emission output was measured.

The internal quantum efficiency IQE was determined from PL intensity. The internal quantum efficiency IQE is defined as (the number of photons emitted from the light emitting semiconductor layer per unit time/the number of electrons injected into the semiconductor light emitting device per unit time). In this Embodiment, as an indicator to evaluate the above-mentioned internal quantum efficiency IQE, (PL intensity measured at 300K/PL intensity measured at 10K) was adopted.

The light extraction efficiency LEE was calculated from the light emission output and the internal quantum efficiency IQE to determine.

Cracks were judged by performing observation on the epitaxial wafer for LEDs with disposition of the semiconductor layer stopped in a facet formation process, from the semiconductor layer surface side, using a light microscope, atomic force microscope and scanning electron microscope. Further, in addition thereto, the epitaxial wafer for LEDs was cut, and scanning electron microscope observation was performed on the cross section of the semiconductor layer to evaluate cracks.

Example 1, Comparative Example 1

In Example 1 and Comparative Example 1 was examined the effect of the shape of the top of the convex-portion. The shape of the top of the convex-portion was observed using the scanning electron microscope. The uneven structure A was an regular-hexagonal arrangement. That is, the structure A was an arrangement with 6-fold symmetry. Further, as the average interval Pave, two types of 300 nm and 900 nm were prepared. The rotation shift angle Θ was set at 300. Under the conditions, comparison was made between the case (Example 1) where the top of the convex-portion was in the shape of a rounded corner portion, and the case (Comparative Example 1) with a tabletop. In addition, the shape in cross section of the top of the convex-portion of Example 1 was the shape of a cone.

[Table 1]

As can be seen from Table 1, in the case (Example 1) where the shape of the top of the convex-portion was a rounded corner portion, it is understood that the internal quantum efficiency IQE was increased, and that cracks were reduced. First, for the internal quantum efficiency IQE, in the case (Example 1) where the shape of the top of the convex-portion was a rounded corner portion, it was confirmed that dislocations collided and disappeared near the concave portion of the uneven structure A from transmission electron microscope observation, and therefore, the reason is conceivable that the dislocation density was decreased. On the other hand, in the case (Comparative Example 1) where the tabletop existed on the top of the convex-portion, it was observed that a dislocation occurred from above the tabletop, and grew in the thickness direction of the semiconductor layer. In other words, since the frequency of collision between dislocations was low and the dislocation density was high, it is considered that the degree of improvements in internal quantum efficiency IQE was low. Next, for cracks, when growth of the semiconductor layer was stopped during the growth to perform detailed observation using scanning electron microscope observation on the surface, in the case (Example 1) where the top of the convex-portion was rounded, it was observed that the semiconductor layer grew preferentially from the concave portion of the uneven structure A and that growing semiconductor layers coalesced excellently. More specifically, when focused on opening portions of hexagons by formed facets, cracks are the density of cracks traveling in the direction perpendicular to the mutually opposite sides in some opening portion and another opening portion adjacent thereto. In the case where the average interval Pave was 300 nm or 900 nm, the crack density was $39 \times 10^9/cm^2$ or $41 \times 10^9/cm^2$, respectively. On the other hand, in the case (Comparative Example 1) where the tabletop existed on the top of the convex-portion, it was observed that voids were formed partially near the outer edge portion of the vertex portion of the convex portion formed of the top of the convex-portion and the side surface portion of the convex portion, by the effect of the semiconductor layer growing from above the top of the convex-portion. It is presumed that cracks occurred with the voids as a trigger. More specifically, in the case where the average interval Pave was 300 nm or 900 nm, the crack density was $93 \times 10^9/cm^2$ or $99 \times 10^9/cm^2$, respectively.

Example 2, Comparative Example 2

In Example 2 and Comparative Example 2 was examined the effect of the rotation shift angle Θ. The arrangement of the uneven structure A was an regular-hexagonal arrangement i.e. arrangement with 0.6-fold symmetry. Further, all the average intervals Pave were set at 300 nm, and all the shapes of the top of the convex-portions were rounded corner portions, and were made the same shape of Example 1. The rotation shift angle Θ was made a parameter, and changed to 0° to 300 every 100. The evaluated samples are summarized in Table 2. In the samples as described in Table 2, the internal quantum efficiency IQE was approximately the same in each of the samples, and was about 90%.

[Table 2]

The crack of the evaluation item of Table 2 was normalized with the case (Comparative Example 2) where the rotation shift angle Θ was 0° as 1. More specifically, as the rotation shift angle Θ was changed to 0°, 10°, 20°, and 30°, the crack density was $81\times10^9/cm^2$, $72\times10^9/cm^2$, $58\times10^9/cm^2$, and $53\times10^9/cm^2$, respectively. From Table 2, it is understood that cracks are reduced, as the rotation shift angle Θ is increased. As the reason, by increasing the rotation shift angle Θ, it is conceivable that adherence properties of the nucleus of the semiconductor layer are made excellent to the bottom portion of the concave portion of the uneven structure A, and that the density of convex portions that growing semiconductor layer passes is decreased. Further, the reason why cracks are made excellent as the rotation shift angle is increased is presumed by the effect of the diameter of the bottom of the convex-portion. In other words, in consideration of the density of convex portions passed by the growing semiconductor layer including the diameter of the bottom of the convex-portion, it is conceivable this is because reductions in the density are remarkable from the point at which the rotation shift angle Θ exceeds about 20°.

As described above, from Example 1 and Example 2, it was understood that such a region is preferable that the top of the convex-portion of the uneven structure A is a rounded corner portion, and that the rotation shift angle Θ exceeds 0°. As described in FIGS. 13 and 14 already as another study, since the FWHM of the semiconductor layer and the CL dark spot density were effectively improved in a region where the crack density was $70\times10^9/cm^2$ or less, it is conceivable that the crystal quality of the semiconductor layer is significantly enhanced due to the effect of crack suppression, by setting the rotation shift angle Φ to exceed 0°, and concurrently, making the shape of the top of the convex-portion a corner portion with a radius of curvature exceeding "0". In addition, in this Embodiment, controllability of the rotation shift angle Φ is ±1°. When the rotation shift angle Φ was 10° or more, suppression of cracks was more effective. Particularly, it is understood that the effect of crack reduction is increased as the rotation shift angle Θ is increased to 10°, 20°, and 30°. In addition, the most preferable case was the case where Θ was 30° i.e. $(180/n)° = (180/6)°$. In addition, although there was a difference in the absolute value, the same tendency was observed in the pattern wafer (1) for LEDs having the shape of FIG. 15. From the fact, it was understood that it is possible to exploit the effect of the rotation shift angle Θ and to effectively suppress cracks, by using the pattern wafer (1) for LEDs including the uneven structure A comprised of top of the convex-portions each having the corner portion with a radius of curvature exceeding "0".

Example 3

In Example 3 were examined more preferable ranges of the average interval Pave. The uneven structure A of the pattern wafer (1) for LEDs was made an regular-hexagonal arrangement (arrangement with 6-fold symmetry), the shape of the top of the convex-portion was made a rounded corner portion, the cross-sectional shape of the top of the convex-portion was made in the shape of a dome, and the rotation shift angle Θ was set at 300. The parameter was the average interval Pave, and was adjusted in a range of 200 nm to 1800 nm. The prepared samples are summarized in Table 3.
[Table 3]
From Table 3, it was understood that the internal quantum efficiency IQE is increased as the average interval Pave is smaller. As the reason, it is presumed that the density of the uneven structure A is increased as the average interval Pave is decreased, and that it is thereby to disperse dislocations of the semiconductor layer. More specifically, it is conceivable that it is possible to increase the frequency of coalescence of growing semiconductor layers, and to disperse coalescence portions. Particularly, it was confirmed that this phenomenon was developed when the shape of the top of the convex-portion was the rounded corner portion. In other words, dislocations were confirmed inside the semiconductor layer positioned on the top of the convex-portion in preparing the convex portion with a tabletop that is not described in Table 3. Therefore, there was the tendency that the internal quantum efficiency IQE was decreased.

In addition, when the light emission output of the LED was evaluated, the output was larger in the case where the average interval was 300 nm than in the case where the average interval was 200 nm. Further, the light emission output was larger in the case where the average interval was 900 nm than in the case where the average interval was 1200 nm or 1500 nm. Furthermore, the output was larger in the case where the average interval was 300 nm than in the case where the average interval was 900 nm. Thus, it is understood that performance of the LED chip is not determined by only the extent of the internal quantum efficiency IQE. This is due to the effect of the light extraction efficiency LEE. In arranging in descending order of the light emission output, the average interval Pave was 300 nm, 900 nm, 700 nm, 450 nm, 1200 nm, 200 nm and 1800 nm. In the case where the average interval Pave is 300 nm, the reason is conceivable that light diffraction acts extremely strongly, the number of diffraction modes is limited, and that, however, the diffraction intensity is high in a predetermined direction. Next, when the average interval Pave is 900 nm or 700 nm, it is conceivable that the diffraction mode intensity is decreased, and that, however, the number of diffraction modes is significantly increased. When the average interval exceeds 1000 nm, it is conceivable that light scattering properties are too strong, the travelling direction of the light guided inside the LED chip is once disturbed, the probability of re-waveguide is thereby increased, and that the light emission output is decreased. From the foregoing, it was understood that the internal quantum efficiency IQE is increased as the average interval Pave is decreased. Further, as the epitaxial wafer for LEDs, it was understood that the average interval Pave preferably ranges from 200 nm to 1200 nm, and more preferably ranges from 300 nm to 900 nm.

Example 4

In Example 4 were examined more preferable ranges of the Duty of the uneven structure A. The uneven structure A of the pattern wafer (1) for LEDs was made an regular-hexagonal arrangement (arrangement with 6-fold symmetry), the shape of the top of the convex-portion was made a rounded corner portion, the cross-sectional shape of the top of the convex-portion was made in the shape of a dome, the rotation shift angle Θ was set at 30°, and the average interval Pave was set at 700 nm. The parameter was the Duty, and was adjusted in a range of 0.29 to 0.93. The prepared samples are summarized in Table 4.
[Table 4]
From Table 4, it is understood that the internal quantum efficiency IQE is significantly changed when the Duty is between 0.86 and 0.93. In the case of the Duty of 0.93, the reason is conceivable that the size of the bottom portion of the concave portion is smaller than the size of the stable nucleus of the semiconductor layer. In other words, it is presumed that adherence of the nucleus and growth properties degraded a little, the effect of dislocation reduction was thereby decreased, and that the internal quantum efficiency IQE was decreased. On the other hand, it is understood that the light extraction efficiency LEE is increased as the Duty is increased. The reason is conceivable that the volume of the convex portion is increased from the viewpoint of the photon, and that the number of modes of light diffraction is thereby increased. In addition, cracks were approximately the same in all the samples. From the foregoing, in the case of viewing as the epitaxial wafer for LEDs, it is understood that the Duty of the uneven structure A is preferably less than 0.93. Further, from the viewpoint of more increasing the external quantum efficiency EQE, it was understood that the Duty is preferably 0.57 or more, and more preferably 0.71 or more. In addition, the crack density was between $40 \times 10^9/cm^2$ and $50 \times 10^9/cm^2$.

Example 5

In Example 5 were examined more preferable ranges of the relationship between the thickness of the first semiconductor layer and the uneven structure A of the epitaxial wafer for LEDs. As parameters, using the film thickness (Hbu) of the undoped first semiconductor layer, the film thickness (Hbun) of the doped first semiconductor layer, and the average interval (Pave) and average height of the uneven structure A, evaluated were the internal quantum efficiency IQE, crack and warpage of the epitaxial wafer for LEDs.

The study results are summarized in Table 5. In addition, the meaning of terms as described in Table 5 is as described below.

No.: Control number of the sample n: Degree of the arrangement of the uneven structure A (n of arrangement with n-fold symmetry)

Pave: The average interval (Pave) of the uneven structure A with the dimension of "nm"

Have: The average height (Have) of the uneven structure A with the dimension of "nm"

Θ: The rotation shift angle Θ with the dimension of "°".

Hbun: The film thickness of the first semiconductor layer with the dimension of "nm"

Hbu: The film thickness of the undoped first semiconductor layer with the dimension of "nm"

Hbun/Have: The ratio of the film thickness of the first semiconductor layer to the average height (Have) of the uneven structure A of a dimensionless value Hbu/Have: The ratio of the film thickness of the undoped first semiconductor layer to the average height (Aave) of the uneven structure A of a dimensionless value IQE: Internal Quantum Efficiency with the dimension of "%".

Crack: Cracks generated in the semiconductor layer with the case equal to Example 1 as ○ and the case equal to Comparative Example 1 as X Warpage: Evaluation made by regarding the case of interfering with chipping as "X", and the case without any problem as "○"

Total: Total evaluation with the IQE and warpage considered

[Table 5]

In addition, Comparative Example 5 as described in Table 5 is the case of using the flat sapphire wafer without being provided with the uneven structure and manufacturing the epitaxial wafer for LEDs as in Example 1.

Further, in all the samples as described in Table 5, the shape of the convex portion was provided with a rounded corner portion. Furthermore, the Duty was set at 0.7.

From Table 5, the following description is understood. When the Hbun/Have is in a range of 6.0 to 346.2, as compared with the case (Comparative Example 5) without being provided with the uneven structure, the internal quantum efficiency IQE is increased to 1.17 time to 1.7 time, and the warpage of the epitaxial wafer for LEDs is also suppressed. The Hbu/Have at this point ranges from 3.3 to 203.8. It is understood that improvements in internal quantum efficiency IQE and reductions in the warpage are more remarkable when the Hbun/Have ranges from 17.6 to 72.5. The Hbu/Have at this point ranges from 9.6 to 42.5. The reason is conceivable that it is possible to disperse and reduce dislocations inside the first semiconductor layer due to the uneven structure A by the Hbun/Have meeting a range of a predetermined value or more, and that it is possible to thin the film thickness of the first semiconductor layer to reduce the warpage by the Hbun/Aave meeting a range of a predetermined value or less. In No. 12, the Hbun/Have is 6.0, the Hbu/Have is 3.3, and both ratios are thus small values. Therefore, as compared with the case (Comparative Example 5) without being provided with the uneven structure, the increase rate of the internal quantum efficiency IQE is slightly low. It is conceivable this is because the dislocation reduction effect is slightly weak inside the first semiconductor layer and limitations are thereby put on increases in performance as semiconductors of the light emitting semiconductor layer and second semiconductor layer. Further, in No. 1, the Hbun/Have is 346.2, Hbu/Have is 203.8, both ratios thus are large values, and it is understood that the warpage of the epitaxial wafer for LEDs affects chipping. From the foregoing, it is understood that it is possible to concurrently improve improvements in internal quantum efficiency IQE and reductions in the warpage with more excellence when the Hbun/Have is in the predetermined range.

(Pattern Wafer (2) for LEDs)

As described above, the pattern wafer (1) for LEDs is described in Examples 1 to 5. In the following Examples, described is the pattern wafer (2) for LEDs with another uneven structure L further added to the pattern wafer (1) for LEDs.

In the following study, using the film for nano-fabrication used in manufacturing the pattern wafer (1) for LEDs in the above-mentioned Examples 1 to 5, the uneven structure A was prepared on the surface of the wafer for LEDs. Next, the uneven structure L was further provided to obtain the pattern wafer (2) for LEDs provided with the uneven structure A and uneven structure L. Finally, using the obtained pattern wafer (2) for LEDs provided with the uneven structures, the epitaxial wafer for LEDs was prepared, chipping was then performed, and the performance was evaluated. In addition, the uneven structure L was controlled by the mask shape and dry etching condition in the photolithography method. The preparation was performed as in Example 1, and the mold release treatment was performed as in Example 1.

Using the same film for nano-fabrication as the film in manufacturing the pattern wafer (1) for LEDs of the above-mentioned Examples 1 to 5, the wafer for LEDs was processed. As the pattern wafer for LEDs, used was a C-surface (0001) sapphire wafer with orientation flat existing on the A-surface (0.11-20). In addition, as the size, the wafer for LEDs of 4-inches was used.

The shape of the top of the convex-portion of the uneven structure A prepared on the sapphire surface was controlled as in the pattern wafer (1) for LEDs of Examples 1 to 5.

By further processing the wafer for LEDs with the uneven structure A i.e. the pattern wafer (1) for LEDs, the uneven structure L was prepared. A film of novolac resin for photoresist was formed on the uneven structure A of the pattern wafer (1) for LEDs by a spin coat method, and was pre-baked on a hotplate of 120° C. Next, lithography was performed to prepare the uneven structure L. Herein, the uneven structure L was made in the dot shape by negative-developing the photoresist to use. The uneven structure L was made the hole structure by positive-developing the photoresist to use. In both of the cases, as the uneven structure L, the convex portions or concave portions were arranged in an regular-hexagonal arrangement, and the average interval PL was set at 3.2 μm.

The obtained pattern wafer (2) for LEDs was observed with the scanning electron microscope. The dot-shaped uneven structure L was the dot-shaped body as described below.

The average interval PL was 3.2 μm, and the dots were in the regular-hexagonal arrangement.

The bottom-portion diameter of the dot was 2.4 μm, and the bottom-portion shape was approximately circular.

The bottom of the concave-portion between dots was flat.

A flat surface existed on the dot vertex portion, and the dot was in the shape of a circular truncated cone. The flat surface on the dot vertex portion was approximately circular, and the diameter thereof was 1.6 μm.

The dot vertex portion was an approximately circular tabletop, and the uneven structure A was disposed on only the dot vertex portion.

On the other hand, the hole-shaped uneven structure L was the hole-shaped body as described below.

The average interval PL was 3.2 μm, and the holes were in the regular-hexagonal arrangement.

The opening-portion diameter of the hole was 1.5 μm, and the opening-portion shape was approximately circular.

The depth of the hole was 1.4 μm.

The top of the convex-portion between holes was flat, and the uneven structure A was disposed on only the flat surface.

The shape of the hole was a cone with the approximately circular bottom portion, and the vertex portion of the cone was a corner portion with a radius of curvature exceeding "0".

Further, another uneven structure L was also prepared. First, a film of spin-on glass was formed on the uneven structure A of the pattern wafer (1) for LEDs by the spin coat method, and then, was baked to be $SiO_2$. At this point, it was confirmed that the uneven structure A was flattened by $SiO_2$. Next, a film of novolac resin for photoresist was formed on the $SiO_2$ by the spin coat method, and was baked on the hotplate of 120° C. Next, lithography was performed to process only the $SiO_2$, and the uneven structure L was prepared. Herein, the photoresist underwent positive development, and approximately disk-shaped $SiO_2$ was partially prepared on the surface of the uneven structure A. The average interval PL was set at 3.2 μm, and the arrangement was made an regular-hexagonal arrangement.

The obtained pattern wafer (2) for LEDs was observed with the scanning electron microscope, and the $SiO_2$ pattern (uneven structure L) was the dot-shaped body as described below.

The average interval PL was 3.2 μm, and the dots were in the regular-hexagonal arrangement.

The bottom-portion diameter of the dot was 1.5 μm, and the bottom-portion shape was approximately circular.

The uneven structure A was provided on the bottom of the concave-portion between dots.

On the obtained pattern wafer (2) for LEDs, as a buffer layer, a low-temperature growth buffer layer of $Al_xGa_{1-x}N$ ($0 \leq x \leq 1$) was deposited in 100 Å. Next, as the undoped first semiconductor layer, undoped GaN was deposited, and as the doped first semiconductor layer, Si-doped GaN was deposited. Next, a distortion absorption layer was provided, and then, as the light emitting semiconductor layer, an active layer of multiple quantum well (well layer, barrier layer=undoped InGaN, Si-doped GaN) with a respective film thickness of 60 Å or 250 Å was alternately layered so that the number of well layers was 6 and that the number of barrier layers was 7. On the light emitting semiconductor layer, as the second semiconductor layer, Mg-doped AlGaN, undoped GaN and Mg-doped GaN were layered so as to include an electro-blocking layer. Next, ITO was deposited, and electrode pads were attached after etching processing. In this state, using the probe, a current of 20 mA was passed between the p electrode pad and the n electrode pad, and light emission output was measured.

The internal quantum efficiency IQE was determined from PL intensity. The internal quantum efficiency IQE is defined as (the number of photons emitted from the light emitting semiconductor layer per unit time/the number of electrons injected into the LED per unit time). In this Embodiment, as an indicator to evaluate the above-mentioned internal quantum efficiency IQE, (PL intensity measured at 300K/PL intensity measured at 10K) was adopted.

The light extraction efficiency LEE was calculated from the light emission output and the internal quantum efficiency IQE to determine.

Cracks were judged by performing observation using a light microscope, atomic force microscope and scanning electron microscope, from the semiconductor layer surface side of the epitaxial wafer for LEDs with the semiconductor layer deposited; Further, in addition thereto, the epitaxial wafer for LEDs was cut, and scanning electron microscope observation was performed on the cross section of the semiconductor layer to evaluate cracks. In addition, for the evaluation of cracks was used the wafer with disposition of the semiconductor layer stopped during facet formation.

Example 6, Comparative Example 6

The following items were examined in Example 6.
1. Comparison between Patterned Sapphire Substrate (PSS) of conventional techniques i.e. pattern wafer for LEDs with only the uneven structure L and the pattern wafer (2) for LEDs having both the uneven structure A and the uneven structure L
2. Effect of the shape of the top of the convex-portion of the uneven structure A
3. Difference between the dot-shaped uneven structure L and the hole-shaped uneven structure L
4. Difference between the case where the uneven structure A was provided on the top of the convex-portion of the uneven structure L and the case where the uneven structure A was provided on the bottom of the concave-portion of the uneven structure L The shape of the top of the convex-portion of the uneven structure A was observed using the scanning electron microscope. The uneven structure A was the regular-hexagonal arrangement. That is, the structure A was an arrangement with 6-fold symmetry. Further, the average interval PA was set at 300 nm, and the diameter of the bottom of the convex-portion was set at 220 nm. The rotation shift angle Θ was set at 30°. Under the conditions, each of the case where the top of the convex-portion was in the shape of a rounded corner portion and the case with a tabletop was prepared by changing the processing time of reactive ion etching. In addition, in assuming the cross-sectional shape of the convex portion, in the counter of the cross section, the shape of the rounded corner portion is a shape that curves slightly bulged upward in the shape of a convexity cross each other on the vertex portion of the convex portion. In other words, the side surface portion of the convex portion is the shape slightly bulged upward. Further, in the PSS that was a sample of Comparative Example 6, only the uneven structure L was prepared by the photolithography method as described above. The prepared samples are described in Table 6.

The meaning of terms as described in Table 6 is as described below.

n . . . Degree of rotational symmetry of the uneven structure A.

PA . . . The average interval of the uneven structure A with the dimension of "nm".

Θ . . . The rotation shift angle Θ of the uneven structure A with the dimension of "°"

Top of the convex-portion shape . . . Shape of the vertex portion of the convex portion of the uneven structure A. The tabletop (100 nm) means that the diameter of the flat surface of the vertex portion of the convex portion of the uneven structure A was 100 nm.

m . . . Degree of rotational symmetry of the uneven structure L.

PL . . . The average interval of the uneven structure L with the dimension of "nm".

Structure . . . In the case of providing the uneven structure L by directly processing the uneven structure A by the above-mentioned method, the case where the uneven structure L was in the shape of dots is described as dot, and the case where the uneven structure L was in the shape of holes is described as holl. Further, the case of providing convex portions of the uneven structure L made of $SiO_2$ separately on the surface of the uneven structure A is described as $SiO_2$. These terms are also used in Examples 7 to 9, and are the same meaning.

A on L . . . Case where the uneven structure A was disposed on the vertex-portion top surface of the convex portion of the uneven structure L A in L . . . Case where the uneven structure A was disposed in the bottom portion of the concave portion of the uneven structure L PL/PA . . . Ratio between the average interval PL and the average interval PA IQE . . . Internal Quantum Efficiency with a value calculated by the method described already. The dimension is "%".

Light emission output ratio . . . Light emission output normalized with the case (Comparative Example 6) of only the uneven structure L as "1"

Crack . . . Cracks observed with the light microscope. ▲ represents the case where LED chips with abnormality occurring in the light-emission output were 10% or more, ○ represents the case where such chips were 5% or more and less than 10%, and ⊚ represents the case where such chips were less than 5%.

[Table 6]

As can be seen from Table 6, as compared with the case (Comparative Example 6) with only the uneven structure L, in the case where both the uneven structure A and the uneven structure are provided, it is understood that all the crack, internal quantum efficiency IQE and light emission output are improved. In the case of Comparative Example 6, it is due to the fact that it is possible to increase the light extraction efficiency LEE by the uneven structure L of micro-scale, the density of the uneven structure L is low, and that it is thereby not possible to improve the internal quantum efficiency IQE. By the uneven structure A being provided, it was confirmed that dislocations disappeared and were reduced from transmission electron microscope observation. In other words, in the case where the uneven structure A is provided, it is possible, to start growth of the semiconductor layer from the concave portion of the uneven structure A. By this means, dislocations are reduced. Further, reductions in the dislocation are based on coalescence of growing semiconductor layers as the principles, and therefore, the coalescence portions are capable of being dispersed by the uneven structure A. By this means, residual stress to the semiconductor layer was reduced, and it is presumed that cracks were suppressed.

In the case where both the uneven structure. A and the uneven structure L are provided, it is understood that the shape of the vertex portion of the convex portion of the uneven structure A affects more strongly than the uneven structure L species. In the case where the shape of the vertex portion of the convex portion of the uneven structure A is a rounded corner portion, it is understood that the internal quantum efficiency IQE is more increased, and that cracks are reduced. First, for the internal quantum efficiency IQE, in the case where the shape of the top of the convex-portion was a rounded corner portion, it was confirmed that the probability that dislocations collide with each to disappear was high near the concave portion of the uneven structure by transmission electron microscope observation. The crack density estimated from the scanning electron microscope observation image was $51 \sim 57 \times 10^9/cm^2$, in the case where the shape of the vertex portion of the uneven structure A was a rounded corner portion. On the other hand, in the case where the tabletop existed on the vertex portion, it was observed that dislocations were generated from above the tabletop, and grew in the thickness direction of the semiconductor layer. Further, when growth of the semiconductor layer was stopped during the growth, and the surface was observed in detail using scanning electron microscope observation, in the case of the rounded top of the convex-portion, it was observed that the semiconductor layer grew preferentially from the concave portion of the uneven structure, and that growing semiconductor layers coalesced excellently. The crack density estimated from the scanning electron microscope observation image was $82 \sim 89 \times 10^9/cm^2$. On the other hand, in the case where the tabletop existed on the top of the convex-portion, by the effect of the semiconductor layer growing from above the top of the convex-portion, it was observed that the frequency of partial formation of voids was slightly high near the outer edge portion of the vertex portion of the convex portion formed of the top of the convex-portion and the side surface portion of the convex portion. In other words, from the viewpoints of increasing the frequency of collision of dislocations and effectively reducing the dislocation density, it was understood that the top of the convex-portion of the uneven structure A is a corner portion with a radius of curvature exceeding "0". In addition, these tendencies were capable of being observed as the similar tendencies in the shape of the convex portion as described in FIG. 15.

Further, by comparing arrangements of the uneven structure A with respect to the uneven structure L, it was understood that the increase in internal quantum efficiency IQE was the highest in the case where the uneven structure A was provided in the bottom of the concave-portion of the uneven structure L. In the study, a plurality of convex portions of the uneven structure L made of $SiO_2$ was provided on the surface of the uneven structure A. In other words, the study was made on the condition that growth of the semiconductor layer was not started from the top of the convex-portion of the uneven structure L. Therefore, it was possible to grow the semiconductor layer preferentially from the concave portion of the uneven structure L. Herein, since the uneven structure A was provided in the bottom of the concave-portion of the uneven structure L, based on the phenomenon as described already, it is considered that dislocations of the semiconductor layer were reduced, and that cracks were suppressed.

Example 7, Comparative Example 7

In Example 7 was examined the effect of the rotation shift angle Θ. The arrangement of the uneven structure A was an regular-hexagonal arrangement i.e. arrangement with 6-fold symmetry. Further, all the average intervals PA were set at 300 nm, all the shapes of the top of the convex-portions were rounded corner-portions, and all the diameters of the bottom of the convex-portions were set at 220 nm. The rotation shift angle Θ was made a parameter, and changed to 0° to 300 every 10°. Further, as the uneven structure L, two types of hole type (holl) and SiO$_2$ were prepared and evaluated. The case of hole type was made A on L, and the case of SiO$_2$ was made A in L. The evaluated samples are summarized in Table 7.

[Table 7]

In the samples as described in Table 7, the internal quantum efficiency IQE was approximately the same in each of the samples in the case that the uneven structure was the hole type, and was about 75%. Further, the internal quantum efficiency IQE was also approximately the same in each of the samples in the case that the uneven structure was SiO$_2$, and was about 85%.

The crack of the evaluation item of Table 7 was normalized with the case where the rotation shift angle Θ is 0° as 1 to describe. More specifically, in the case where the uneven structure L was the hole type, as the rotation shift angle Θ was changed to 0°, 10°, 20°, and 30°, the crack density was changed to $99 \times 10^9/cm^2$, $87 \times 10^9/cm^2$, $69 \times 10^9/cm^2$, and $66 \times 10^9/cm^2$, respectively. On the other hand, in the case where the uneven structure was SiO$_2$, the crack density was changed to $81 \times 10^9/cm^2$, $69 \times 10^9/cm^2$, $56 \times 10^9/cm^2$, and $54 \times 10^9/cm^2$. From Table 7, it is understood that cracks are reduced, as the rotation shift angle Θ is increased. This is because the effect of the uneven structure A of the pattern wafer (1) for LEDs is exerted also in the case of providing the uneven structure L. In addition, these tendencies were capable of being observed as the similar tendencies in the shape of the convex portion as described in FIG. 15.

As described above, from Example 6 and Example 7, it was understood that it is possible to improve the internal quantum efficiency IQE, light extraction efficiency LEE, and cracks by providing both the uneven structure A and the uneven structure L. Further, it was understood that the increase of the internal quantum efficiency IQE and crack suppression effect are more increased when the top of the convex-portion of the uneven structure is a rounded corner portion. Furthermore, it was understood that the semiconductor layer with cracks suppressed and high internal quantum efficiency IQE was deposited when the rotation shift angle Φ was 10° or more. Particularly, it is understood that the effect of warpage reduction is increased as the rotation shift angle Θ is increased to 10°, 20°, and 30°. In addition, the most preferable case was the case where Θ was 30° i.e. (180/n)°=(180/6)°.

Example 8

In Example 8 were examined more preferable ranges of the ratio of the average interval PA and the average interval PL. The uneven structure A of the pattern wafer (2) for LEDs was made an regular-hexagonal arrangement (arrangement with 6-fold symmetry), the shape of the top of the convex-portion was made a rounded corner portion, and the rotation shift angle Θ was set at 30°. The parameter was average interval PL/average interval PA, and was adjusted by fixing the average interval PL and changing the average interval PA. The average interval PA was adjusted in a range of 200 nm to 1800 nm. Further, as the uneven structure L, adopted were the hole type (holl) and A on L with the average interval PL of 3000 nm. The prepared samples are summarized in Table 8.

[Table 8]

From Table 8, it was understood that the internal quantum efficiency IQE is increased as the ratio (PL/PA) is larger. The reason is conceivable that the effect of the uneven structure A is capable of being developed more excellence, as the ratio (PL/PA) is larger, also in the case where the uneven structure L is provided. Particularly, the large ratio (PL/PA) means that the presence of the uneven structure A decreases from the viewpoint of the uneven structure L. In other words, from the viewpoint of the semiconductor layer flying by CVD, the uneven structure L is first identified. Then, when the layer gets near to the surface of the uneven structure L, the layer is capable of first recognizing the presence of the uneven structure A. In viewing from the other side, it is meant that excellent growth is achieved on the surface of the uneven structure A without undergoing the effect of large structure of the uneven structure L. Actually, as a result of checking a growth extent with the scanning electron microscope by halting growth of the semiconductor layer during the growth, it was confirmed that the frequency of coalescence of growing semiconductor layers was higher as the ratio (PL/PA) was larger, and that coalescence portions were-capable of being dispersed. Particularly, it was confirmed that this phenomenon was developed more excellently when the shape of the top of the convex-portion was a rounded corner portion. In other words, in preparing convex portions with respective tabletops arbitrarily, increased was the frequency of identifying dislocations inside the semiconductor layer positioned on the vertex portion of the convex portion. Therefore, the internal quantum efficiency IQE tended to decrease. From the foregoing, it was understood that the ratio (PL/PA) preferably exceeds 2.7, is more preferably 3.6 or more, and most preferably 4.6 or more.

In addition, when the light emission output of LEDs was evaluated, the output was higher in the case of the ratio (PL/PA) of 10.7 than in the case of the ratio (PL/PA) of 16.0. Further, the output was higher in the case of the ratio (PL/PA) of 3.6 than in the case of the ratios (PL/PA) of 2.7 and 1.8. Furthermore, the output was higher in the case of the ratio (PL/PA) of 10.7 than in the case of the ratio (PL/PA) of 3.6. Thus, it is understood that performance of the LED is not determined by only the degree of the internal quantum efficiency IQE. This is the effect of the light extraction efficiency LEE. In arranging in descending order of the light emission output, the ratio (PL/PA) was 10.7, 3.6, 4.6, 7.1, 2.7, 16.0 and 1.8. In the case where the ratio (PL/PA) is 10.7, the reason is conceivable that light diffraction acts extremely strongly, the number of diffraction modes is limited, and that, however, the diffraction intensity is high in a predetermined direction. Next, when the ratio (PL/PA) is 3.6 or 4.6, it is conceivable that the diffraction mode intensity is decreased, and that, however, the number of diffraction modes is significantly increased. When the ratio (PL/PA) falls below 3.6, it is conceivable that light scattering properties are too strong, the travelling direction of the light guided inside the LED is once disturbed, the probability of re-waveguide is thereby increased, and that the light emission output is decreased. From the foregoing, it was understood that the internal quantum efficiency IQE is increased as the ratio (PL/PA) is increased. Further, as the LED, it was understood that the ratio (PL/PA) preferably ranges from 2.7 to 16.0, and more preferably ranges from 3.6 to 10.7. In addition, the same study was made also in the case where the uneven structure L was $SiO_2$, and the same tendency as in Example 8 was observed.

Example 9

In Example 9 were examined more preferable ranges of the Duty of the uneven structure A. The uneven structure A of the pattern wafer (2) for LEDs was made an regular-hexagonal arrangement (arrangement with 6-fold symmetry), the shape of the top of the convex-portion was made a rounded corner portion, the rotation shift angle Θ was set at 300, and the average interval PA was set at 300 nm. The parameter was the Duty, and was adjusted in a range of 0.17 to 0.96. As the uneven structure L was prepared the hole type (holl) The prepared samples are summarized in Table 9.
[Table 9]
From Table 9, it is understood that the internal quantum efficiency IQE is significantly changed when the Duty is between 0.73 and 0.99. In the case of the Duty of 0.96, the reason is conceivable that the size of the bottom portion of the concave portion of the uneven structure A is smaller than the size of the stable nucleus of the semiconductor layer. In other words, it is presumed that adherence of the nucleus and growth properties degraded a little, the effect of dislocation reduction was thereby decreased, and that the internal quantum efficiency IQE was decreased. On the other hand, it is understood that the light extraction efficiency LEE is increased as the Duty is increased. In other words, it is understood that it is possible to add the function of improving the light extraction efficiency LEE by adjustments of the Duty, in addition to crack suppression and improvements in internal quantum efficiency IQE which are the basic functions of the uneven structure A. The reason is conceivable that the volume of the convex portion is increased from the viewpoint of the photon, and that the number of modes of light diffraction is increased. In addition, cracks were approximately the same in all the samples, and were in a range of $49 \times 10^9/cm^2$ to $52 \times 10^9/cm^2$. From the foregoing, in the case of viewing as the LED, it is understood that the Duty of the uneven structure A is preferably less than 0.96.

Further, from the viewpoint of more increasing the external quantum efficiency EQE, it was understood that the Duty is preferably 0.53 or more, and more preferably 0.63 or more. In addition, the same study was made also in the case where the uneven structure L was $SiO_2$, and the same tendency as in Example 9 was observed.

The present invention is applicable to LEDs, and particularly, is suitably applicable to GaN-based semiconductor light emitting devices applied to blue LEDs, ultraviolet LEDs and white LEDs.

The present application is based on Japanese Patent Application No. 2013-116025 filed on May 31, 2013, and Patent Application No. 2013-116024 filed on May 31, 2013, entire contents of which are expressly incorporated by reference herein.

TABLE 1

| | n | Pave (nm) | Θ (°) | TOP SHAPE OF THE CONVEX-PORTION | IQE (%) | CRACK |
|---|---|---|---|---|---|---|
| EXAMPLE 1 | 6 | 300 | 30 | ROUNDED CORNER PORTION | 92 | ○ |
| | 6 | 900 | 30 | ROUNDED CORNER PORTION | 86 | ○ |
| COMPARATIVE EXAMPLE 1 | 6 | 300 | 30 | TABLETOP (100 nm) | 73 | Δ |
| | 6 | 900 | 30 | TABLETOP (300 nm) | 67 | Δ |

TABLE 2

| | n | Pave (nm) | Θ (°) | TOP SHAPE OF THE CONVEX-PORTION | CRACK |
|---|---|---|---|---|---|
| COMPARATIVE EXAMPLE 2 | 6 | 300 | 0 | ROUNDED CORNER PORTION | 1 |
| EXAMPLE 2 | 6 | 300 | 10 | ROUNDED CORNER PORTION | 0.89 |
| | 6 | 300 | 20 | ROUNDED CORNER PORTION | 0.72 |
| | 6 | 300 | 30 | ROUNDED CORNER PORTION | 0.66 |

TABLE 3

| | n | Pave (nm) | Θ (°) | TOP SHAPE OF THE CONVEX-PORTION | IQE (%) |
|---|---|---|---|---|---|
| EXAMPLE 3 | 6 | 200 | 30 | ROUNDED CORNER PORTION | 96 |
| | 6 | 300 | 30 | ROUNDED CORNER PORTION | 93 |
| | 6 | 450 | 30 | ROUNDED CORNER PORTION | 91 |
| | 6 | 700 | 30 | ROUNDED CORNER PORTION | 88 |
| | 6 | 900 | 30 | ROUNDED CORNER PORTION | 83 |
| | 6 | 1200 | 30 | ROUNDED CORNER PORTION | 76 |
| | 6 | 1800 | 30 | ROUNDED CORNER PORTION | 68 |

TABLE 4

|  | n | Pave (nm) | DUTY | θ (°) | TOP SHAPE OF THE CONVEX-PORTION | IQE (%) | LEE (%) | CRACK |
|---|---|---|---|---|---|---|---|---|
| EXAMPLE 4 | 6 | 700 | 0.29 | 30 | ROUNDED CORNER PORTION | 88 | 52 | ○ |
|  | 6 | 700 | 0.43 | 30 | ROUNDED CORNER PORTION | 87 | 55 | ○ |
|  | 6 | 700 | 0.57 | 30 | ROUNDED CORNER PORTION | 89 | 58 | ○ |
|  | 6 | 700 | 0.71 | 30 | ROUNDED CORNER PORTION | 88 | 63 | ○ |
|  | 6 | 700 | 0.79 | 30 | ROUNDED CORNER PORTION | 88 | 65 | ○ |
|  | 6 | 700 | 0.86 | 30 | ROUNDED CORNER PORTION | 86 | 67 | ○ |
|  | 6 | 700 | 0.93 | 30 | ROUNDED CORNER PORTION | 78 | 66 | ○ |

TABLE 5

|  | No. | n | Pave | Have | θ | Hbun | Hbu | Hbun/Have | Hbu/Have | IQE | CRACK | WARPAGE | TOTAL |
|---|---|---|---|---|---|---|---|---|---|---|---|---|---|
| EXAMPLE 5 | 1 | 6 | 300 | 130 | 30 | 45000 | 26500 | 346.2 | 203.8 | 80 | ○ | X | Δ |
|  | 2 | 6 | 200 | 80 | 30 | 5800 | 3400 | 72.5 | 42.5 | 86 | ○ | ○ | ○ |
|  | 3 | 6 | 200 | 80 | 30 | 3400 | 2400 | 42.5 | 30.0 | 73 | ○ | ○ | ○ |
|  | 4 | 6 | 200 | 150 | 30 | 5800 | 3400 | 38.7 | 22.7 | 89 | ○ | ○ | ○ |
|  | 5 | 6 | 300 | 150 | 30 | 5800 | 3400 | 38.7 | 22.7 | 85 | ○ | ○ | ○ |
|  | 6 | 6 | 200 | 150 | 30 | 4400 | 2400 | 29.3 | 16.0 | 88 | ○ | ○ | ○ |
|  | 7 | 6 | 300 | 150 | 30 | 4400 | 2400 | 29.3 | 16.0 | 84 | ○ | ○ | ○ |
|  | 8 | 6 | 200 | 150 | 30 | 3400 | 2400 | 22.7 | 16.0 | 74 | ○ | ○ | ○ |
|  | 9 | 6 | 460 | 250 | 30 | 5800 | 3400 | 23.2 | 13.6 | 79 | ○ | ○ | ○ |
|  | 10 | 6 | 700 | 300 | 30 | 5800 | 3400 | 19.3 | 11.3 | 74 | ○ | ○ | ○ |
|  | 11 | 6 | 460 | 250 | 30 | 4400 | 2400 | 17.6 | 9.6 | 76 | ○ | ○ | ○ |
|  | 12 | 6 | 300 | 150 | 30 | 900 | 500 | 6.0 | 3.3 | 61 | ○ | ○ | Δ |
| COMPARATIVE EXAMPLE 5 | 0 | 6 | 0 | 0 | 30 | 4400 | 2400 | — | — | 52 | ○ | ○ | X |

TABLE 6

|  | UNEVEN STRUCTURE A | | | | UNEVEN STRUCTURE L | | | UNEVEN STRUCTURE A, L | | RESULT | | | |
|---|---|---|---|---|---|---|---|---|---|---|---|---|---|
|  | n | PA (nm) | θ (°) | TOP SHAPE OF THE CONVEX- | m | PL (nm) | STRUCTURE | AonL | AinL | PL/PA | IQE (%) | LIGHT EMISSION OUTPUT RATIO | CRACK | TOTAL |
| EXAMPLE 6 | 6 | 300 | 30 | ROUNDED CORNER PORTION TABLETOP | 6 | 3200 | dot | ○ | — | 10.7 | 79 | 1.21 | ◎ | ◎ |
|  |  |  |  |  |  |  | X | ○ | — |  | 76 | 1.19 | ◎ | ◎ |
|  |  |  |  |  |  |  | SiO₂ | — | ○ |  | 85 | 1.29 | ◎ | ◎ |
|  |  |  |  |  |  |  | dot | ○ | — |  | 71 | 1.14 | ○ | ○ |
|  |  |  |  |  |  |  | holl | ○ | — |  | 69 | 1.13 | ○ | Δ |
|  |  |  |  |  |  |  | SiO₂ | — | ○ |  | 75 | 1.19 | ○ | ○ |
| COMPARATIVE EXAMPLE 6 | — | — | — | — | 6 | 3200 | dot | — | — | — | 61 | 1 | Δ | X |

TABLE 7

|  | UNEVEN STRUCTURE A | | | | UNEVEN STRUCTURE L | |
|---|---|---|---|---|---|---|
|  | n | PA (nm) | θ (°) | TOP SHAPE OF THE CONVEX-PORTION | STRUCTURE | CRACK |
| COMPARATIVE EXAMPLE 7 | 6 | 300 | 0 | ROUNDED CORNER PORTION | HOLL OR SiO₂ | 1 |
| EXAMPLE 7 |  |  | 10 |  |  | 0.89 |
|  |  |  | 20 |  |  | 0.72 |
|  |  |  | 30 |  |  | 0.66 |

TABLE 8

| | | UNEVEN STRUCTURE A | | UNEVEN | | |
|---|---|---|---|---|---|---|
| | n | PA (nm) | Θ (°) | TOP SHAPE OF THE CONVEX- | STRUCTURE L STRUCTURE | PL/PA | IQE/% |
| EXAMPLE 8 | 6 | 200 | 30 | ROUNDED CORNER PORTION | HOLL | 16.0 | 81 |
| | | 300 | | | | 10.7 | 79 |
| | | 450 | | | | 7.1 | 73 |
| | | 700 | | | | 4.6 | 68 |
| | | 900 | | | | 3.6 | 64 |
| | | 1200 | | | | 2.7 | 53 |
| | | 1800 | | | | 1.8 | 45 |

TABLE 9

| | | UNEVEN STRUCTURE A | | | | UNEVEN | | | |
|---|---|---|---|---|---|---|---|---|---|
| | n | PA (nm) | DUTY | Θ (°) | TOP SHAPE OF THE CONVEX- | STRUCTURE L STRUCTURE | IQE (%) | LEE (%) | CRACK |
| EXAMPLE 9 | 6 | 300 | 0.17 | 30 | ROUNDED CORNER PORTION | HOLL | 79 | 52 | ○ |
| | | | 0.27 | | | | 81 | 55 | ○ |
| | | | 0.43 | | | | 78 | 58 | ○ |
| | | | 0.53 | | | | 79 | 63 | ○ |
| | | | 0.63 | | | | 80 | 65 | ○ |
| | | | 0.73 | | | | 78 | 67 | ○ |
| | | | 0.96 | | | | 64 | 66 | ○ |

The invention claimed is:

1. A pattern wafer for an LED, comprising:
an uneven structure A having an arrangement with n-fold rotational symmetry on at least a part of a main surface, wherein
in at least a part of the uneven structure A, a minimum rotational shift angle Θ satisfies $0°<Θ≤(180/n)°$, wherein Θ is the minimum rotational shift angle of an arrangement axis A of the uneven structure A relative to a crystal axis direction of the pattern wafer for an LED in the main surface, and
each top of convex-portions of the uneven structure A is formed as a curved surface having a radius of curvature exceeding "0".

2. The pattern wafer for an LED according to claim 1, wherein the pattern wafer is further provided with an uneven structure L, different from the uneven structure A, having an arrangement with m-fold rotational symmetry, wherein m is a integer of 2 or more.

3. The pattern wafer for an LED according to claim 2, wherein the uneven structure L is comprised of pluralities of convex portions and concave portions having a first average interval (PL), the uneven structure A is provided on surfaces of at least either the convex portions or the concave portions forming the uneven structure L, and is comprised of pluralities of convex portions and concave portions having a second average interval (PA), and a ratio (PL/PA) of the first average interval (PL) to the second average interval (PA) exceeds 1 and is 2000 or less.

4. The pattern wafer for an LED according to claim 3, wherein a plurality of the convex portions forming the uneven structure L is mutually spaced, and a plurality of the convex portions or the concave portions forming the uneven structure A is provided at least in bottom portions of a plurality of the concave portions forming the uneven structure L.

5. The pattern wafer for an LED according to claim 3, wherein a plurality of the concave portions forming the uneven structure L is mutually spaced, and a plurality of the convex portions or the concave portions forming the uneven structure A is provided at least on tops of a plurality of the convex portions forming the uneven structure L.

6. The pattern wafer for an LED according to claim 3, wherein a coverage of the uneven structure A to the uneven structure L exceeds 0% and is less than 100%.

7. The pattern wafer for an LED according to claim 2, wherein the uneven structure A is comprised of pluralities of convex portions and concave portions having a first average interval (PA), the uneven structure L is provided on a surface of the uneven structure A apart from each other so that a part of the uneven structure A is exposed, and is comprised of a plurality of convex portions having a second average interval (PL), and a ratio (PL/PA) between the first average interval (PA) and the second average interval (PL) exceeds 1 and is 2000 or less.

8. The pattern wafer for an LED according to claim 1, wherein an average interval Pave of the uneven structure A meets $50\ nm≤Pave≤1500\ nm$.

9. The pattern wafer for an LED according to claim 1, wherein in using a Duty (ΦDave/Pave) that is a ratio of an average diameter (Φave) of a bottom of the convex-portion of the uneven structure A to an average interval Pave, the minimum rotational shift angle Θ meets a range of a $\tan(Duty/2)°≤Θ≤(180/n)°$.

10. The pattern wafer for an LED according to claim 1, wherein the pattern wafer for an LED is a sapphire wafer, a silicon wafer, a silicon carbide wafer or a gallium nitride-based wafer.

11. An epitaxial wafer for an LED, wherein at least a first semiconductor layer, a light emitting semiconductor layer and a second semiconductor layer are layered in this order on the main surface provided with the uneven structure A of the pattern wafer for an LED according to claim 1.

12. The epitaxial wafer for an LED according to claim 11, wherein a ratio (Hbun/Have) of a distance (Hbun) between a surface on the light emitting semiconductor layer side of the pattern wafer for an LED and a surface on the first semiconductor layer side of the light emitting semiconductor layer to an average height (Have) of the uneven structure A meets $2 \leq H_{bun}/H_{ave} \leq 300$.

13. The epitaxial wafer for an LED according to claim 11, wherein the first semiconductor layer contains an undoped first semiconductor layer and a doped first semiconductor layer sequentially layered from the pattern wafer for an LED side, and a ratio (Hbu/Have) of a distance (Hbu) between a surface on the light emitting semiconductor layer side of the pattern wafer for an LED and a surface on the doped first semiconductor layer side of the undoped first semiconductor layer to an average height (Have) of the uneven structure A meets $1.5 \leq H_{bu}/H_{ave} \leq 200$.

* * * * *